US012695066B2

(12) United States Patent
Kimball et al.

(10) Patent No.: US 12,695,066 B2
(45) Date of Patent: Jul. 28, 2026

(54) MOVEABLE EDGE RINGS WITH REDUCED CAPACITANCE VARIATION FOR SUBSTRATE PROCESSING SYSTEMS

(71) Applicant: LAM RESEARCH CORPORATION, Fremont, CA (US)

(72) Inventors: Christopher Kimball, San Jose, CA (US); Hema Swaroop Mopidevi, Fremont, CA (US); Saravanapriyan Sriraman, Fremont, CA (US); Tom A. Kamp, San Jose, CA (US); Darrell Ehrlich, San Jose, CA (US); Anthony Contreras, Stockton, CA (US); Chiara Helena Catherina Giammanco Macpherson, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 231 days.

(21) Appl. No.: 17/632,066

(22) PCT Filed: Aug. 4, 2020

(86) PCT No.: PCT/US2020/044816
§ 371 (c)(1),
(2) Date: Feb. 1, 2022

(87) PCT Pub. No.: WO2021/026110
PCT Pub. Date: Feb. 11, 2021

(65) Prior Publication Data
US 2022/0254612 A1      Aug. 11, 2022

Related U.S. Application Data

(60) Provisional application No. 62/976,088, filed on Feb. 13, 2020, provisional application No. 62/882,890, filed on Aug. 5, 2019.

(51) Int. Cl.
*H01J 37/32* (2006.01)
*H10P 72/76* (2026.01)

(52) U.S. Cl.
CPC .... *H01J 37/32642* (2013.01); *H10P 72/7606* (2026.01); *H10P 72/7611* (2026.01);
(Continued)

(58) Field of Classification Search
CPC ... H01L 21/68; H01L 21/67; H01L 21/68735; H01L 21/68742; H01L 21/68785
(Continued)

(56) References Cited

U.S. PATENT DOCUMENTS 3,534,753 A    10/1970   Ollivier
4,262,686 A    4/1981    Heim et al.
(Continued)

FOREIGN PATENT DOCUMENTS

CN      1189859 A      8/1998
CN      1682344 A      10/2005
(Continued)

OTHER PUBLICATIONS

Korean Notice of Preliminary Examination Result for Korean Application No. 10-2023-7037853 dated Dec. 6, 2023.
(Continued)

*Primary Examiner* — Brian D Keller
*Assistant Examiner* — Aaron R Mcconnell

(57)      ABSTRACT

An edge ring for a plasma processing system includes a first annular body configured to surround a substrate support during plasma processing, an upper surface, a lower surface, a radially inner surface, a radially outer surface, and N spacers arranged in N spaced locations on the radially outer surface of the edge ring to reduce variations in a predetermined gap between the first annular body of the edge ring
(Continued)

and a structure separate from the edge ring as the edge ring is heated and cooled during plasma processing.

15 Claims, 35 Drawing Sheets

(52) U.S. Cl.
CPC ...... *H10P 72/7612* (2026.01); *H10P 72/7616* (2026.01); *H01J 2237/334* (2013.01)

(58) Field of Classification Search
USPC ..................................... 269/289 R, 900, 903
See application file for complete search history.

(56) References Cited

U.S. PATENT DOCUMENTS

| | | | |
|---|---|---|---|
| 4,374,698 A | 2/1983 | Sanders et al. | |
| 4,431,477 A | 2/1984 | Zajac | |
| 4,793,897 A | 12/1988 | Dunfield et al. | |
| 5,190,823 A | 3/1993 | Anthony et al. | |
| 5,220,515 A | 6/1993 | Freerks et al. | |
| 5,304,248 A | 4/1994 | Cheng et al. | |
| 5,329,965 A | 7/1994 | Gordon | |
| 5,346,578 A | 9/1994 | Benzing et al. | |
| 5,376,214 A | 12/1994 | Iwasaki et al. | |
| 5,413,145 A | 5/1995 | Rhyne et al. | |
| 5,520,969 A | 5/1996 | Nishizato et al. | |
| 5,529,657 A | 6/1996 | Ishii | |
| 5,569,350 A | 10/1996 | Osada et al. | |
| 5,605,179 A | 2/1997 | Strong, Jr. et al. | |
| 5,660,673 A | 8/1997 | Miyoshi | |
| 5,662,143 A | 9/1997 | Caughran | |
| 5,683,517 A | 11/1997 | Shan | |
| 5,702,530 A | 12/1997 | Shan et al. | |
| 5,744,695 A | 4/1998 | Forbes | |
| 5,762,714 A | 6/1998 | Mohn et al. | |
| 5,792,272 A | 8/1998 | van Os et al. | |
| 5,837,058 A | 11/1998 | Chen et al. | |
| 5,840,129 A | 11/1998 | Saenz et al. | |
| 5,851,299 A | 12/1998 | Cheng et al. | |
| 5,886,863 A | 3/1999 | Nagasaki et al. | |
| 5,907,221 A | 5/1999 | Sato et al. | |
| 5,942,039 A | 8/1999 | Kholodenko et al. | |
| 5,952,060 A | 9/1999 | Ravi | |
| 6,022,809 A | 2/2000 | Fan | |
| 6,042,687 A | 3/2000 | Singh et al. | |
| 6,044,534 A | 4/2000 | Seo et al. | |
| 6,048,403 A | 4/2000 | Deaton et al. | |
| 6,050,283 A | 4/2000 | Hoffman et al. | |
| 6,060,400 A | 5/2000 | Oehrlein et al. | |
| 6,062,256 A | 5/2000 | Miller et al. | |
| 6,074,959 A | 6/2000 | Wang et al. | |
| 6,152,168 A | 11/2000 | Ohmi et al. | |
| 6,206,976 B1 | 3/2001 | Crevasse et al. | |
| 6,210,593 B1 | 4/2001 | Ohkuni et al. | |
| 6,217,937 B1 | 4/2001 | Shealy | |
| 6,231,716 B1 | 5/2001 | White et al. | |
| 6,264,467 B1 | 7/2001 | Lue et al. | |
| 6,294,466 B1 | 9/2001 | Chang | |
| 6,328,808 B1 | 12/2001 | Tsai et al. | |
| 6,376,386 B1 | 4/2002 | Oshima | |
| 6,492,774 B1 | 12/2002 | Han et al. | |
| 6,508,911 B1 | 1/2003 | Han et al. | |
| 6,511,543 B1 | 1/2003 | Stauss et al. | |
| 6,589,352 B1 | 7/2003 | Yudovsky et al. | |
| 6,605,352 B1 | 8/2003 | Windischmann | |
| 6,623,597 B1 | 9/2003 | Han et al. | |
| 6,709,547 B1 | 3/2004 | Ni et al. | |
| 6,722,642 B1 | 4/2004 | Sutton et al. | |
| 6,736,931 B2 | 5/2004 | Collins et al. | |
| 6,744,212 B2 | 6/2004 | Fischer et al. | |
| 6,818,560 B1 | 11/2004 | Koshimizu et al. | |
| 6,841,943 B2 | 1/2005 | Vahedi et al. | |
| 6,896,765 B2 | 5/2005 | Steger | |
| 6,898,558 B2 | 5/2005 | Klekotka | |
| 6,962,879 B2 | 11/2005 | Zhu et al. | |
| 7,129,171 B2 | 10/2006 | Zhu et al. | |
| 7,288,482 B2 | 10/2007 | Panda et al. | |
| 7,309,646 B1 | 12/2007 | Heo et al. | |
| 7,311,784 B2 | 12/2007 | Fink | |
| 7,338,907 B2 | 3/2008 | Li et al. | |
| 7,378,128 B2 | 5/2008 | Rancoule | |
| 7,431,788 B2 | 10/2008 | Ricci et al. | |
| 7,481,944 B2 | 1/2009 | Nozawa et al. | |
| 7,736,998 B2 | 6/2010 | Morita et al. | |
| 7,757,541 B1 | 7/2010 | Monkowski et al. | |
| 7,758,698 B2 | 7/2010 | Bang et al. | |
| 7,882,800 B2 | 2/2011 | Koshiishi et al. | |
| 7,968,469 B2 | 6/2011 | Collins et al. | |
| 7,988,813 B2 | 8/2011 | Chen et al. | |
| 8,137,463 B2 | 3/2012 | Liu et al. | |
| 8,177,910 B2 | 5/2012 | Schmid et al. | |
| 8,291,935 B1 | 10/2012 | Merritt et al. | |
| 8,485,128 B2 | 7/2013 | Kellogg et al. | |
| 8,552,334 B2 | 10/2013 | Tappan et al. | |
| 8,555,920 B2 | 10/2013 | Hirata et al. | |
| 8,592,328 B2 | 11/2013 | Hausmann et al. | |
| 8,826,855 B2 | 9/2014 | Kellogg et al. | |
| 8,889,024 B2 | 11/2014 | Watanabe et al. | |
| 8,956,980 B1 | 2/2015 | Chen et al. | |
| 8,999,106 B2 | 4/2015 | Liu et al. | |
| 9,011,637 B2 | 4/2015 | Yamamoto | |
| 9,051,647 B2 | 6/2015 | Cooperberg et al. | |
| 9,059,678 B2 | 6/2015 | Long et al. | |
| 9,142,391 B2 | 9/2015 | Yamamoto | |
| 9,318,343 B2 | 4/2016 | Ranjan et al. | |
| 9,412,555 B2 | 8/2016 | Augustino et al. | |
| 9,471,065 B2 | 10/2016 | Koyomogi et al. | |
| 9,640,409 B1 | 5/2017 | Yang et al. | |
| 9,698,042 B1 | 7/2017 | Baldasseroni et al. | |
| 9,779,916 B2 | 10/2017 | Dhindsa et al. | |
| 10,096,471 B2 | 10/2018 | Canniff | |
| 10,147,588 B2 | 12/2018 | Eason et al. | |
| 10,410,832 B2 | 9/2019 | Zhang et al. | |
| 10,490,392 B2 | 11/2019 | Ishizawa | |
| 10,504,738 B2 | 12/2019 | Lin et al. | |
| 10,510,516 B2 | 12/2019 | Lin et al. | |
| 10,591,934 B2 | 3/2020 | Gopalakrishnan et al. | |
| 10,651,015 B2 | 5/2020 | Angelov et al. | |
| 10,658,222 B2 | 5/2020 | Yan et al. | |
| 10,699,878 B2 | 6/2020 | Caron et al. | |
| 10,825,659 B2 | 11/2020 | Treadwell et al. | |
| 10,957,561 B2 | 3/2021 | Drewery et al. | |
| 11,798,789 B2 | 10/2023 | Sanchez et al. | |
| 2001/0002581 A1 | 6/2001 | Nishikawa et al. | |
| 2001/0004903 A1 | 6/2001 | Ohmi et al. | |
| 2001/0013363 A1 | 8/2001 | Kitayama et al. | |
| 2001/0035530 A1 | 11/2001 | Udagawa | |
| 2002/0038669 A1 | 4/2002 | Yamagishi et al. | |
| 2002/0042205 A1 | 4/2002 | McMillin et al. | |
| 2002/0043337 A1 | 4/2002 | Goodman et al. | |
| 2002/0045265 A1 | 4/2002 | Bergh et al. | |
| 2002/0046991 A1 | 4/2002 | Smith et al. | |
| 2002/0048536 A1 | 4/2002 | Bergh et al. | |
| 2002/0053513 A1 | 5/2002 | Stimson et al. | |
| 2002/0067585 A1 | 6/2002 | Fujiwara | |
| 2002/0071128 A1 | 6/2002 | Doan | |
| 2002/0072240 A1 | 6/2002 | Koike | |
| 2002/0088542 A1 | 7/2002 | Nishikawa et al. | |
| 2002/0092602 A1 | 7/2002 | Saito et al. | |
| 2002/0160125 A1 | 10/2002 | Johnson et al. | |
| 2002/0174905 A1 | 11/2002 | Latino et al. | |
| 2002/0175144 A1 | 11/2002 | Hung et al. | |
| 2003/0000369 A1 | 1/2003 | Funaki | |
| 2003/0003696 A1 | 1/2003 | Gelatos et al. | |
| 2003/0011619 A1 | 1/2003 | Jacobs et al. | |
| 2003/0013080 A1 | 1/2003 | Luebke et al. | |
| 2003/0015141 A1 | 1/2003 | Takagi | |
| 2003/0021356 A1 | 1/2003 | Okuda et al. | |
| 2003/0023023 A1 | 1/2003 | Harris et al. | |
| 2003/0116195 A1 | 6/2003 | Weissgerber et al. | |
| 2003/0130807 A1 | 7/2003 | Ambrosina et al. | |
| 2003/0186563 A1 | 10/2003 | Kobayashi et al. | |

(56) References Cited

U.S. PATENT DOCUMENTS

| | | |
|---|---|---|
| 2003/0196890 A1 | 10/2003 | Le et al. |
| 2003/0201069 A1 | 10/2003 | Johnson |
| 2003/0213560 A1 | 11/2003 | Wang et al. |
| 2003/0230239 A1 | 12/2003 | Shan |
| 2003/0231950 A1 | 12/2003 | Raaijmakers |
| 2003/0236592 A1 | 12/2003 | Shajii et al. |
| 2003/0236638 A1 | 12/2003 | Shajii et al. |
| 2003/0236643 A1 | 12/2003 | Shajii et al. |
| 2004/0003780 A1 | 1/2004 | Yudovsky et al. |
| 2004/0007176 A1 | 1/2004 | Janakiraman et al. |
| 2004/0025060 A1 | 2/2004 | Raffaele et al. |
| 2004/0026149 A1 | 2/2004 | Wilkinson |
| 2004/0031338 A1 | 2/2004 | Chen et al. |
| 2004/0053428 A1 | 3/2004 | Steger |
| 2004/0060595 A1 | 4/2004 | Chittenden |
| 2004/0089240 A1 | 5/2004 | Dando et al. |
| 2004/0094206 A1 | 5/2004 | Ishida |
| 2004/0112538 A1 | 6/2004 | Larson et al. |
| 2004/0112539 A1 | 6/2004 | Larson et al. |
| 2004/0112540 A1 | 6/2004 | Larson et al. |
| 2004/0149389 A1 | 8/2004 | Fink |
| 2004/0163601 A1 | 8/2004 | Kadotani et al. |
| 2004/0168719 A1 | 9/2004 | Nambu |
| 2004/0173270 A1 | 9/2004 | Harris et al. |
| 2004/0173319 A1 | 9/2004 | Suzuki et al. |
| 2004/0200529 A1 | 10/2004 | Lull et al. |
| 2004/0241995 A1 | 12/2004 | Yamanaka |
| 2004/0250600 A1 | 12/2004 | Bevers et al. |
| 2004/0261492 A1 | 12/2004 | Zarkar et al. |
| 2005/0005994 A1 | 1/2005 | Sugiyama et al. |
| 2005/0041238 A1 | 2/2005 | Ludviksson et al. |
| 2005/0061447 A1 | 3/2005 | Kim et al. |
| 2005/0067021 A1 | 3/2005 | Bevers et al. |
| 2005/0082007 A1 | 4/2005 | Nguyen et al. |
| 2005/0133164 A1 | 6/2005 | Fischer et al. |
| 2005/0155625 A1 | 7/2005 | Jangjian et al. |
| 2005/0194100 A1 | 9/2005 | Or et al. |
| 2005/0199342 A1 | 9/2005 | Shajii et al. |
| 2005/0241763 A1 | 11/2005 | Huang et al. |
| 2006/0011237 A1 | 1/2006 | Tison et al. |
| 2006/0021223 A1 | 2/2006 | Wakayama et al. |
| 2006/0043067 A1 | 3/2006 | Kadkhodayan et al. |
| 2006/0060141 A1 | 3/2006 | Kamaishi et al. |
| 2006/0090797 A1 | 5/2006 | Olander |
| 2006/0097644 A1 | 5/2006 | Kono et al. |
| 2006/0124169 A1 | 6/2006 | Mizusawa et al. |
| 2006/0207595 A1 | 9/2006 | Ohmi et al. |
| 2006/0212233 A1 | 9/2006 | Wong et al. |
| 2006/0237063 A1 | 10/2006 | Ding et al. |
| 2006/0283551 A1 | 12/2006 | Son |
| 2007/0023398 A1 | 2/2007 | Kobayashi et al. |
| 2007/0024077 A1 | 2/2007 | McClintock |
| 2007/0026684 A1 | 2/2007 | Parascandola et al. |
| 2007/0066038 A1 | 3/2007 | Sadjadi et al. |
| 2007/0131350 A1 | 6/2007 | Ricci et al. |
| 2007/0158025 A1 | 7/2007 | Larson |
| 2007/0175391 A1 | 8/2007 | Mizusawa |
| 2007/0187363 A1 | 8/2007 | Oka et al. |
| 2007/0204797 A1 | 9/2007 | Fischer |
| 2007/0204914 A1 | 9/2007 | Kurosawa et al. |
| 2007/0208427 A1 | 9/2007 | Davidson et al. |
| 2007/0233412 A1 | 10/2007 | Gotoh et al. |
| 2007/0240778 A1 | 10/2007 | L'Bassi et al. |
| 2007/0256785 A1 | 11/2007 | Pamarthy et al. |
| 2007/0256786 A1 | 11/2007 | Zhou et al. |
| 2007/0259112 A1 | 11/2007 | Ishikawa et al. |
| 2007/0283882 A1 | 12/2007 | Cho et al. |
| 2007/0284344 A1 | 12/2007 | Todorov et al. |
| 2008/0014347 A1 | 1/2008 | Power |
| 2008/0072823 A1 | 3/2008 | Yudovsky et al. |
| 2008/0101978 A1 | 5/2008 | Ryabova et al. |
| 2008/0115834 A1 | 5/2008 | Geoffrion et al. |
| 2008/0121177 A1 | 5/2008 | Bang et al. |
| 2008/0121178 A1 | 5/2008 | Bang et al. |
| 2008/0174387 A1 | 7/2008 | Chiang |
| 2008/0202588 A1 | 8/2008 | Gold et al. |
| 2008/0202609 A1 | 8/2008 | Gold et al. |
| 2008/0202610 A1 | 8/2008 | Gold et al. |
| 2008/0223873 A1 | 9/2008 | Chen et al. |
| 2008/0236749 A1 | 10/2008 | Koshimizu et al. |
| 2008/0314508 A1 | 12/2008 | Ricci et al. |
| 2008/0317564 A1 | 12/2008 | Cheng et al. |
| 2009/0015141 A1 | 1/2009 | Wang et al. |
| 2009/0056629 A1 | 3/2009 | Katz et al. |
| 2009/0061083 A1 | 3/2009 | Chiang et al. |
| 2009/0061640 A1 | 3/2009 | Wong et al. |
| 2009/0061644 A1 | 3/2009 | Chiang et al. |
| 2009/0067954 A1 | 3/2009 | Lanee et al. |
| 2009/0071938 A1 | 3/2009 | Dhindsa et al. |
| 2009/0078196 A1 | 3/2009 | Midorikawa |
| 2009/0090174 A1 | 4/2009 | Paul et al. |
| 2009/0095364 A1 | 4/2009 | Itoh et al. |
| 2009/0151419 A1 | 6/2009 | Doniat et al. |
| 2009/0162952 A1 | 6/2009 | Liu et al. |
| 2009/0163037 A1 | 6/2009 | Miya et al. |
| 2009/0183548 A1 | 7/2009 | Monkowski et al. |
| 2009/0183549 A1 | 7/2009 | Monkowski et al. |
| 2009/0197423 A1 | 8/2009 | Koshimizu et al. |
| 2009/0209112 A1 | 8/2009 | Koelmel et al. |
| 2009/0221117 A1 | 9/2009 | Tan et al. |
| 2009/0236313 A1 | 9/2009 | Qiu et al. |
| 2009/0260982 A1 | 10/2009 | Riker et al. |
| 2009/0272717 A1 | 11/2009 | Pamarthy et al. |
| 2009/0279989 A1 | 11/2009 | Wong et al. |
| 2009/0320754 A1 | 12/2009 | Oya et al. |
| 2010/0012310 A1 | 1/2010 | Christensen et al. |
| 2010/0025369 A1 | 2/2010 | Negishi et al. |
| 2010/0030390 A1 | 2/2010 | Yamaguchi et al. |
| 2010/0059181 A1 | 3/2010 | Lee et al. |
| 2010/0071438 A1 | 3/2010 | Davis et al. |
| 2010/0108261 A1 | 5/2010 | Augustino et al. |
| 2010/0122655 A1 | 5/2010 | Tiner et al. |
| 2010/0144539 A1 | 6/2010 | Bergh et al. |
| 2010/0145633 A1 | 6/2010 | Yasuda |
| 2010/0178770 A1 | 7/2010 | Zin |
| 2010/0197070 A1 | 8/2010 | Stoddard et al. |
| 2010/0216313 A1 | 8/2010 | Iwai |
| 2010/0229976 A1 | 9/2010 | Hirata et al. |
| 2010/0264117 A1 | 10/2010 | Ohmi et al. |
| 2010/0269924 A1 | 10/2010 | Yasuda |
| 2010/0272347 A1 | 10/2010 | Rodnick et al. |
| 2010/0273334 A1 | 10/2010 | Koelmel et al. |
| 2011/0019332 A1 | 1/2011 | Chistyakov |
| 2011/0025322 A1 | 2/2011 | Yamazaki et al. |
| 2011/0026588 A1 | 2/2011 | Boyce |
| 2011/0026595 A1 | 2/2011 | Yasuda et al. |
| 2011/0031111 A1 | 2/2011 | Kobayashi |
| 2011/0094596 A1 | 4/2011 | Sugiyama et al. |
| 2011/0108524 A1 | 5/2011 | Dhindsa et al. |
| 2011/0126984 A1 | 6/2011 | Kang et al. |
| 2011/0135821 A1 | 6/2011 | Ding |
| 2011/0157760 A1 | 6/2011 | Willwerth et al. |
| 2011/0229837 A1 | 9/2011 | Migita |
| 2011/0253225 A1 | 10/2011 | Beeby et al. |
| 2011/0259262 A1 | 10/2011 | Khattak et al. |
| 2011/0265883 A1 | 11/2011 | Cruse et al. |
| 2011/0265951 A1 | 11/2011 | Xu et al. |
| 2011/0287631 A1 | 11/2011 | Yamamoto |
| 2011/0303696 A1 | 12/2011 | Kelekar et al. |
| 2012/0031500 A1 | 2/2012 | Hirose et al. |
| 2012/0032756 A1 | 2/2012 | Long et al. |
| 2012/0034786 A1 | 2/2012 | Dhindsa et al. |
| 2012/0080092 A1 | 4/2012 | Singh et al. |
| 2012/0091108 A1 | 4/2012 | Lin et al. |
| 2012/0097266 A1 | 4/2012 | Cobb et al. |
| 2012/0149213 A1 | 6/2012 | Nittala et al. |
| 2012/0152364 A1 | 6/2012 | Hashimoto et al. |
| 2012/0156363 A1 | 6/2012 | Quinn et al. |
| 2012/0174990 A1 | 7/2012 | Yasuda |
| 2012/0175062 A1 | 7/2012 | de la Llera et al. |
| 2012/0176692 A1 | 7/2012 | Yamawaku et al. |
| 2012/0190208 A1 | 7/2012 | Ozu et al. |
| 2012/0238102 A1 | 9/2012 | Zhang et al. |
| 2012/0238103 A1 | 9/2012 | Zhang et al. |

(56) References Cited

U.S. PATENT DOCUMENTS

| 2012/0244715 A1 | 9/2012 | Lebouitz et al. |
| 2012/0247386 A1 | 10/2012 | Sanchez et al. |
| 2012/0280429 A1 | 11/2012 | Ravi et al. |
| 2012/0282162 A1 | 11/2012 | Skelton et al. |
| 2012/0289057 A1 | 11/2012 | DeDontney |
| 2012/0298221 A1 | 11/2012 | Takeuchi et al. |
| 2012/0305184 A1 | 12/2012 | Singh et al. |
| 2012/0312800 A1 | 12/2012 | Chartier et al. |
| 2012/0328780 A1 | 12/2012 | Yamagishi |
| 2013/0000731 A1 | 1/2013 | Singh et al. |
| 2013/0008607 A1 | 1/2013 | Matsumoto et al. |
| 2013/0025715 A1 | 1/2013 | Yamaguchi et al. |
| 2013/0029494 A1 | 1/2013 | Sasaki et al. |
| 2013/0029496 A1 | 1/2013 | Bauer et al. |
| 2013/0045605 A1 | 2/2013 | Wang et al. |
| 2013/0085618 A1 | 4/2013 | Ding |
| 2013/0104996 A1 | 5/2013 | Oh et al. |
| 2013/0106286 A1 | 5/2013 | Banna et al. |
| 2013/0131300 A1 | 5/2013 | Olmscheid et al. |
| 2013/0135058 A1 | 5/2013 | Long et al. |
| 2013/0145816 A1 | 6/2013 | Lowe |
| 2013/0155568 A1 | 6/2013 | Todorow et al. |
| 2013/0157388 A1 | 6/2013 | Grimbergen |
| 2013/0220433 A1 | 8/2013 | Sawada et al. |
| 2013/0255784 A1 | 10/2013 | Ye et al. |
| 2013/0256962 A1 | 10/2013 | Ranish et al. |
| 2013/0270997 A1 | 10/2013 | Zhao et al. |
| 2013/0284374 A1 | 10/2013 | Lubomirsky et al. |
| 2013/0288477 A1 | 10/2013 | Rieschl et al. |
| 2013/0313785 A1 | 11/2013 | Otschik et al. |
| 2013/0334038 A1 | 12/2013 | Riker et al. |
| 2014/0017900 A1 | 1/2014 | Doba et al. |
| 2014/0020764 A1 | 1/2014 | Woelk et al. |
| 2014/0033828 A1 | 2/2014 | Larson et al. |
| 2014/0034243 A1 | 2/2014 | Dhindsa et al. |
| 2014/0080308 A1 | 3/2014 | Chen et al. |
| 2014/0094039 A1 | 4/2014 | Ranish et al. |
| 2014/0110057 A1 | 4/2014 | Lee et al. |
| 2014/0120737 A1 | 5/2014 | Swaminathan et al. |
| 2014/0141621 A1 | 5/2014 | Ren et al. |
| 2014/0144471 A1 | 5/2014 | Kahlon et al. |
| 2014/0182689 A1 | 7/2014 | Shareef et al. |
| 2014/0190822 A1 | 7/2014 | Riker et al. |
| 2014/0213055 A1 | 7/2014 | Himori et al. |
| 2014/0235063 A1 | 8/2014 | McMillin et al. |
| 2014/0248780 A1 | 9/2014 | Ingle et al. |
| 2014/0262038 A1 | 9/2014 | Wang et al. |
| 2014/0262763 A1 | 9/2014 | Rasheed et al. |
| 2014/0263177 A1 | 9/2014 | Povolny et al. |
| 2014/0272459 A1 | 9/2014 | Daugherty et al. |
| 2014/0273460 A1 | 9/2014 | Reyland et al. |
| 2014/0273505 A1 | 9/2014 | Hsieh et al. |
| 2014/0311676 A1 | 10/2014 | Hatoh et al. |
| 2015/0009906 A1 | 1/2015 | Dore et al. |
| 2015/0010381 A1 | 1/2015 | Cai |
| 2015/0017810 A1 | 1/2015 | Guha |
| 2015/0037183 A1 | 2/2015 | Rood et al. |
| 2015/0044873 A1 | 2/2015 | Kellogg |
| 2015/0059859 A1 | 3/2015 | Takahashi et al. |
| 2015/0099066 A1 | 4/2015 | Huotari et al. |
| 2015/0099365 A1 | 4/2015 | Chen et al. |
| 2015/0107773 A1 | 4/2015 | Shintaku et al. |
| 2015/0179412 A1 | 6/2015 | Chhatre et al. |
| 2015/0181684 A1 | 6/2015 | Banna et al. |
| 2015/0184287 A1 | 7/2015 | Tsung et al. |
| 2015/0187631 A1* | 7/2015 | Ranish ............. H01L 21/68735 269/305 |
| 2015/0234390 A1 | 8/2015 | Koyomogi et al. |
| 2015/0262793 A1 | 9/2015 | Okunishi et al. |
| 2015/0287572 A1 | 10/2015 | Daugherty et al. |
| 2015/0336275 A1 | 11/2015 | Mazzocco et al. |
| 2015/0340209 A1 | 11/2015 | Koltonski |
| 2015/0371831 A1 | 12/2015 | Rozenzon et al. |
| 2015/0373783 A1 | 12/2015 | Kitagawa |
| 2016/0035610 A1 | 2/2016 | Park et al. |
| 2016/0039126 A1 | 2/2016 | Tan et al. |
| 2016/0046451 A1 | 2/2016 | German |
| 2016/0099162 A1 | 4/2016 | Ng et al. |
| 2016/0111258 A1 | 4/2016 | Taskar et al. |
| 2016/0172165 A1 | 6/2016 | Jeon et al. |
| 2016/0181116 A1 | 6/2016 | Berry, III et al. |
| 2016/0204019 A1 | 7/2016 | Ishii et al. |
| 2016/0211165 A1 | 7/2016 | McChesney et al. |
| 2016/0211166 A1 | 7/2016 | Yan et al. |
| 2016/0215392 A1 | 7/2016 | Yudovsky et al. |
| 2016/0247688 A1 | 8/2016 | Zhu et al. |
| 2016/0293431 A1 | 10/2016 | Sriraman et al. |
| 2016/0307742 A1 | 10/2016 | Mishra et al. |
| 2016/0372321 A1 | 12/2016 | Krishnan et al. |
| 2017/0011892 A1 | 1/2017 | Guo et al. |
| 2017/0018407 A1 | 1/2017 | Kondo |
| 2017/0032982 A1 | 2/2017 | Drewery et al. |
| 2017/0040148 A1 | 2/2017 | Augustino et al. |
| 2017/0043527 A1 | 2/2017 | Uttaro |
| 2017/0062769 A1 | 3/2017 | Kim et al. |
| 2017/0069464 A1 | 3/2017 | Ye et al. |
| 2017/0069511 A1 | 3/2017 | Yang et al. |
| 2017/0110335 A1 | 4/2017 | Yang et al. |
| 2017/0111025 A1 | 4/2017 | Kapoor et al. |
| 2017/0113355 A1 | 4/2017 | Genetti et al. |
| 2017/0115657 A1 | 4/2017 | Trussell et al. |
| 2017/0125274 A1 | 5/2017 | Swaminathan et al. |
| 2017/0133283 A1 | 5/2017 | Kenworthy |
| 2017/0200586 A1 | 7/2017 | Treadwell et al. |
| 2017/0213751 A1 | 7/2017 | Oohashi |
| 2017/0213758 A1 | 7/2017 | Rice et al. |
| 2017/0236688 A1 | 8/2017 | Caron et al. |
| 2017/0236694 A1 | 8/2017 | Eason et al. |
| 2017/0236741 A1 | 8/2017 | Angelov et al. |
| 2017/0236743 A1 | 8/2017 | Severson et al. |
| 2017/0256393 A1 | 9/2017 | Kim et al. |
| 2017/0256435 A1 | 9/2017 | Joubert et al. |
| 2017/0263478 A1 | 9/2017 | McChesney et al. |
| 2017/0278679 A1 | 9/2017 | Angelov et al. |
| 2017/0287682 A1 | 10/2017 | Musselman et al. |
| 2017/0287753 A1 | 10/2017 | Musselman et al. |
| 2017/0326733 A1 | 11/2017 | Ramachandran et al. |
| 2018/0019107 A1 | 1/2018 | Ishizawa |
| 2018/0052104 A1 | 2/2018 | Larsson et al. |
| 2018/0053629 A1 | 2/2018 | Zhang et al. |
| 2018/0114716 A1 | 4/2018 | Hao et al. |
| 2018/0138069 A1 | 5/2018 | Tan et al. |
| 2018/0155838 A1* | 6/2018 | Rasheed ........... H01L 21/68785 |
| 2018/0166259 A1 | 6/2018 | Ueda |
| 2018/0190526 A1 | 7/2018 | Hao et al. |
| 2018/0218933 A1 | 8/2018 | Luere et al. |
| 2018/0277416 A1 | 9/2018 | Takahashi et al. |
| 2018/0358211 A1 | 12/2018 | Mun |
| 2019/0013232 A1 | 1/2019 | Yan et al. |
| 2019/0027988 A1 | 1/2019 | Filipenko et al. |
| 2019/0103722 A1 | 4/2019 | Kieu |
| 2019/0228952 A1 | 7/2019 | Dorf et al. |
| 2019/0279888 A1 | 9/2019 | Gopalakrishnan et al. |
| 2019/0363003 A1 | 11/2019 | Sarode Vishwanath |
| 2020/0004954 A1 | 1/2020 | Zawadowskiy et al. |
| 2020/0020565 A1 | 1/2020 | Rathnasinghe et al. |
| 2020/0049547 A1 | 2/2020 | Spyropoulos et al. |
| 2020/0053513 A1 | 2/2020 | Harris et al. |
| 2020/0234928 A1* | 7/2020 | Vishwanath ...... H01L 21/68742 |
| 2020/0234961 A1 | 7/2020 | Tamura et al. |
| 2020/0234981 A1 | 7/2020 | Schmid et al. |
| 2020/0303224 A1 | 9/2020 | Yoshimori |
| 2020/0312633 A1 | 10/2020 | Rathnasinghe et al. |
| 2020/0328105 A1 | 10/2020 | Sun et al. |
| 2020/0395195 A1 | 12/2020 | Sanchez et al. |
| 2021/0035783 A1 | 2/2021 | Taira et al. |
| 2021/0057256 A1 | 2/2021 | Bergantz et al. |
| 2021/0066052 A1 | 3/2021 | Emura |
| 2021/0111007 A1 | 4/2021 | Kim et al. |
| 2021/0291374 A1 | 9/2021 | Bergantz et al. |
| 2021/0327688 A1 | 10/2021 | Sasaki et al. |
| 2021/0384013 A1 | 12/2021 | Jung et al. |
| 2022/0122878 A1 | 4/2022 | Wu et al. |
| 2022/0246408 A1 | 8/2022 | Genetti et al. |

(56) References Cited

U.S. PATENT DOCUMENTS

| | | |
|---|---|---|
| 2022/0254612 A1 | 8/2022 | Kimball et al. |
| 2022/0270863 A1 | 8/2022 | Kimball et al. |
| 2022/0319904 A1 | 10/2022 | Rice et al. |
| 2022/0359169 A1 | 11/2022 | Koai et al. |

FOREIGN PATENT DOCUMENTS

| | | |
|---|---|---|
| CN | 1701421 A | 11/2005 |
| CN | 101238553 A | 8/2008 |
| CN | 101552182 A | 10/2009 |
| CN | 102187741 A | 9/2011 |
| CN | 102243977 A | 11/2011 |
| CN | 202076225 U | 12/2011 |
| CN | 102315150 A | 1/2012 |
| CN | 102610476 A | 7/2012 |
| CN | 102714146 A | 10/2012 |
| CN | 203174197 U | 9/2013 |
| CN | 103730318 A | 4/2014 |
| CN | 103996593 | 8/2014 |
| CN | 104012185 A | 8/2014 |
| CN | 203895409 U | 10/2014 |
| CN | 104205320 A | 12/2014 |
| CN | 104205321 A | 12/2014 |
| CN | 104299929 A | 1/2015 |
| CN | 104752141 A | 7/2015 |
| CN | 104851832 A | 8/2015 |
| CN | 104862660 A | 8/2015 |
| CN | 105336561 A | 2/2016 |
| CN | 105810609 A | 7/2016 |
| CN | 105814243 A | 7/2016 |
| CN | 106057616 A | 10/2016 |
| CN | 106469637 A | 3/2017 |
| CN | 107086168 A | 8/2017 |
| CN | 107093569 A | 8/2017 |
| CN | 107112265 A | 8/2017 |
| CN | 107768275 A | 3/2018 |
| CN | 108369922 A | 8/2018 |
| CN | 112563108 A | 3/2021 |
| CN | 212874484 U | 4/2021 |
| EP | 0424299 A2 | 4/1991 |
| EP | 0821403 A2 | 1/1998 |
| EP | 0821404 A2 | 1/1998 |
| EP | 0838842 A2 | 4/1998 |
| EP | 875919 A2 | 11/1998 |
| EP | 0875979 A1 | 11/1998 |
| EP | EU-0875919 A2 | 11/1998 |
| EP | 1202328 A2 | 5/2002 |
| JP | H02-093063 A | 4/1990 |
| JP | H07106316 A | 4/1995 |
| JP | H07221024 A | 8/1995 |
| JP | H08100260 A | 4/1996 |
| JP | 10-070088 | 3/1998 |
| JP | H10-280173 A | 10/1998 |
| JP | 200049207 A | 2/2000 |
| JP | 2000036488 A | 2/2000 |
| JP | 20000124141 A | 4/2000 |
| JP | 3076791 B2 | 8/2000 |
| JP | 2000299315 A | 10/2000 |
| JP | 2001230239 A | 8/2001 |
| JP | 2001522142 A | 11/2001 |
| JP | 2002500439 A | 1/2002 |
| JP | 2002503765 A | 2/2002 |
| JP | 2002164423 A | 6/2002 |
| JP | 2002176030 A | 6/2002 |
| JP | 2002-217171 A | 8/2002 |
| JP | 2002-231794 A | 8/2002 |
| JP | 2003-513434 A | 4/2003 |
| JP | 2004-266127 A | 9/2004 |
| JP | 2004296553 A | 10/2004 |
| JP | 2005033062 A | 2/2005 |
| JP | 2005539397 A | 12/2005 |
| JP | 2006173223 A | 6/2006 |
| JP | 2006186171 A | 7/2006 |
| JP | 2006-344701 A | 12/2006 |
| JP | 2007207808 A | 8/2007 |
| JP | 2007-234867 A | 9/2007 |
| JP | 2007321244 A | 12/2007 |
| JP | 2007535819 A | 12/2007 |
| JP | 2008027936 A | 2/2008 |
| JP | 2008159931 A | 7/2008 |
| JP | 2008-251681 A | 10/2008 |
| JP | 2008244274 A | 10/2008 |
| JP | 2009224385 A | 10/2009 |
| JP | 2010034416 A | 2/2010 |
| JP | 2010267894 A | 11/2010 |
| JP | 2011-54933 A | 3/2011 |
| JP | 2011151263 A | 8/2011 |
| JP | 2011210853 A | 10/2011 |
| JP | 2012-049376 A | 3/2012 |
| JP | 201264671 A | 3/2012 |
| JP | 2012507860 A | 3/2012 |
| JP | 2012-146743 A | 8/2012 |
| JP | 2012146742 A | 8/2012 |
| JP | 2012216614 A | 11/2012 |
| JP | 2012222235 A | 11/2012 |
| JP | 201342012 A | 2/2013 |
| JP | 2013511847 A | 4/2013 |
| JP | 2013526063 A | 6/2013 |
| JP | 2013530516 A | 7/2013 |
| JP | 2013172013 A | 9/2013 |
| JP | 2014-084523 A | 5/2014 |
| JP | 201490177 A | 5/2014 |
| JP | 2014232884 A | 12/2014 |
| JP | 20155755 A | 1/2015 |
| JP | 2015050156 A | 3/2015 |
| JP | 2015109249 A | 6/2015 |
| JP | 2015109479 A | 6/2015 |
| JP | 5767373 B2 | 8/2015 |
| JP | 2015201552 A | 11/2015 |
| JP | 2016046451 A | 4/2016 |
| JP | 2016146472 A | 8/2016 |
| JP | 2016-219820 A | 12/2016 |
| JP | 3210105 U | 4/2017 |
| JP | 2017085072 A | 5/2017 |
| JP | 2017092435 A | 5/2017 |
| JP | 2017092448 A | 5/2017 |
| JP | 2017120811 A | 7/2017 |
| JP | 2017131927 A | 8/2017 |
| JP | 2017183701 A | 10/2017 |
| JP | 2018010992 A | 1/2018 |
| JP | 2018098187 A | 6/2018 |
| JP | 2018098239 A | 6/2018 |
| JP | 2018125519 A | 8/2018 |
| JP | 2018160666 A | 10/2018 |
| JP | 2019505088 A | 2/2019 |
| JP | 2019192734 A | 10/2019 |
| JP | 2019201085 A | 11/2019 |
| JP | 2019208023 A | 12/2019 |
| JP | 2019220691 A | 12/2019 |
| JP | 2020043137 A | 3/2020 |
| JP | 2020519016 A | 6/2020 |
| JP | 2020115541 A | 7/2020 |
| JP | 2022031361 A | 2/2022 |
| KR | 10-1998-0086673 A | 12/1998 |
| KR | 20010112277 A | 12/2001 |
| KR | 20020002704 A | 1/2002 |
| KR | 20020031417 A | 5/2002 |
| KR | 20020071398 A | 9/2002 |
| KR | 20030065126 A | 8/2003 |
| KR | 20040016693 A | 2/2004 |
| KR | 20040050080 A | 6/2004 |
| KR | 20050008792 A | 1/2005 |
| KR | 20050038898 A | 4/2005 |
| KR | 100578129 B1 | 5/2006 |
| KR | 20070008980 A | 1/2007 |
| KR | 20070073704 A | 7/2007 |
| KR | 100783062 B1 | 12/2007 |
| KR | 100803858 B1 | 2/2008 |
| KR | 20080013552 A | 2/2008 |
| KR | 20080023569 A | 3/2008 |
| KR | 100849179 B1 | 7/2008 |
| KR | 20090024075 A | 3/2009 |
| KR | 20090080520 A | 7/2009 |
| KR | 20090094290 A | 9/2009 |

(56) References Cited

FOREIGN PATENT DOCUMENTS

| | | |
|---|---|---|
| KR | 2010-0105695 A | 9/2010 |
| KR | 20100123724 A | 11/2010 |
| KR | 20110005665 U | 6/2011 |
| KR | 2011-0125188 A | 11/2011 |
| KR | 20110123519 A | 11/2011 |
| KR | 20110137775 A | 12/2011 |
| KR | 2013-0124616 A | 11/2013 |
| KR | 20130137962 A | 12/2013 |
| KR | 20140001540 A | 1/2014 |
| KR | 2014-0101870 A | 8/2014 |
| KR | 2014-0103872 A | 8/2014 |
| KR | 2014-0132542 A | 11/2014 |
| KR | 20160014088 A | 2/2016 |
| KR | 10-2016-0063412 A | 6/2016 |
| KR | 10-2016-0088820 A | 7/2016 |
| KR | 20160088820 A | 7/2016 |
| KR | 2017-0037526 A | 4/2017 |
| KR | 20170130284 A | 11/2017 |
| KR | 20180000605 U | 3/2018 |
| KR | 20180099776 A | 9/2018 |
| KR | 101927936 B1 | 12/2018 |
| KR | 10-2019-0017721 A | 2/2019 |
| KR | 20190017721 A | 2/2019 |
| KR | 20190026898 A | 3/2019 |
| KR | 10-1974422 B1 | 5/2019 |
| KR | 101974420 B1 | 5/2019 |
| KR | 20190068490 A | 6/2019 |
| KR | 20190135426 A | 12/2019 |
| TW | 506234 B | 10/2002 |
| TW | 200302035 A | 7/2003 |
| TW | 200520137 A | 6/2005 |
| TW | 200525635 A | 8/2005 |
| TW | I267563 B | 12/2006 |
| TW | 201001588 A | 1/2010 |
| TW | 201207933 A | 2/2012 |
| TW | 201243942 A | 11/2012 |
| TW | 201246327 A | 11/2012 |
| TW | 201324653 A | 6/2013 |
| TW | 201347063 A | 11/2013 |
| TW | 201351532 A | 12/2013 |
| TW | 201411719 A | 3/2014 |
| TW | 201426854 A | 7/2014 |
| TW | 201436089 A | 9/2014 |
| TW | 201447965 A | 12/2014 |
| TW | 201503209 A | 1/2015 |
| TW | M492915 U | 1/2015 |
| TW | 201528310 A | 7/2015 |
| TW | 201532106 A | 8/2015 |
| TW | 201601208 A | 1/2016 |
| TW | 201626427 A | 7/2016 |
| TW | 201630107 A | 8/2016 |
| TW | 201639074 A | 11/2016 |
| TW | 201719709 A | 6/2017 |
| TW | 201724345 A | 7/2017 |
| TW | 201737290 A | 10/2017 |
| TW | 201742102 A | 12/2017 |
| TW | 201817899 A | 5/2018 |
| TW | 201901850 A | 1/2019 |
| TW | 201909331 | 3/2019 |
| TW | 201926536 A | 7/2019 |
| TW | 201935593 A | 9/2019 |
| WO | WO-0040776 A1 | 7/2000 |
| WO | WO-0113404 A1 | 2/2001 |
| WO | WO-2007008509 A2 | 1/2007 |
| WO | WO-2009086109 A2 | 7/2009 |
| WO | WO-2011051251 A1 | 5/2011 |
| WO | WO-2013108750 A1 | 7/2013 |
| WO | WO-2013123617 A1 | 8/2013 |
| WO | WO-2014068886 A1 | 5/2014 |
| WO | WO-2014163742 A1 | 10/2014 |
| WO | WO-2014209492 A1 | 12/2014 |
| WO | WO-2017131927 A1 | 8/2017 |
| WO | WO-2017155812 A1 | 9/2017 |
| WO | WO-2018010986 A1 | 1/2018 |
| WO | WO-2019022708 A1 | 1/2019 |
| WO | WO-2019103722 A1 | 5/2019 |
| WO | WO-2019112903 A1 | 6/2019 |
| WO | WO-2019143858 A1 | 7/2019 |
| WO | WO-2020036613 A1 | 2/2020 |
| WO | WO-2020180656 A1 | 9/2020 |
| WO | WO-2021025934 A1 | 2/2021 |
| WO | WO-2021026110 A1 | 2/2021 |
| WO | WO-2021030184 A1 | 2/2021 |
| WO | WO-2021-167897 A1 | 8/2021 |
| WO | WO-2021194470 A1 | 9/2021 |
| WO | WO-2022076227 A1 | 4/2022 |

OTHER PUBLICATIONS

International Search Report and Written Opinion of the ISA issued in PCT/US2020/044816, mailed Nov. 13, 2020; ISA/KR.

Office Action from corresponding Korean Application No. 10-2022-7007791, dated Jul. 22, 2024.

Search Report from corresponding Singaporean Application No. 11202201065W, dated May 28, 2024.

Office Action from corresponding Korean Application No. 10-2023-7037449, dated Jul. 22, 2024.

Search Report from corresponding Korean Application No. 10-2023-7037449, dated Nov. 16, 2023.

Taiwanese Office Action from corresponding Taiwanese Application No. 109126470 dated Jun. 28, 2024.

Extended European Search Report from corresponding European Application No. 22156901.5 dated Jun. 27, 2022.

Office Action from corresponding Korean Application No. 10-2022-7007496 dated Aug. 21, 2024.

International Search Report and Written Opinion of the ISA issued in PCT/US2020/045389, mailed Nov. 17, 2020; ISA/KR.

Translation of Second Office Action dated Feb. 16, 2021 corresponding to Japanese Application No. 2017-039058, 4 pages.

First Office Action corresponding to Taiwanese Patent Application No. 106106790 dated Oct. 7, 2020, 7 pages.

First Office Action corresponding to Chinese Patent Application No. 201710122891.1 dated Apr. 10, 2020, 14 pages.

Second Office Action corresponding to Chinese Patent Application No. 201710122891.1 dated Dec. 3, 2020, 5 pages.

MP125E N-470 Linear Drive User Manual; Version 1.1.0; Date Sep. 18, 2014; 54 Pages; Physik Instrumente (PI) GmbH & Co. KG, Auf der Roemerstr. 1, 76228 Karlsruhe, Germany.

First Office Action dated Dec. 29, 2017 corresponding to Chinese Patent Application No. 201610032252.1, 12 pages.

First Office Action dated Aug. 2, 2018 corresponding to Chinese Patent Application No. 201710036188.9, 7 pages.

Bohr, Mark, "The New Era of Scaling in an SoC World" Intel Logic Technology Development; ISSCC; 2009; 66 Pages.

Dusa, Mircean et al., "Pitch Doubling Through Dual Patterning Lithography Challenges in Integration and Litho Budgets," Optical Microlithography XX, vol. 6520, 65200G, (2007); 10 pages.

U.S. Office Action dated Oct. 5, 2015 issued in U.S. Appl. No. 14/576,020 [LAMRP146].

Blain et al. (Jul./Aug. 1996) "Role of nitrogen in the downstream etching of silicon nitride," Journal of Vacuum Science & Technology A, 14(4):2151-2157.

Blain (Mar./ Apr. 1999) "Mechanism of nitrogen removal from silicon nitride by nitric oxide," Journal of Vacuum Science & Technology A, 17(2):665-667.

Kastenmeier et al. (Nov./Dec. 1999) "Highly selective etching of silicon nitride over silicon and silicon dioxide," J. Vac. Sci. Techno !. A, American Vacuum Society, I7 (6):3179-3184.

Kastenmeier et al. (Sep./Oct. 1996) "Chemical dry etching of silicon nitride and silicon dioxide using CF4/02/N2 gas mixtures," J. Vac. Sci. Technol. A14(5):2802-2813.

Oehrlein et al. (1996) "Study of plasma-surface interactions: chemical dry etching and high-density plasma etching," Plasma Sources Sci. Technol. 5:193-199.

Tajima et al. (2013) "Room-Temperature Si Etching in NO/F2 Gases and the Investigation of Surface Reaction Mechanisms," The Journal of Physical Chemistry C, 117:5118-5125.

(56)                    References Cited

OTHER PUBLICATIONS

Yun et al. (2007) "Large Etch Rate Enhancement by NO-Induced Surface Chemical Reaction during Chemical Dry Etching of Silicon Oxide in F2 Remote Plasmas," Journal of The Electrochemical Society, 154(4):D267-D272.

US Final Ofice Action dated Feb. 26, 2016 issued in U.S. Appl. No. 14/576,020 [LAMRP146].

US Office Action dated Sep. 23, 2016 issued in U.S. Appl. No. 14/576,020 [LAMRP146].

European Extended Search Report dated May 30, 2016 issued in EP 15 199 363.1 [LAMRP146EP].

U.S. Appl. No. 62/106,407, filed Jan. 22, 2015, in the names of Joseph Yudovsky et al., & entitled "Injector for Spatially Separated Atomic Layer Deposition Chamber" pp. 1-68. (Year: 2015).

U.S. Appl. No. 62/065,497, entitled "Gas Supply Delivery Arrangement Including a Gas Splitter for Tunable Gas Flow Control," filed Oct. 17, 2014, in the names of Mark Taskar et al. (Year: 2014).

First Chinese Office Action for Chinese Application No. 201710013856.6 dated Oct. 21, 2019.

First Chinese Office Action for Chinese Application No. CN201710076420.1 issued Dec. 17, 2019. No translation provided. 11 pages.

First Office Action corresponding to Japanese Application No. 2018-186353, dated Jan. 21, 2020, 8 pages.

First Office Action corresponding to Japanese Application No. 2016-004302, dated Jan. 28, 2020, 4 pages.

First Office Action corresponding to Tiawanese Application No. 106104190, dated Sep. 4, 2020, 5 pages.

Office Action issued in corresponding Japanese Patent Application 2016-143886 dated Sep. 8, 2020.

Translation of First Office Action dated Sep. 28, 2020 corresponding to Korean Patent Application No. 10-2018-0114808, 3 pages.

Translation of Notification of Examination Opinions corresponding to Taiwanese Patent Application No. 106101332 dated Nov. 19, 2020, 9 pages.

D. A. Jobson. "On the Flow of a Compressible Fluid through Orifices." Proceedings of the Institution of Mechanical Engineers. 169[1](1955). pp. 767-776. https://doi.org/10.1243/PIME_PROC_ 1955_ 169_077_02 (Year: 1955).

Cashco, Inc. "Fluid Flow Basics ofThrottling Valves." 1999. pp. 1-56. Available Mar. 24, 2020 online at: https://www.controlglobal. com/assets/Media/MediaManager/RefBook_ Cash co_Fluid. pdf. (Year: 1999).

O'Keefe Controls Co. "Choked Flow of Gases." in Catalog 11. 2003. pp. 20-24 & 48. (Year: 2003).

Christophe Corre. "Lecture 5: Quasi-1 D compressible Flows" in "Fundamentals of Compressible and Viscous Flow Analysis—Part II." 2018. pp. 94-148. Ecole Centrale de Lyon. Fluid Mechanics and Acoustics Laboratory (LMFA ). http://lmfa.ec-lyon. (Year: 2018).

Notification of Examination Opinions corresponding to Taiwanese Patent Application No. 10512352 dated Feb. 19, 2020, 5 pages.

First Office Action dated Mar. 17, 2020 corresponding to Chinese Patent Application 20170076027.2, 8 pages.

First Office Action with Translation dated Sep. 7, 2021 corresponding to Korean Patent Application No. 10-2017-0083210, 6 pages.

First Office Action with Translation dated Oct. 7, 2021 corresponding to Japanese Patent Application No. 2017-154893, 7 pages.

Notification of Search Report corresponding to Singapore Patent Application No. 10201808035Y dated Aug. 15, 2022, 11 pages.

Office Action dated May 29, 2023 from Korean Patent Office for Korean Patent Application No. 10-2021-0079769; 8 pages.

International Search Report and Written Opinon for PCT Applicaiton No. PCT/US2019/045085 dated Dec. 20, 2019.

International Search Report and the Written Opinion of the ISA issued in PCT/US2017/061080, mailed Feb. 22, 2018; ISA/KR.

International Search Report and Written Opinion issued in PCT/ US2017/043527, mailed Apr. 20, 2018; ISA/KR.

International Search Report and Written Opinion issued in PCT/ US2017/062769, mailed Aug. 21, 2018; ISA/KR.

Search Report dated Sep. 7, 2020 corresponding to European Application No. 17 919 402.2, 9 pages.

Machine Translation of Notice of Reasons for Refusal corresponding to Japanese Patent Application No. 2019-559033 dated Dec. 22, 2020, 4 pages.

Translation of Written Opinion corresponding to Singapore Application No. 11201907515W dated Mar. 15, 2020, 4 pages.

Translation of Notification of Examination Opinions dated May 4, 2020 corresponding to Taiwanese Patent Application No. 106142110, 7 pages.

Translation of Notification of Office Action dated Dec. 17, 2019 corresponding to Korean Patent Application No. 10-2018-7021511, 2 pages.

Translation of Notification of Office Action dated Jun. 26, 2020 corresponding to Korean Patent Application No. 10-2018-7021511, 2 pages.

Search Report dated Feb. 19, 2020 corresponding to European Application No. 17 932 862.0, 7 pages.

Office Action dated Dec. 1, 2020 corresponding to Japanese Application No. 2019-553416, 4 pages.

Translation of Decision of Refusal dated Feb. 3, 2021 corresponding to Taiwanese Patent Application No. 106142110, 4 pages.

Translation of Decision for Grant of Patent dated Jul. 28, 2020 corresponding to Korean Application No. 10-2018-7021879, 1 page.

Translation of Written Opinion corresponding to Singapore Application No. 11201908264Q dated Feb. 19, 2020, 7 pages.

Translation of Notification of Office Action dated Dec. 19, 2019 corresponding to Korean Patent Application No. 10-2018-7021879, 7 pages.

Translation of Notification of Office Action dated Mar. 29, 2020 corresponding to Korean Patent Application No. 10-2020-7004813, 3 pages.

Translation of Decision for Grant of Patent dated Feb. 24, 2021 corresponding to Korean Application No. 10-2020-7013289, 1 page.

Translation of Notification of Office Action dated Aug. 27, 2021 corresponding to Korean Patent Application No. 10-2021-7014539, 8 pages.

Decision for Grant of Patent for Korean Application No. 10-2021-7014539 dated Feb. 23, 2022.

Notice of Reasons for Refusal for Japanese Application No. 2021-75777 dated Jul. 12, 2022.

International Search Report and Written Opinion of the ISA issued in PCT/US2018/050273, mailed May 13, 2019; ISA/KR.

Notice of Reason for Refusal issued in corresponding Japanese patent application No. 2019-505020 dated Oct. 20, 2020.

Office Action issued in corresponding Korean Patent Application No. 10-2018-7028683 dated Nov. 26, 2020.

Office Action issued in corresponding Taiwanese Patent Application No. 109128923 dated May 11, 2021 (4 pages).

Office Action issued in corresponding Korean Patent Application No. 10-2018-7028683 dated Apr. 27, 2022.

Supplementary Partial European Search Report issued in corresponding European Patent Application No. 18929891 dated Mar. 18, 2022.

Office Action issued in corresponding Korean Patent Application 10-2018-7028683 dated Dec. 29, 2022.

Office Action issued in corresponding Japanese Patent Application 2022-31361 dated Jan. 17, 2023 (no English translation available).

Office Action issued in corresponding Taiwanese Patent Application 111104002 dated Mar. 6, 2023.

Office Action issued in corresponding Chinese Patent Application 201880002160.6 dated Mar. 23, 2023.

International Search Report and Written Opinion of the ISA issued in PCT/US2020/044168, mailed Nov. 17, 2020; ISA/KR.

International Search Report and Written Opinion of the ISA issued in PCT/US2020/024333, mailed Dec. 24, 2020; ISA/KR.

International Search Report and Written Opinion of the ISA issued in PCT/US2021/052732, mailed Jan. 21, 2022; ISA/KR.

Supplementary Partial European Search Report issued in corresponding European Patent Application No. 20850609 dated MAug. 3, 2023.

(56) References Cited

OTHER PUBLICATIONS

Taiwanese Office Action for Taiwanese Application No. 110126786 dated Oct. 16, 2023.
Taiwanese Office Action for Taiwanese Application No. 109109974 dated Jan. 4, 2024.
Examination Report issued in corresponding European Patent Application 18929891.2 dated Mar. 7, 2023.
Taiwanese Office Action for Taiwanese Application No. 111104002 dated Mar. 8, 2023.
Notice of Reason for Refusal issued in corresponding Japanese patent application No. 2022-31361 dated Jan. 17, 2023.
European Extended Search Report dated Jun. 21, 2022 issued in EP 18929891.2.
Notice of Reason for Refusal issued in corresponding Japanese patent application No. 2022-31361dated Jun. 20, 2023.
Office Action issued in corresponding Korean Patent Application No. 10-2018-7028683 dated Dec. 29, 2022.
Office Action issued in corresponding Korean Patent Application 10-2018-7028683 dated May 2, 2023.
Office Action issued in corresponding Korean Patent Application 10-2021-7027521 dated Dec. 20, 2021.
Office Action dated Oct. 10, 2023 from Korean Patent Office for Korean Patent Application No. 10-2023-7023024.
Office Action issued in corresponding Korean Patent Application 1020170018561 mailed May 21, 2024.
Office Action issued in corresponding Korean Patent Application No. 1020170018549 dated May 28, 2024.
O.W. Purbo et al., 'Reactive Ion Etching of SOI (Simox and ZMR) Silicon in Nitrogen Containing CF4 + 02 and SF6 + 02 Plasmas', the J. Electrochem. Soc., (Sep. 30, 1993).
L. Jiang et al., 'Impact of Ar addition to inductively coupled plasma etching of SiC in SF6/O2', Microelectron. Eng., (Mar. 18, 2004).
Office Action issued in corresponding Korean Patent Application 1020170013979 dated May 29, 2024.
Japanese Office Action and Search Report for Japanese Application No. 2022-508752 dated Jul. 25, 2024.
Korean Decision for Grant of Patent for Korean Application No. 10-2023-7035339 dated Jul. 30, 2024.
European Examination Report for European Application No. 21161965.5 dated Jul. 27, 2023.
Extended European Search Report from European Application No. 22156901.5 dated Jun. 27, 2022.
First Office Action from Corresponding Taiwanese Application No. 109126470 dated Jun. 28, 2024.
Decision to Grant for Japanese Application No. 2022-557679 dated Feb. 28, 2024.
Office Action from corresponding Taiwanese Application No. 112149171, dated Nov. 13, 2024.
International Search Report and Written Opinion of the ISA issued in PCT/US2022/043617, mailed Mar. 30, 2023; ISA/KR.

Chinese Office Action for Chinese Application No. 202080057245.1 dated Oct. 17, 2024.
Japanese Office Action for Japanese Application No. 2023-129731 dated Sep. 10, 2024.
Decision to Grant for Japanese Application No. 2023-11469 dated Apr. 10, 2024.
Allowanced issued in corresponding Korean Application No. 1020170018561 dated Jan. 15, 2025.
Taiwanese Office Action for Taiwanese Application No. 110136825 dated Jan. 16, 2025.
Decision to Grant a Patent in Japanese Application No. 20220264247, dated Feb. 25, 2025.
Taiwanese Office Action for TW113144614, dated Dec. 30, 2025.
Decision to Grant for Japanese Application No. 2024-75662 dated Mar. 27, 2025.
Japanese Allowance for Japanese Application No. 2024-75662 dated Mar. 27, 2025.
Japanese Allowance for Japanese Application No. 2023-11469 dated Apr. 5, 2024.
Korean Office Action for Korean Application No. 10-2023-7015468 mailed Mar. 21, 2025.
Office Action for corresponding Korean App. No. 1020237023024 mailed on Mar. 26, 2025.
Japanese Office Action for Japanese Application No. 2023-129731 drafted Mar. 10, 2025.
Taiwanese Office Action for Taiwanese Application No. 112123427 dated Aug. 2, 2024.
Korean Office Action for Korean Application No. 10-2024-7036134 mailed Apr. 18, 2025.
Decision to Grant for Japanese Application No. 2024-59272 May 7, 2025.
Japanese Decision to Grant a Patent for Japanese Application No. 2023-521034 dated Aug. 27, 2025.
Chinese Office Action for Chinese Application No. 201780089345 dated Jun. 5, 2023.
Chinese Office Action for Chinese Application No. 201780089345 dated Nov. 18, 2022.
Korean Office Action for Korean Application No. 10-2024-7036134 dated Apr. 18, 2025.
Japanese Office Action for Japanese Application No. 2023-129731 mailed Aug. 19, 2025.
Chinese Office Action for Chinese Application No. 202210228466.1 dated Aug. 1, 2025.
Japanese Office Action for Japanese Application No. 2024-122938 dated Oct. 21, 2025.
Japanese Office Action for Japanese Application No. 2024-206843 dated Dec. 8, 2025.
Korean Decision for Grant of Patent for Korean Application No. 10-2022-7036594 dated Sep. 28, 2025.
Korean Office Action from counterpart KR1020257039447, dated Mar. 28, 2026.

* cited by examiner

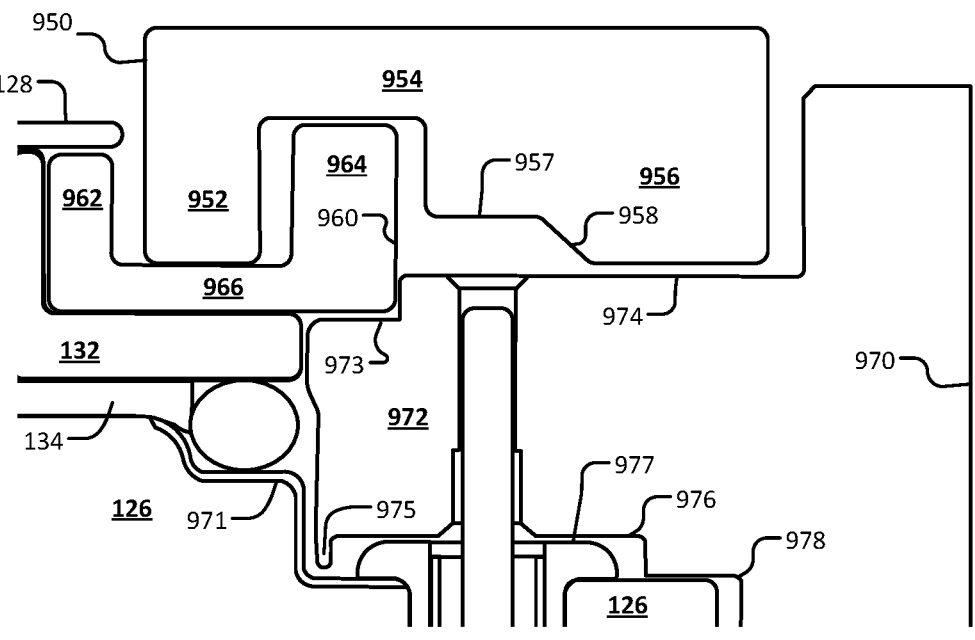
FIG. 9C
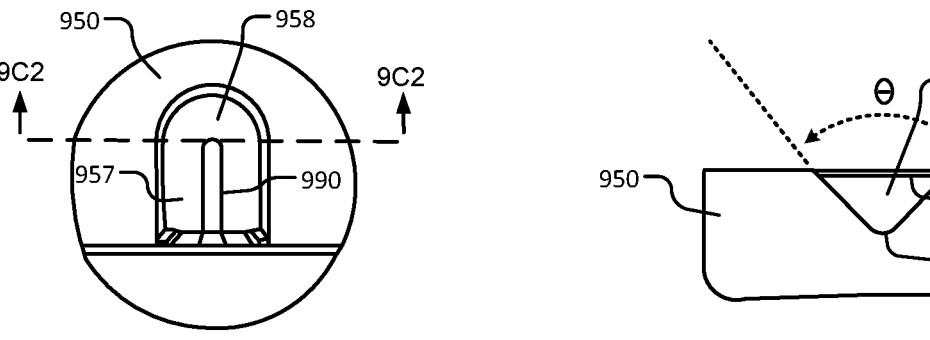
FIG. 9C1                    FIG. 9C2

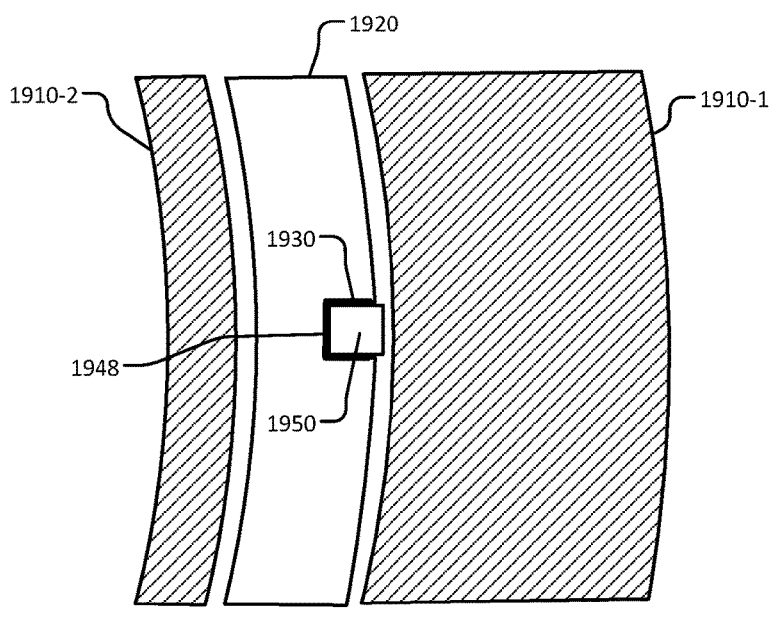
FIG. 21
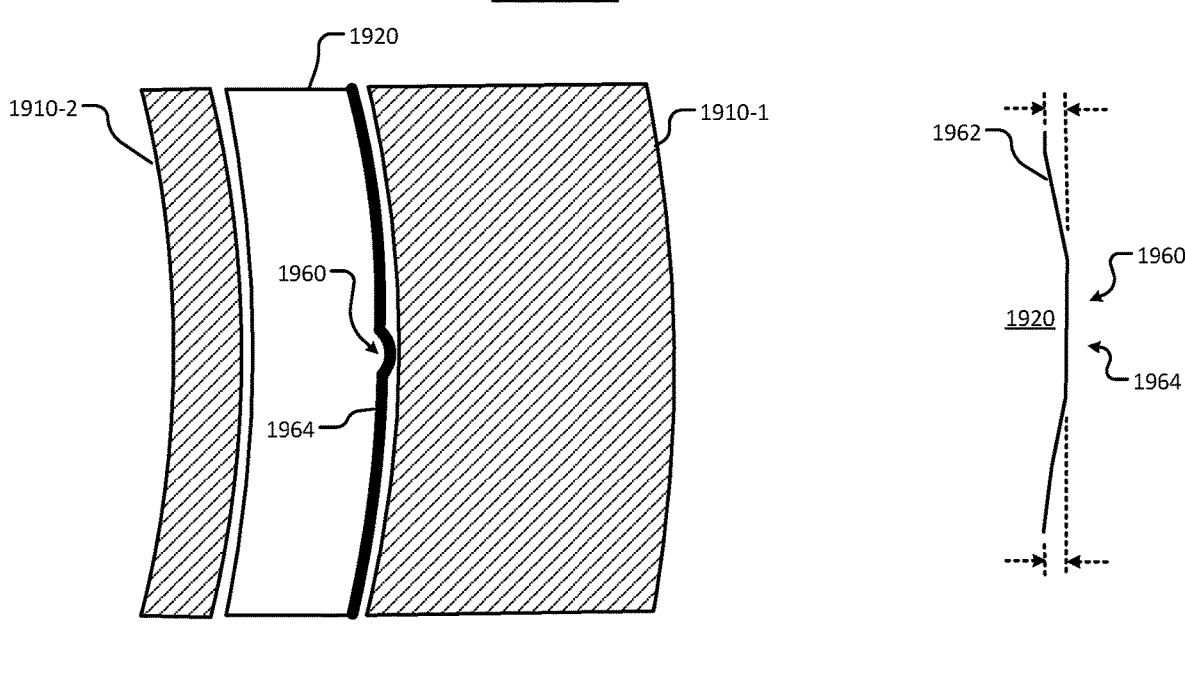
FIG. 22A                    FIG. 22B

MOVEABLE EDGE RINGS WITH REDUCED CAPACITANCE VARIATION FOR SUBSTRATE PROCESSING SYSTEMS

CROSS-REFERENCE TO RELATED APPLICATIONS

This application is a National Stage of International Application No. PCT/US20/44816, filed on Aug. 4, 2020, which claims the benefit of U.S. Provisional Application No. 62/976,088, filed on Feb. 13, 2020, and U.S. Provisional Application No. 62/882,890, filed Aug. 5, 2019. The entire disclosures of the applications referenced above are incorporated herein by reference.

FIELD

The present disclosure relates generally to plasma processing systems and more particularly to edge ring systems with a moveable edge ring.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems perform treatments on substrates such as semiconductor wafers. Examples of substrate treatments include deposition, ashing, etching, cleaning and/ or other processes. Process gas mixtures may be supplied to the processing chamber to treat the substrate. Plasma may be used to ignite the gases to enhance chemical reactions.

A substrate is arranged on a substrate support during treatment. An edge ring is annular and is arranged around and adjacent to a radially outer edge of the substrate. The edge ring may be used to shape or focus the plasma onto the substrate. During operation, the substrate and an exposed surface of the edge ring is etched by the plasma. As a result, the edge ring wears and the effect of the edge ring on the plasma changes over time.

SUMMARY

A moveable edge ring system for a plasma processing system includes a top edge ring and a first edge ring arranged below the top edge ring. A second edge ring is made of conductive material and includes an upper portion, a middle portion and a lower portion. The top edge ring and the second edge ring are configured to move in a vertical direction relative to a substrate support and the first edge ring when biased upwardly by a lift pin. The second edge ring is arranged below the top edge ring and radially outside of the first edge ring.

In other features, the lower portion of the second edge ring extends radially inwardly relative to the middle portion to define a first gap between the lower portion of the second edge ring and a radially outer surface of a substrate support. The middle portion of the second edge ring defines a second gap between the middle portion and the radially outer surface of the substrate support. The second gap is greater than or equal to two times the first gap.

In other features, the middle portion of the second edge ring moves parallel to a radially outer edge of the first edge ring as the lift pin raises the second edge ring and the top edge ring. The top edge ring has an inverted "U"-shape. The top edge ring is made of conductive material. The top edge ring is made of dielectric material. The first edge ring is made of conductive material. The first edge ring is made of dielectric material. The middle portion of the second edge ring extends radially inwardly relative to the upper portion of the second edge ring to define a first annular recess.

In other features, the first edge ring includes a second annular recess on an upper and radially outer surface thereof. A radially inner leg of the top edge ring is located in the first annular recess and the second annular recess when the top edge ring is in a lowered position.

In other features, a third edge ring is located below and radially outside of the first edge ring, the second edge ring and the top edge ring. The third edge ring defines an annular recess on an upper and radially inner surface. A radially outer leg of the top edge ring is located in the annular recess when the top edge ring is in a lowered position.

In other features, the third edge ring includes a vertical bore to receive the lift pin. The second edge ring has a generally rectangular cross-section and a radially inner surface that is parallel to a radially outer edge of a substrate support.

A moveable edge ring system for a plasma processing system includes a top edge ring. A first edge ring is made of dielectric material and includes an embedded conductor that is fully embedded within the dielectric material. The first edge ring lies below the top edge ring. The top edge ring and the first edge ring are configured to move in a vertical direction relative to a substrate support when biased upwardly by a lift pin.

In other features, a second edge ring is arranged below the top edge ring. The first edge ring includes an upper portion, a middle portion and a lower portion. The first edge ring is arranged below the top edge ring and radially outside of the second edge ring.

In other features, the lower portion of the first edge ring extends radially inwardly relative to the middle portion and defines a first gap between the lower portion of the second edge ring and a radially outer surface of the substrate support. The middle portion of the first edge ring defines a second gap between the middle portion and the radially outer surface of the substrate support. The second gap is greater than or equal to two times the first gap.

In other features, the middle portion of the first edge ring moves parallel to a radially outer edge of the second edge ring as the lift pin raises the first edge ring and the top edge ring. The top edge ring has an inverted "U"-shape.

In other features, the embedded conductor includes a horizontal conductor arranged in the upper portion parallel to an upper surface of the first edge ring. The embedded conductor further includes a vertical conductor arranged in the lower portion parallel to a radially inner surface of the first edge ring. The embedded conductor further includes a conductor connecting the vertical conductor and the horizontal conductor. The top edge ring is made of conductive material. The top edge ring is made of dielectric material. The second edge ring is made of dielectric material. The second edge ring is made of conductive material.

In other features, a third edge ring located below and radially outside of the first edge ring, the second edge ring and the top edge ring. The third edge ring defines an annular recess on an upper and radially inner surface. A radially outer leg of the top edge ring is located in the annular recess when the top edge ring is in a lowered position. The third edge ring includes a vertical bore to receive the lift pin.

In other features, the first edge ring is made of ceramic green sheets that include conductive traces and vias.

A moveable edge ring system for a plasma processing system includes a top edge ring. A first edge ring is made of dielectric material and includes a doped region and an undoped region. The doped region is more conductive than the undoped region. The first edge ring lies below the top edge ring. The top edge ring and the first edge ring are configured to move in a vertical direction relative to a substrate support when biased upwardly by a lift pin.

In other features, a second edge ring is arranged below the top edge ring. The first edge ring includes an upper portion, a middle portion and a lower portion. The first edge ring is arranged below the top edge ring and radially outside of the second edge ring.

In other features, the lower portion of the first edge ring extends radially inwardly relative to the middle portion and defines a first gap between the lower portion of the second edge ring and a radially outer surface of the substrate support. The middle portion of the first edge ring defines a second gap between the middle portion and the radially outer surface of the substrate support. The second gap is greater than or equal to two times the first gap.

In other features, the middle portion of the first edge ring moves parallel to a radially outer edge of the second edge ring as the lift pin raises the first edge ring and the top edge ring. The doped region is arranged along an upper surface and a radially inner surface of the first edge ring. The top edge ring has an inverted "U"-shape. The top edge ring is made of conductive material. The top edge ring is made of dielectric material. The second edge ring is made of conductive material. The second edge ring is made of dielectric material.

In other features, a third edge ring is located below and radially outside of the first edge ring, the second edge ring and the top edge ring. The third edge ring defines an annular recess on an upper and radially inner surface. A radially outer leg of the top edge ring is located in the annular recess when the top edge ring is in a lowered position. The third edge ring includes a vertical bore to receive the lift pin.

An edge ring for a plasma processing system includes an annular body that is made of at least one of a dielectric material and a conducting material. The annular body includes an upper portion, a middle portion and a lower portion. A first step projects radially outwardly from a radially inner surface of the annular body between the upper portion and the middle portion. A second step projects radially outwardly from a radially inner surface of the annular body between the middle portion and the lower portion.

In other features, the annular body is made of dielectric material and further comprising an embedded conductor arranged fully inside of the annular body. The embedded conductor includes a horizontal conductor arranged in the upper portion parallel to an upper outer surface of annular body. The embedded conductor further includes a vertical conductor arranged in the lower portion of the annular body parallel to a radially inner surface of the annular body. The embedded conductor further includes a conductor connecting the vertical conductor and the horizontal conductor. The annular body is made of dielectric material and further comprising a doped region and an undoped region. The doped region of the annular body is more conductive than the undoped region. The doped region is arranged on an upper surface and a radially inner surface of the annular body. The annular body is made of ceramic green sheets that include conductive traces and vias.

An edge ring for a plasma processing system includes an annular body that is made of a dielectric material and that is configured to surround a substrate support of the plasma processing system. An embedded conductor is arranged fully inside of the annular body and includes a first conductor arranged in the annular body and a second conductor arranged in the annular body transverse to the first conductor and connected to the first conductor.

In other features, the annular body has an "L"-shaped cross-section. The annular body includes a first leg connected to a second leg. The first conductor is arranged in the first leg and the second conductor is arranged in the second leg.

In other features, the first conductor is arranged parallel to a first outer surface of the annular body. A third conductor is arranged parallel to a second outer surface of the annular body. The second conductor is connected to the first conductor and the third conductor. The annular body includes an upper portion, a middle portion, and a lower portion. A first step is located on and projects radially outwardly from a radially inner surface of the annular body between the upper portion and the middle portion. A second step is located on and projects radially outwardly from a radially inner surface of the annular body between the middle portion and the lower portion.

In other features, the first conductor is arranged parallel to a first outer surface of the annular body in the upper portion. The second conductor is arranged parallel to a radially inner surface of the annular body in the lower portion. A third conductor connects the first conductor to the second conductor. The annular body is made of ceramic green sheets that include conductive traces and vias.

An edge ring for a plasma processing system includes an annular body configured to surround a substrate support of a plasma processing system. An embedded conductor is arranged within the annular body and configured to capacitively couple but not directly couple with at least one external conductive component selected from a group consisting of a baseplate of the substrate support and another edge ring.

An edge ring for a plasma processing system includes an annular body that is made of a dielectric material and that is configured to be arranged around a substrate support. The annular body includes a doped region and an undoped region. The doped region is more conductive than the undoped region.

In other features, the doped region includes a first portion arranged along a radially inner surface of the annular body. The doped region includes a second portion arranged on an upper surface of the annular body. The first portion is in contact with the second portion. The annular body includes an upper portion, a middle portion, and a lower portion. A first step is located on and projects radially outwardly from a radially inner surface of the annular body between the upper portion and the middle portion. A second step is located on and projects radially outwardly from the radially inner surface of the annular body between the middle portion and the lower portion.

In other features, the dielectric material includes silicon carbide. The dielectric material is doped with impurities selected from a group consisting of boron, aluminum or nitrogen.

A moveable edge ring system for a plasma processing system includes a top edge ring. A first edge ring is arranged below the top edge ring and having a rectangular cross-section. A second edge ring is made of a conducting material, has a Z-shaped cross-section and is arranged radially outside of and above the first edge ring. The top edge ring and the second edge ring are configured to move vertically relative to the first edge ring and a substrate support when biased by a lift pin.

In other features, as the second edge ring moves upwardly along the first edge ring from a lowered position to a raised position, the second edge ring maintains a fixed surface area within a predetermined gap of a radially outer surface of the first edge ring. Remaining surface area of the second edge ring is located at a distance greater than or equal to two times the predetermined gap from the first edge ring.

In other features, the second edge ring includes an annular body including an upper portion that projects radially inwardly; a middle portion extending in a vertical direction and connected to the upper portion; a lower portion connected to a lower end of the middle portion and projecting radially-outwardly; and a projection extending radially inwardly from the middle portion and extending downwardly to a lower edge of the lower portion.

In other features, the fixed surface area is defined by the projection. A third edge ring is located below the top edge ring and radially inside of the first edge ring. The third edge ring has an "L"-shaped cross-section. A fourth edge ring is located radially outside of the top edge ring and the second edge ring. The fourth edge ring includes a projection that extends radially inwardly and is arranged between portions of the top edge ring and the second edge ring. The top edge ring has an inverted "U"-shape, a body, an inner leg and an outer leg. The top edge ring lies immediately adjacent to the second edge ring, the third edge ring and the fourth edge ring when in a lowered position.

In other features, the top edge ring is made of conductive material. The top edge ring is made of dielectric material. The first edge ring is made of conductive material.

A moveable edge ring system for a plasma process system includes a first edge ring made of conductive material and configured to surround a substrate support. A lift pin is made of a conductive material. A lift pin actuator is configured to bias the lift pin against the first edge ring when in a lowered position and to selectively move the lift pin to increase a height of the first edge ring relative to the substrate support while maintaining contact between the lift pin and the first edge ring.

In other features, a second edge ring located radially inwardly of and below the first edge ring. The second edge ring is made of dielectric material. The second edge ring has an "L"-shaped cross-section and includes a radially inner leg extending in a vertical direction and a radially outer leg extending in a horizontal direction.

In other features, a third edge ring is located radially outwardly of and below the first edge ring and the second edge ring. The third edge ring is made of dielectric material. The third edge ring has an "L"-shaped cross-section. The first edge ring has a rectangular cross-section.

In other features, the third edge ring includes an annular body; and a radially-inwardly projecting portion including a vertical bore to receive the lift pin.

A moveable edge ring system for a plasma processing system includes a first edge ring made of a dielectric material, including an embedded conductor arranged fully inside of the dielectric material, and configured to surround a substrate support. A lift pin is made of a conductive material. A lift pin actuator is configured to bias the lift pin against the first edge ring when in a lowered position and to selectively move the lift pin to increase a height of the first edge ring relative to the substrate support while maintaining contact between the lift pin and the first edge ring.

In other features, the embedded conductor includes a first horizontal conductor arranged parallel to a top surface of the first edge ring. A second horizontal conductor is arranged parallel to a bottom surface of the first edge ring. A third conductor connects the first horizontal conductor to the second horizontal conductor.

In other features, a second edge ring is located radially inwardly of and below the first edge ring. The second edge ring is made of dielectric material. The second edge ring has an "L"-shaped cross-section and includes a radially inner leg extending in a vertical direction and a radially outer leg extending in a horizontal direction.

In other features, a third edge ring is located radially outwardly of and below the first edge ring and the second edge ring. The third edge ring is made of dielectric material. The third edge ring has an "L"-shaped cross-section. The first edge ring has a rectangular cross-section. The third edge ring includes an annular body; and a radially-inwardly projecting portion including a vertical bore to receive the lift pin.

A moveable edge ring system for a plasma processing system includes a top edge ring having an inverted "U"-shaped cross-section and including an annular body, a radially inner leg, and a radially outer leg. A first edge ring is made of conductive material and is at least partially arranged between the radially inner leg and the radially outer leg of the top edge ring. A second edge ring is made of dielectric material and is arranged between the first edge ring and a substrate support. A third edge ring is arranged below and radially outside of the first edge ring and the second edge ring and including N cavities to receive N lift pins, where N is an integer greater than 2. The top edge ring moves relative to the first edge ring, the second edge ring, the third edge ring and the substrate support when biased by the N lift pins.

In other features, the second edge ring and the third edge ring are made of a dielectric material. The first edge ring has an "L"-shaped cross-section. The second edge ring has an "L"-shaped cross-section. The top edge ring includes N radial recesses spaced 360°/N apart, located on a radially inner surface of the radially outer leg and including an angled lower surface extending radially outwardly from the radial recess. The N lift pins bias the top edge ring in the N radial recesses when adjusting a height of the top edge ring.

An edge ring for a plasma processing system includes an annular body having an inverted "U"-shaped cross-section. A radially inner leg extends from the annular body. A radially outer leg extends from the annular body. N radial recesses spaced 360°/N apart, located on a radially inner surface of the radially outer leg, where N is an integer greater than 2, and including an angled lower surface extending radially outwardly from the N radial recesses.

A moveable edge ring system includes the edge ring. A first edge ring has a "U"-shaped cross-section and includes an annular body, a radially inner leg, and a radially outer leg. The radially inner leg of the edge ring is located between the radially inner leg and the radially outer leg of the first edge ring. A second edge ring is arranged below and radially outside of the edge ring and the first edge ring and includes N vertical bores to receive N lift pins. The edge ring moves relative to the first edge ring, the second edge ring and a substrate support when biased by the N lift pins.

In other features, the first edge ring and the second edge ring are made of a dielectric material. The first edge ring has an "L"-shaped cross-section. The second edge ring has an "L"-shaped cross-section. The edge ring is configured to receive the N lift pins in the N radial recesses when adjusting a height of the edge ring.

A moveable edge ring system includes the edge ring. A first edge ring has an "L"-shaped cross-section and includes a radially inner leg and a vertical leg. The vertical leg of the first edge ring is located between the radially inner leg and the radially outer leg of the edge ring. A second edge ring is arranged radially inward from the first edge ring. A third edge ring is arranged below and radially outside of the edge ring. The first edge ring and the second edge ring and includes a vertical bore to receive a lift pin. The edge ring moves relative to the first edge ring, the second edge ring, the third edge ring and a substrate support when biased by the lift pin.

A moveable edge ring system for a plasma processing system includes a top edge ring having an inverted "U"-shaped cross-section and includes an annular body, a radially inner leg, and a radially outer leg. A first edge ring is made of dielectric material, includes an embedded conductor arranged fully inside of the dielectric material, configures to surround a substrate support and at least partially arranged between the radially inner leg and the radially outer leg of the top edge ring. A second edge ring is made of dielectric material and arranged between the substrate support and the first edge ring. A third edge ring is arranged below and radially outside of the first edge ring and the second edge ring and includes a vertical bore to receive a lift pin. The top edge ring is moveable relative to the first edge ring, the second edge ring and the third edge ring when biased by the lift pin.

In other features, the second edge ring and the third edge ring are made of a dielectric material. The second edge ring has an "L"-shaped cross-section. The first edge ring has an "L"-shaped cross-section. The first edge ring includes an annular body with a vertical leg connected to a horizontal leg. The embedded conductor includes a vertical conductor arranged in the vertical leg and a horizontal conductor arranged in the horizontal leg that communicates with the vertical conductor.

An edge ring for a plasma processing system includes an annular body, a radially inner leg connected to the annular body, and a radially outer leg connected to the annular body. A first portion of an upper surface of the annular body is parallel to a plane including a substrate. A second portion of the upper surface of the annular body slopes downwardly an acute angle from the first portion.

In other features, the first portion of the upper surface is located radially inwardly of the second portion of the upper surface. A third portion of the upper surface is parallel to the plane including the substrate and is located radially outwardly of the second portion of the upper surface.

A moveable edge ring system includes the edge ring. A first edge ring is made of conductive material, is configured to surround a substrate support and is at least partially arranged between the radially inner leg and the radially outer leg of the edge ring.

In other features, a second edge ring is made of dielectric material and is arranged between the first edge ring and the substrate support. A third edge ring is arranged below and radially outside of the first edge ring and the second edge ring and includes a vertical bore to receive a lift pin. The edge ring moves relative to the first edge ring, the second edge ring, and the substrate support when biased by a lift pin.

An edge ring for a plasma processing system includes an annular body with a rectangular cross-section. A radially-inwardly projecting leg extends from a radially inner and upper surface of the annular body. A radially inner portion of an upper surface of the annular body is arranged parallel to a plane including a substrate.

In other features, a radially outer portion of the upper surface of the annular body sloping downwardly an acute angle from the radially inner portion.

A moveable edge ring system for a plasma processing system includes the edge ring. A middle edge ring is arranged below the radially-inwardly projecting leg and radially inside of the annular body. An outer edge ring is arranged below the edge ring and the middle edge ring and includes a vertical bore to receive a lift pin. The edge ring moves vertically relative to the middle edge ring and the outer edge ring when biased by the lift pin.

In other features, the middle edge ring has a generally rectangular cross section and an annular recess on a radially inner and upper surface thereof. The substrate is arranged in the annular recess. The outer edge ring includes a radially outer portion and an inner portion that extends radially inwardly from a middle portion of the radially outer portion.

In other features, the outer edge ring includes a projection on an upper and radially inner surface of the inner portion. The projection lies adjacent to a junction between a heating plate and a baseplate of a substrate support. A bottom portion of the annular body is located adjacent to an upper surface of the outer edge ring between the radially outer portion and the projection.

A plasma processing system includes the moveable edge ring system. A substrate support includes a baseplate. A heating plate is bonded to the baseplate. The heating plate includes a body including a plurality of radio frequency (RF) electrodes, a cylindrical portion and a projecting portion extending radially outwardly from the cylindrical portion below the middle edge ring.

In other features, the plurality of RF electrodes are not located in portions of the projecting portion located below the middle edge ring.

A moveable edge ring system for a plasma processing system includes a top edge ring configured to surround a substrate support. The moveable edge ring system includes an annular body; a radially outer leg projecting downwardly from a radially outer surface of the annular body; a radially inner leg projecting downwardly from a radially inner surface of the annular body; and an inwardly projecting leg extending radially inwardly from a lower end of the radially inner leg. The inwardly projecting leg is arranged below a substrate when the substrate is arranged on the substrate support. A first edge ring is configured to surround a substrate support, is arranged below the top edge ring and includes an annular body and a radially inwardly projecting leg. An upper surface of the first edge ring is arranged between the radially inner leg and the radially outer leg of the top edge ring when the first edge ring is biased against the top edge ring.

In other features, a second edge ring arranged radially outside of the top edge ring and the first edge ring. The second edge ring includes an annular body; a radially outwardly projecting leg extending from an upper and radially outer surface of the annular body; and a radially inwardly projecting leg extending radially inwardly from a radially inner and lower surface of the annular body.

In other features, the inwardly projecting leg of the first edge ring extends radially inwardly from an upper and radially inner surface of the annular body of the first edge ring. A third edge ring is arranged radially outside of the first edge ring and below the top edge ring, the first edge ring and the second edge ring. The third edge ring includes an annular body; a radially downwardly projecting leg extending from a radially outer and lower surface of the third edge ring; and an inwardly projecting leg extending radially inwardly from a middle portion of the third edge ring.

In other features, the inwardly projecting leg of the third edge ring includes a vertical bore that receives a lift pin. When biased against the top edge ring, the first edge ring defines a first vertical gap between a lower surface of the radially inner leg of the first edge ring and a surface of the substrate support; and a second vertical gap between a lower surface of the first edge ring and an upper surface of the inwardly projecting leg of the third edge ring.

In other features, when in a lowered position, the first edge ring abuts the inwardly leg of the third edge ring and projecting defines a third vertical gap between an upper surface of the first edge ring and a lower surface of the top edge ring.

A plasma processing system includes a processing chamber. The substrate support is arranged in the processing chamber. The processing chamber includes a substrate port. A robot arm deliver substrates onto the substrate support. The moveable edge ring system is arranged around the substrate support. A lift pin biases the top edge ring and the first edge ring relative to the substrate support.

In other features, the first edge ring and the top edge ring are raised relative to the substrate support by the lift pin, the robot arm removes the top edge ring and the robot arm delivers another top edge ring to the substrate support through the substrate port.

An edge ring system for a plasma processing system includes an upper ring including a first annular body configured to surround a substrate support during plasma processing. A lower ring includes a second annular body configured to surround the substrate support during plasma processing. At least a portion of the second annular body of the lower ring is nested within and defines a predetermined gap relative to a portion of the first annular body of the upper ring when configured for plasma processing. N spacers are arranged in N spaced locations on a surface of at least one of the upper ring and the lower ring to reduce variations in the predetermined gap between the annular body of the upper ring and the annular body of the lower ring as the upper ring and the lower ring are heated and cooled during plasma processing, where N is an integer greater than or equal to 3 and less than or equal to 8.

In other features, at least one of the N spacers includes a shim located in a slot on a radially facing surface of the at least one of the upper ring and the lower ring. The shim has a rectangular cross-section. The slot is located on a radially outer surface of the inner ring. At least one of the N spacers includes a pin located in a slot on a surface of the at least one of the upper ring and the lower ring. The slot is located on a radially outer surface of the inner ring. The N spacers are arranged with a spacing of 360°/N.

In other features, at least one of the N spacers includes a projection formed on a surface of the at least one of the upper ring and the lower ring. The projection is located on a radially outer surface of the inner ring. A coating covers the projection. The coating includes an insulating material.

In other features, the coating is selected from a group consisting of polytetrafluoroethylene (PTFE), perfluoroalkoxy polymer (PFA), aluminum oxide deposited using atomic layer deposition, yttrium oxide deposited using atomic layer deposition, and yttrium fluoride deposited using atomic layer deposition. In other features, N=5. A lift pin lifts the upper ring relative to the lower ring to adjust a height of a top surface of the upper edge ring relative to a substrate on the substrate support.

An edge ring for a plasma processing system includes a first annular body configured to surround a substrate support during plasma processing. At least a portion of the first annular body is configured to nest within and define a predetermined gap relative to a portion of a second annular body of an upper ring exposed to plasma during plasma processing. N spacers are arranged in N spaced locations on at least one of a radially inner surface and a radially outer surface of the annular body to reduce variations in the predetermined gap as the upper ring and the lower ring are heated and cooled during plasma processing, where N is an integer greater than or equal to 3 and less than or equal to 7.

In other features, at least one of the N spacers includes a shim located in a slot on the at least one of the radially inner surface and the radially outer surface of the annular body. The shim has a rectangular cross-section. The slot is located on the radially outer surface of the first annular body. At least one of the N spacers includes a pin located in a slot on the at least one of the radially inner surface and the radially outer surface of the first annular body. The slot is located on the radially outer surface of the first annular body.

In other features, the N spacers are arranged with a spacing of 360°/N. At least one of the N spacers includes a projection formed on the at least one of the radially inner surface and the radially outer surface of the first annular body. The projection is located on a radially outer surface of the inner ring. A coating covers the projection. The coating includes an insulating material. The coating is selected from a group consisting of polytetrafluoroethylene (PTFE), perfluoroalkoxy polymer (PFA), aluminum oxide deposited using atomic layer deposition, yttrium oxide deposited using atomic layer deposition, and yttrium fluoride deposited using atomic layer deposition. In other features, N=5.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 9A to 9C are cross-sectional side views of another example of a moveable edge ring according to the present disclosure;

FIG. 9C1 is a partial bottom view of a portion top edge ring according to the present disclosure;

FIG. 9C2 is a cross-sectional view of a portion of the top edge ring according to the present disclosure;

FIG. 21 is a side cross-sectional view of an edge ring system including an upper ring and a lower ring including a plurality of pins according to the present disclosure;

FIG. 22A is a side cross-sectional view of an edge ring system including an upper ring and a lower ring including a plurality of projections according to the present disclosure; and FIG. 22B is an enlarged side cross-sectional view of a lower edge ring including a projection with a raised flat portion according to the present disclosure.

In the drawings, reference numbers may be reused to identify similar and/or identical elements.

DETAILED DESCRIPTION

Figure 1A:
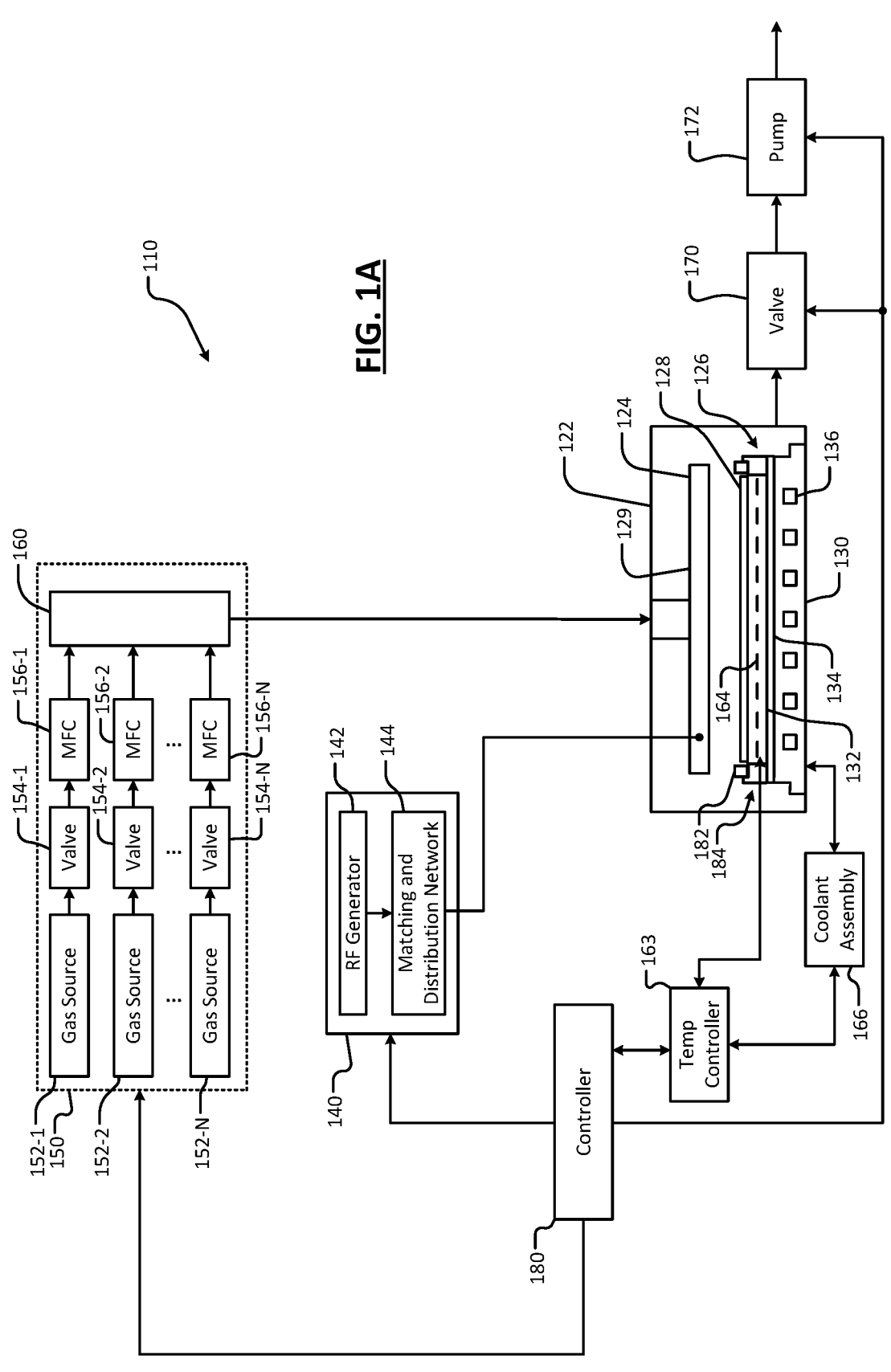
FIG. 1A is a functional block diagram of an example of a substrate processing system according to the present disclosure.

During substrate processing, a substrate is arranged on a pedestal such as an electrostatic chuck (ESC), process gases are supplied, and plasma is struck in the processing chamber. Exposed surfaces of components within the processing chamber experience wear due to the plasma.

For example, an edge ring is arranged around a radially outer edge of the substrate to shape the plasma. After processing substrates, the exposed surface of the edge ring is worn down and sits at a different height relative to the substrate. As a result, the effect of the edge ring on the plasma changes, which alters the effects of the process on the substrates. To reduce process changes due to edge ring wear without breaking vacuum, some processing chambers increase the height of the edge ring to compensate for wear. In many of these systems, the height of the edge ring is automatically adjusted based upon the number of cycles and/or the total plasma processing exposure period. Other systems measure the height of the edge ring and adjust the height based on the measured height.

As the height of the edge ring is adjusted, capacitive coupling between the plasma, the sheath and/or capacitance delivery structures (including the edge ring) changes. These changes in capacitive coupling can cause substrate processing non-uniformities over time. Various edge ring arrangements according to the present disclosure significantly reduce changes in capacitance of the delivery structures due to changes in the height of the edge ring.

More particularly, the plasma sheath is created between the plasma and the delivery components. In some examples, an RF bias is output to the substrate support. To maintain control of the sheath at low RF bias frequencies (e.g. less than 5 MHz, or less than 1 MHz) to ensure process uniformity, the capacitance value of the delivery components to the substrate support needs to be maintained as a height of the edge ring is adjusted to compensate for wear. Areas of the edge ring and/or nearby structures that capacitively couple are designed to minimize changes in capacitive coupling as the top edge ring is moved. In some examples, capacitance is minimized in areas that move apart as the height of the edge ring is increased. Capacitance is controlled in other surface areas that do not change (or change less) as the height of the edge ring is increased.

In some examples, the edge ring is made of conductive material. As used herein, conductive materials refer to materials with a resistivity of less than or equal to $10^4$ Ωcm. For example, doped silicon has a resistivity of 0.05 Ωcm, silicon carbide has a resistivity of 1-300 Ωcm and metals such as aluminum and copper have a resistivity of $\approx 10^{-7}$ Ωcm. In other examples, the edge ring is made of a non-conductive or dielectric material (resistivity $\geq 10^4$ Ωcm) with an embedded conductive electrode. The embedded electrode is designed to minimize changes in capacitive coupling as the top edge ring is moved. In other examples, the edge ring is made of a dielectric material and includes doped regions that are more conductive than undoped regions. The doped regions are designed to minimize changes in capacitive coupling as the edge ring is moved to offset wear.

Figure 2:
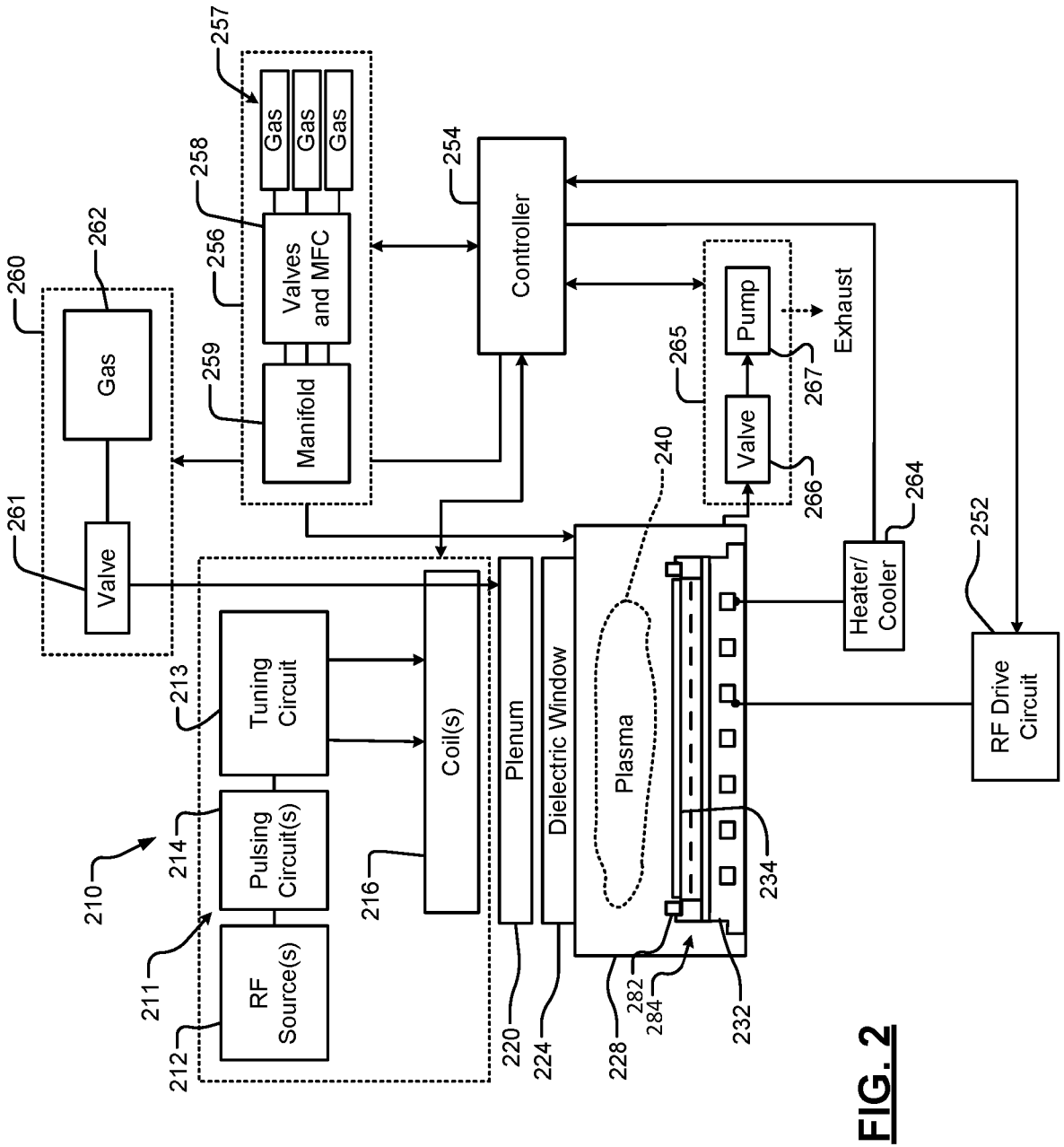
FIG. 2 is a functional block diagram of another example of a substrate processing system according to the present disclosure.

Referring now to FIGS. 1A and 2, examples of plasma processing chambers that use movable edge rings are shown. As can be appreciated, other types of plasma processing chambers can be used. In FIG. 1A, an example of a substrate processing system 110 according to the present disclosure is shown. The substrate processing system 110 may be used to perform etching using capacitively coupled plasma (CCP). The substrate processing system 110 includes a processing chamber 122 that encloses other components of the substrate processing system 110 and contains the RF plasma (if used). The substrate processing system 110 includes an upper electrode 124 and a substrate support 126 such as an electrostatic chuck (ESC). During operation, a substrate 128 is arranged on the substrate support 126.

For example only, the upper electrode 124 may include a gas distribution device 129 such as a showerhead that introduces and distributes process gases. The gas distribution device 129 may include a stem portion including one end connected to a top surface of the processing chamber. An annular body is generally cylindrical and extends radially outwardly from an opposite end of the stem portion at a location that is spaced from the top surface of the processing chamber. A substrate-facing surface or faceplate of the annular body of the showerhead includes a plurality of holes through which precursor, reactants, etch gases, inert gases, carrier gases, other process gases or purge gas flows. Alternately, the upper electrode 124 may include a conducting plate and the process gases may be introduced in another manner.

The substrate support 126 includes a baseplate 130 that acts as a lower electrode. The baseplate 130 supports a heating plate 132, which may correspond to a ceramic multi-zone heating plate. A bonding and/or a thermal resistance layer 134 may be arranged between the heating plate 132 and the baseplate 130. The baseplate 130 may include one or more channels 136 for flowing coolant through the baseplate 130.

An RF generating system 140 generates and outputs an RF voltage to one of the upper electrode 124 and the lower electrode (e.g., the baseplate 130 of the substrate support 126). The other one of the upper electrode 124 and the baseplate 130 may be DC grounded, AC grounded or floating. For example only, the RF generating system 140 may include an RF generator 142 that generates RF plasma power that is fed by a matching and distribution network 144 to the upper electrode 124 or the baseplate 130. In other examples, the plasma may be generated inductively or remotely.

A gas delivery system 150 includes one or more gas sources 152-1, 152-2, . . . , and 152-N (collectively gas sources 152), where N is an integer greater than zero. The gas sources 152 are connected by valves 154-1, 154-2, . . . , and 154-N (collectively valves 154) and MFCs 156-1, 156-2, . . . , and 156-N (collectively MFCs 156) to a manifold 160. Secondary valves may be used between the MFCs 156 and the manifold 160. While a single gas delivery system 150 is shown, two or more gas delivery systems can be used.

A temperature controller 163 may be connected to a plurality of thermal control elements (TCEs) 164 arranged in the heating plate 132. The temperature controller 163 may be used to control the plurality of TCEs 164 to control a temperature of the substrate support 126 and the substrate 128. The temperature controller 163 may communicate with a coolant assembly 166 to control coolant flow through the channels 136. For example, the coolant assembly 166 may include a coolant pump, a reservoir and/or one or more temperature sensors. The temperature controller 163 operates the coolant assembly 166 to selectively flow the coolant through the channels 136 to cool the substrate support 126.

A valve 170 and pump 172 may be used to evacuate reactants from the processing chamber 122. A system controller 180 may be used to control components of the substrate processing system 110. An edge ring 182 may be arranged radially outside of the substrate 128 during plasma processing. An edge ring height adjustment system 184 may be used to adjust a height of a top surface of the edge ring 182 relative to the substrate 128 as will be described further below. In some examples, the edge ring 182 can also be raised, removed by a robot end effector and replaced with another edge ring without breaking vacuum.

Figure 1B:
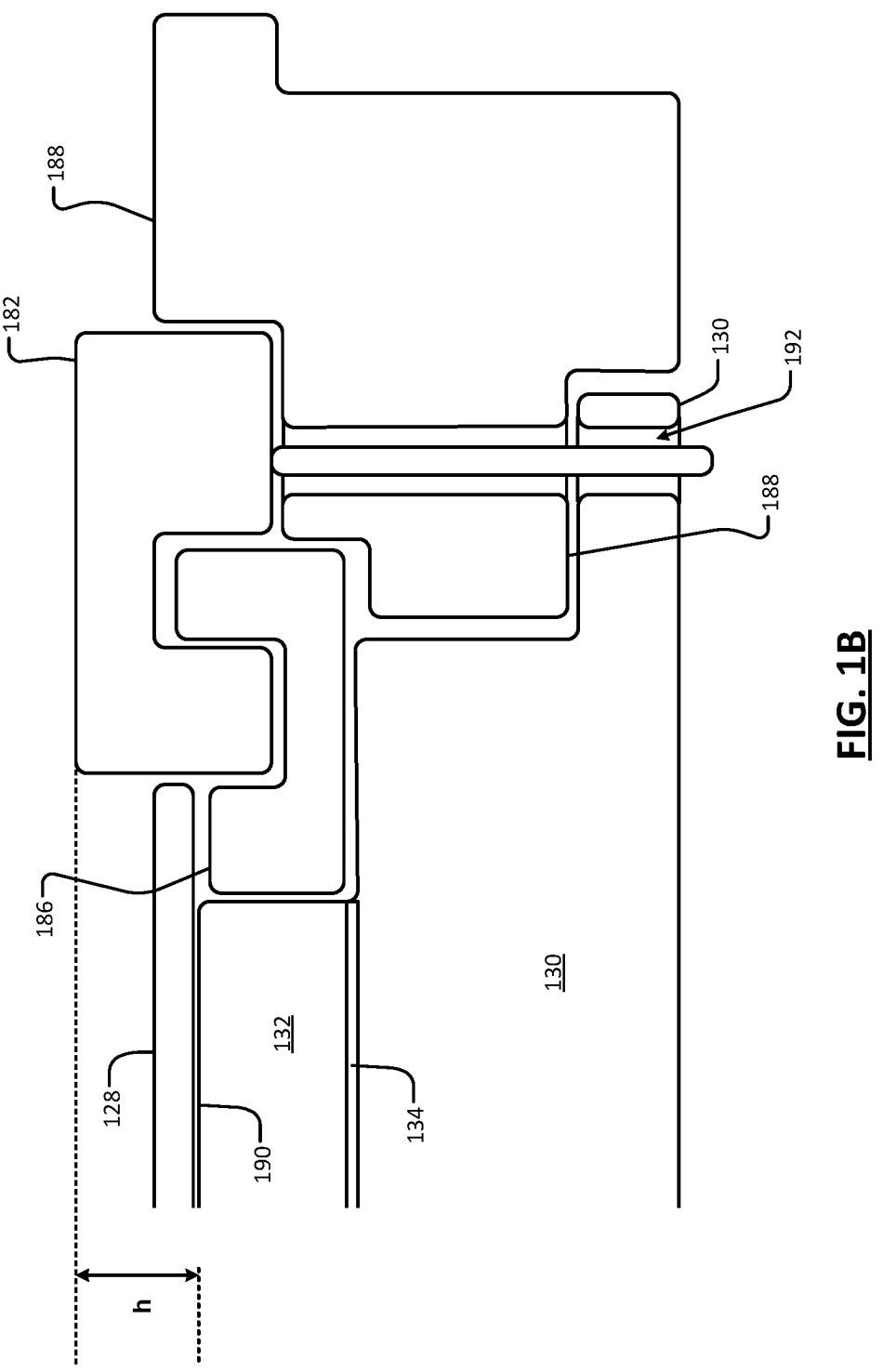
FIGS. 1B and 1C are cross-sectional views of examples of a moveable edge ring according to the present disclosure.
Figure 1C:
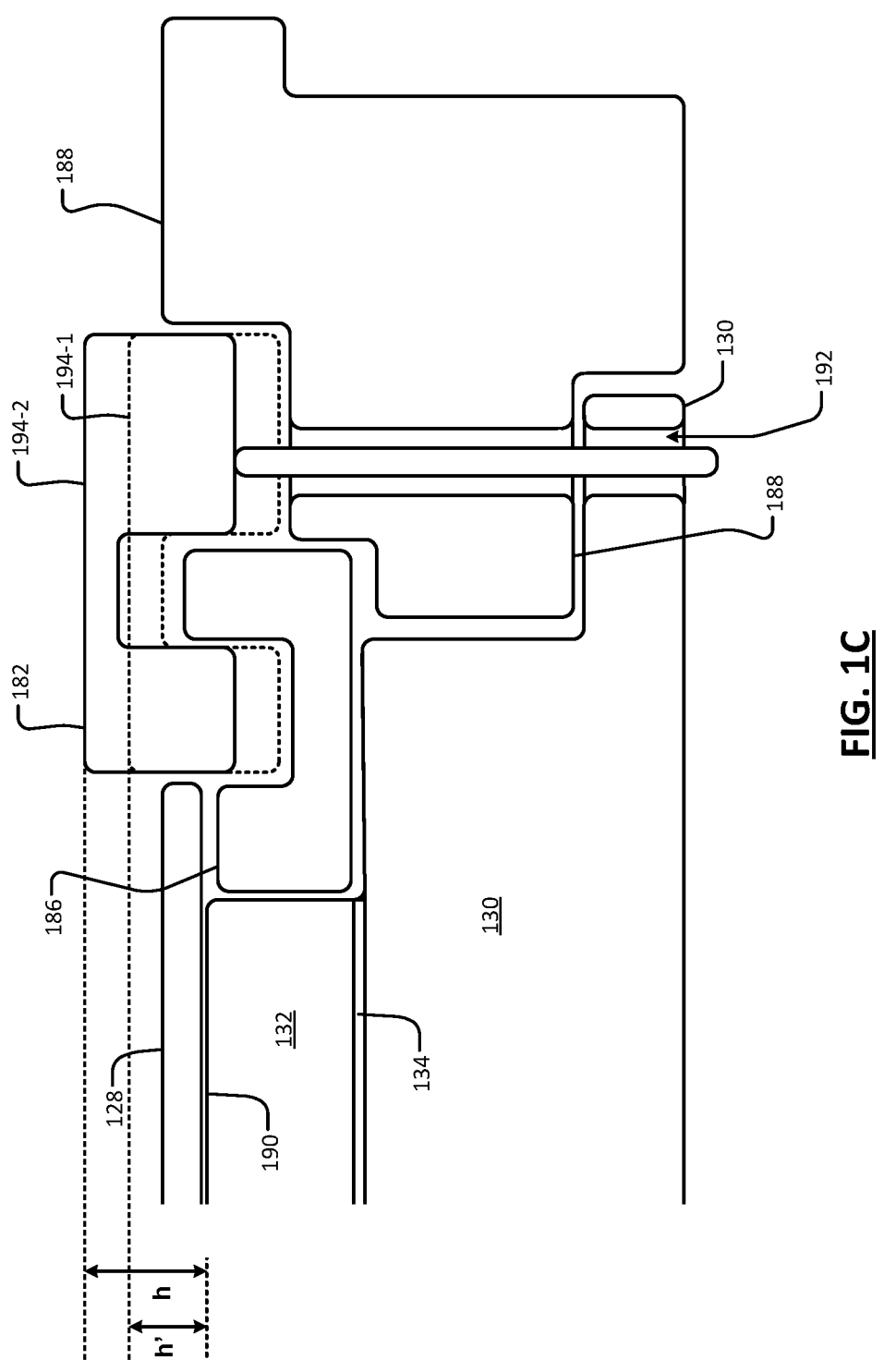

Referring now to FIGS. 1B and 1C, in some examples the substrate 128 rests on an upper surface 190 of the substrate support 126 (or ESC). In FIG. 1B, the edge ring 182 rests on a middle edge ring 186 and a bottom edge ring 188. The middle edge ring 186 and the bottom edge ring 188 are not moved. The edge ring 182 defines a height h above the upper surface 190 when the edge ring 182 is resting on the middle edge ring 186 and the bottom edge ring 188 and the edge ring 182 is not worn. One or more openings 192 may be defined in one or more of the substrate support 126, the middle edge ring 186 and/or the bottom edge ring 188 to allow a height adjuster to adjust the height of the edge ring 182 as will be described further below.

In FIG. 1C, the edge ring 182 is worn and the thickness is reduced to a height h' (h'<h). The height adjuster is used to raise the edge ring 182 to restore the height relationship h between a top surface of the edge ring 182 and the upper surface 190. When the edge ring 182 is sufficiently worn, the edge ring 182 can be replaced with a new edge ring.

In FIG. 2, an example of a substrate processing system 210 according to the present disclosure is shown. The substrate processing system 210 uses inductively coupled plasma to perform etching. The substrate processing system 210 includes a coil driving circuit 211. A pulsing circuit 214 may be used to pulse the RF power on and off or vary an amplitude or level of the RF power. The tuning circuit 213 may be directly connected to one or more inductive coils 216. The tuning circuit 213 tunes an output of the RF source 212 to a desired frequency and/or a desired phase, matches an impedance of the coils 216 and splits power between the coils 216. In some examples, the coil driving circuit 211 is replaced by one of the drive circuits described further below in conjunction with controlling the RF bias.

In some examples, a plenum 220 may be arranged between the coils 216 and a dielectric window 224 to control the temperature of the dielectric window 224 with hot and/or cold air flow. The dielectric window 224 is arranged along one side of a processing chamber 228. The processing chamber 228 further comprises a substrate support (or pedestal) 232. The substrate support 232 may include an electrostatic chuck (ESC), or a mechanical chuck or other type of chuck. Process gas is supplied to the processing chamber 228 and plasma 240 is generated inside of the processing chamber 228. The plasma 240 etches an exposed surface of the substrate 234. A drive circuit 252 (such as one of those described below) may be used to provide an RF bias to an electrode in the substrate support 232 during operation.

A gas delivery system 256 may be used to supply a process gas mixture to the processing chamber 228. The gas delivery system 256 may include process and inert gas sources 257, a gas metering system 258 such as valves and mass flow controllers, and a manifold 259. A gas delivery system 260 may be used to deliver gas 262 via a valve 261 to the plenum 220. The gas may include cooling gas (air) that is used to cool the coils 216 and the dielectric window 224. A heater/cooler 264 may be used to heat/cool the substrate support 232 to a predetermined temperature. An exhaust system 265 includes a valve 266 and pump 267 to remove reactants from the processing chamber 228 by purging or evacuation.

A controller 254 may be used to control the etching process. The controller 254 monitors system parameters and controls delivery of the gas mixture, striking, maintaining and extinguishing the plasma, removal of reactants, supply of cooling gas, and so on. Additionally, as described below in detail, the controller 254 may control various aspects of the coil driving circuit 211 and the drive circuit 252. An edge ring 282 may be located radially outside of the substrate 234 during plasma processing. A height adjustment system 284 may be used to adjust a height of a top surface of the edge ring 282. In addition, the edge ring 282 may optionally be removed when worn and replaced with a new edge ring without breaking vacuum. The controller 254 may be used to control the height adjustment system 284.

During processing, plasma is struck in the processing chamber. In some examples, an RF bias is output to the substrate support. To maintain control of a sheath of the plasma at low bias frequencies, a capacitance $C_D$ of delivery components (such as top, middle and bottom edge rings) to the substrate support needs to be maintained as a height of the top edge ring is adjusted due to wear. In the examples that follow, the edge rings are made of conductive material or a dielectric material with an embedded electrode. As will be described further below, areas providing capacitive coupling are designed to minimize changes in capacitive coupling as the top edge ring is moved.

Figures 3A, 3B:
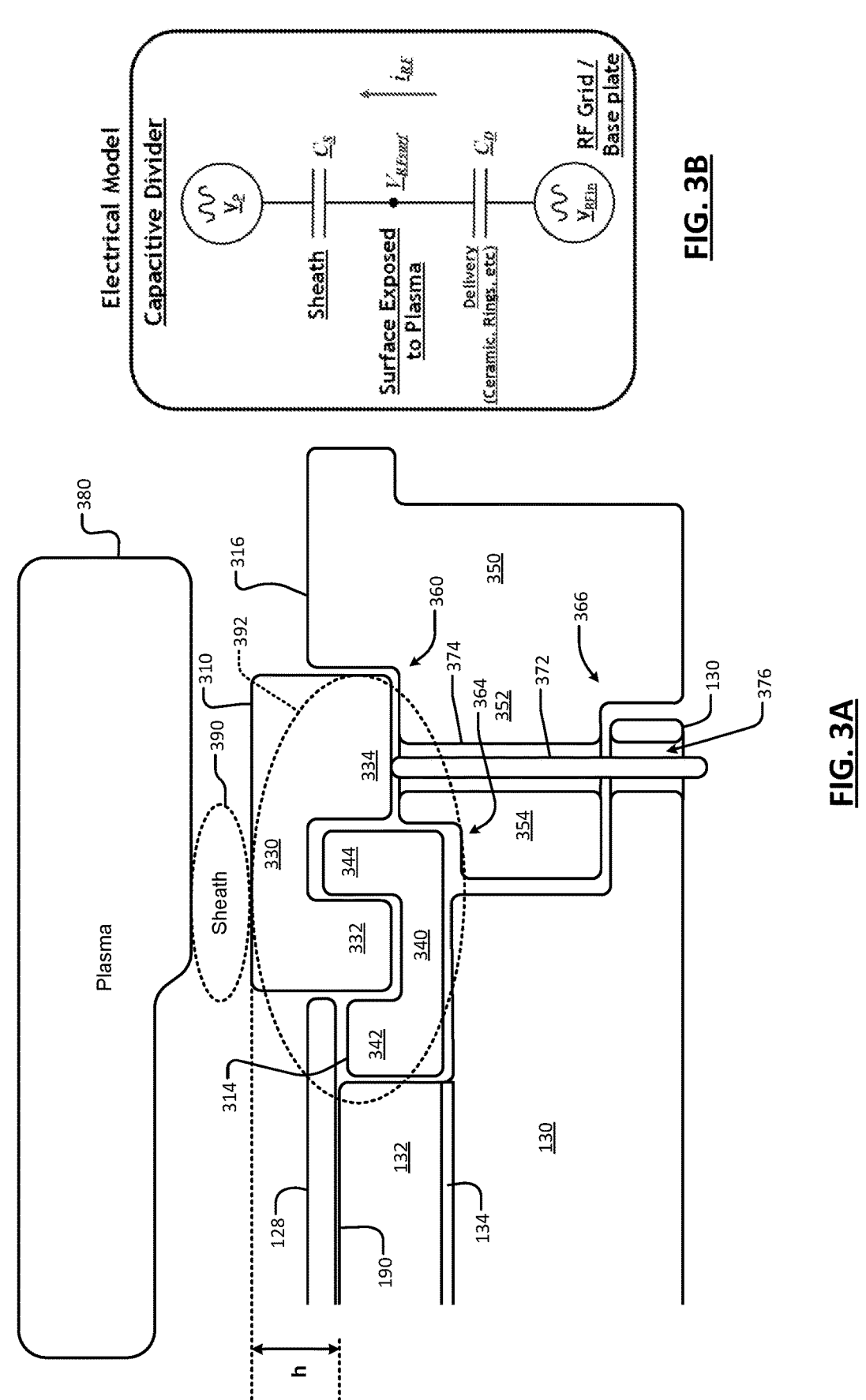
FIG. 3A is a cross-sectional side view of an example of a moveable edge ring according to the present disclosure.
FIG. 3B is an electrical schematic modelling the moveable edge ring in FIG. 3A.

Referring now to FIG. 3A, an edge ring system for a substrate support includes a top edge ring 310, a middle edge ring 314 and a bottom edge ring 316. The top edge ring 310 has an inverted "U"-shape and includes an annular body 330 connected to a radially inner leg 332 and a radially outer leg 334. The middle edge ring 314 has a "U"-shape and includes an annular body 340 connected to a radially inner leg 342 and a radially outer leg 344. The radially inner leg 332 of the top edge ring 310 is located between the radially inner leg 342 and the radially outer leg 344 of the middle edge ring 314.

The bottom edge ring 316 includes a radially outer portion 350, a middle portion 352 and a radially inner portion 354. An annular recessed portion 360 is arranged on an upper and radially inner surface of the bottom edge ring 316 between the radially outer portion 350 and the middle portion 352. An annular recessed portion 364 is arranged on an upper and radially inner surface of the bottom edge ring 316 between the radially inner portion 354 and the middle portion 352. The bottom edge ring 316 includes an elongate vertical bore 374 configured to receive a lift pin 372 that is used to raise and lower the top edge ring 310. Likewise, the baseplate 130 may include an elongate vertical bore 376 that is configured to receive the lift pin 372 and that is aligned with the elongate vertical bore 370. While a single lift pin is shown, N lift pins may be used where N is an integer greater than 2. In some examples, the N lift pins are spaced apart by an angle equal to 360°/N.

During operation, plasma 380 is generated. A sheath 390 forms between the plasma 380 and delivery components 392 (including the top edge ring 310, the middle edge ring 314 and/or the bottom edge ring 316).

Referring now to FIG. 3B, an electrical model of the plasma, the sheath and the delivery components 392 is shown. The sheath 390 has a sheath capacitance $C_S$ and delivery components 392 have a delivery capacitance $C_D$. If the capacitance of the delivery components 392 varies in response to component wear or the adjustment of the height of the edge ring, the process will be less uniform and performance variations and/or defects may occur.

Figures 4, 5A, 5B:
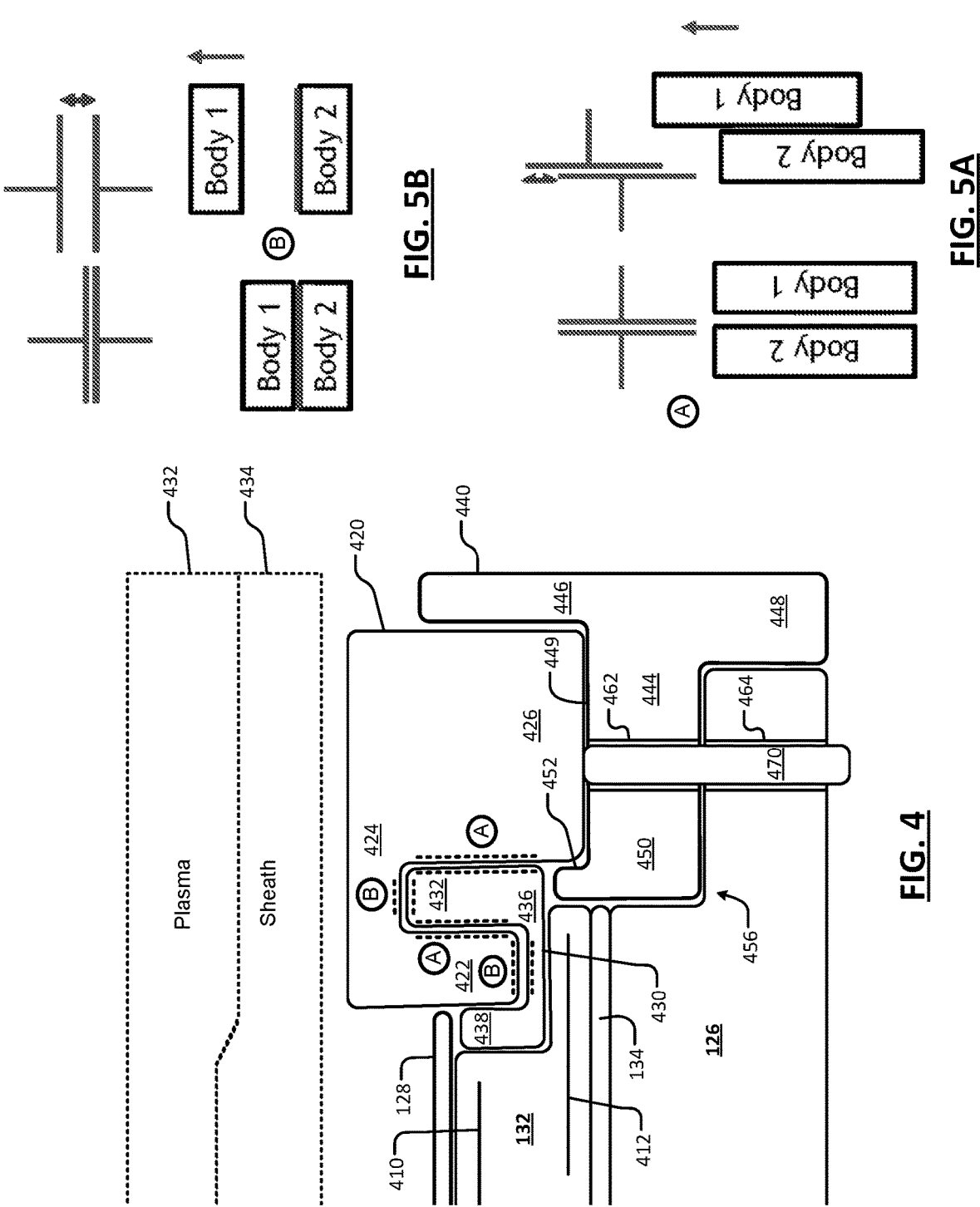
FIG. 4 is a cross-sectional side view of another example of a moveable edge ring according to the present disclosure.
FIGS. 5A and 5B are illustrations showing movement of different surfaces of the moveable edge ring relative to adjacent structures.

Referring now to FIG. 4, various parameters can be adjusted to vary the capacitance of the delivery components. In FIG. 4, a top edge ring 420 has an inverted "U"-shape and includes a radially inner leg 422 connected by an annular body 424 to a radially outer leg 426. A middle edge ring 430 has a "U"-shape and includes a radially outer leg 432 connected by an annular body 436 to a radially inner leg 438. The radially inner leg 422 of the top edge ring 420 is arranged between the radially inner leg 438 and the radially outer leg 432 of the middle edge ring 430. Electrostatic electrodes 410 and RF electrodes 412 of the baseplate 130 are shown.

A bottom edge ring 440 includes a middle portion 444, an upper portion 446 that projects upwardly from the middle portion 444 adjacent to a radially outer edge of the bottom edge ring 440 and a lower portion 448 that projects downwardly from the middle portion 444 adjacent to the radially outer edge of the bottom edge ring 440. The bottom edge ring 440 includes a radially inner portion 450 with an upward projection 452 on an upper, radially inner surface thereof. The baseplate 130 includes a stepped portion 456 that receives the radially inner portion 450 of the bottom edge ring 440. Cavities 462 and 464 in the bottom edge ring 440 and the baseplate 130, respectively, reciprocally receive a lift pin 470.

In some examples, the top edge ring 420 and the middle edge ring 430 are made of conductive material and the bottom edge ring 440 is made of non-conductive material such as dielectric. In some examples, the lift pin 470 is made of conductive or non-conductive material such as dielectric.

Referring now to FIGS. 5A and 5B, the coupling capacitance between two conducting surfaces decreases significantly as the gap between the facing surfaces increases. As the edge ring is raised, facing surfaces in A areas generally maintain the same gap $D_A$. In contrast, the gap $D_B$ of facing surfaces in B areas increases proportionately as the edge ring is raised. The coupling capacitance of facing conductive surfaces will be affected by both the A areas and the B areas. The A areas will have a stable coupling capacitance as the edge ring is moved and the B areas will have a decreasing coupling capacitance as the edge ring is moved.

According to the present disclosure, the coupling capacitance in the A areas is maximized since it is relatively constant while the coupling capacitance in the B areas is minimized since it is changing. In some examples, the gap $D_A$ for the A areas is set to a minimum value and the gap $D_B$ for the B areas is set to $k*D_A$, where k is a number greater than or equal to 2. In some examples, k is equal to 3. In some examples, the gaps are set to a gap less than or equal to 0.006" or 6 mils for areas where coupling is desired and greater than or equal to 0.012" or 12 mils is areas where coupling is not desired. In some examples, the gaps are set to a gap less than or equal to 0.006" or 6 mils for areas where coupling is desired and greater than or equal to 0.018" or 18 mils is areas where coupling is not desired.

In FIGS. 5A and 5B, facing surfaces of the edge ring bodies are shown during movement. In the A areas, facing surfaces of the edge rings slide adjacent to one another without significantly changing the gap $D_A$ therebetween. In the B areas, facing surfaces of the edge rings slide apart and increase the gap $D_B$ therebetween.

In some examples, the gap $D_A$ is set based on a minimum gap ($d_{min}$) between facing surfaces in the A areas. The minimum gap $d_{min}$ is determined based on tolerances of the delivery components and/or thermal expansion for a given process temperature range. The gap $D_A$ is set equal to a minimum gap $d_{min}$ in the A areas where the capacitance needs to be constant. In other areas where the capacitance is to be minimized (since the gap between facing surfaces increases), the gap $D_B$ is set greater than or equal to $k*d_{min}$ (where k is a number greater than or equal to 2). In other examples, k is greater than or equal to 3. As a result, the capacitance due to the A areas dominates the delivery capacitance while the capacitance due to the B areas has a significantly reduced impact on the delivery capacitance.

Figure 6A:
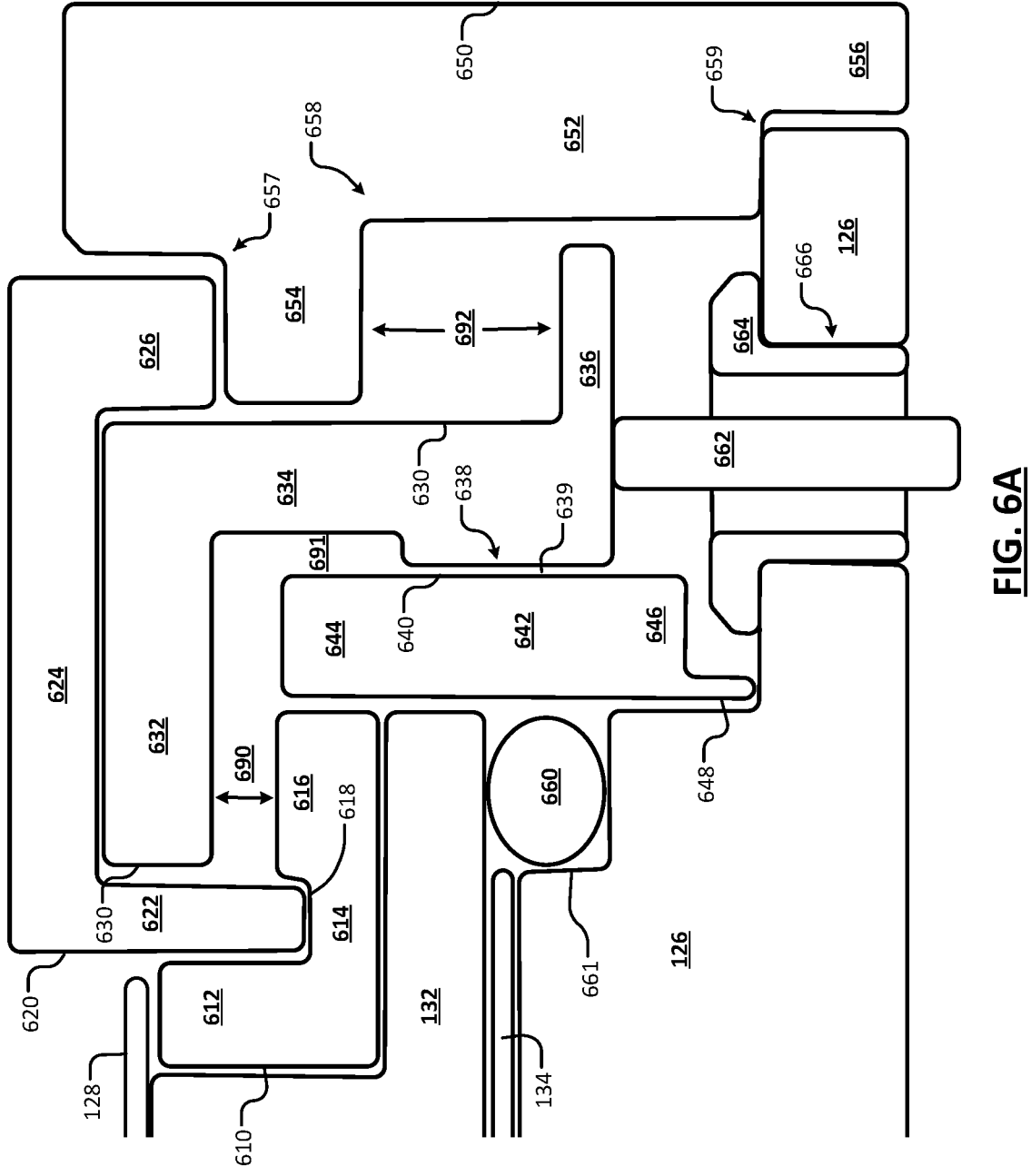
FIGS. 6A to 6D are cross-sectional side views of another example of a moveable edge ring according to the present disclosure.
Figure 6B:
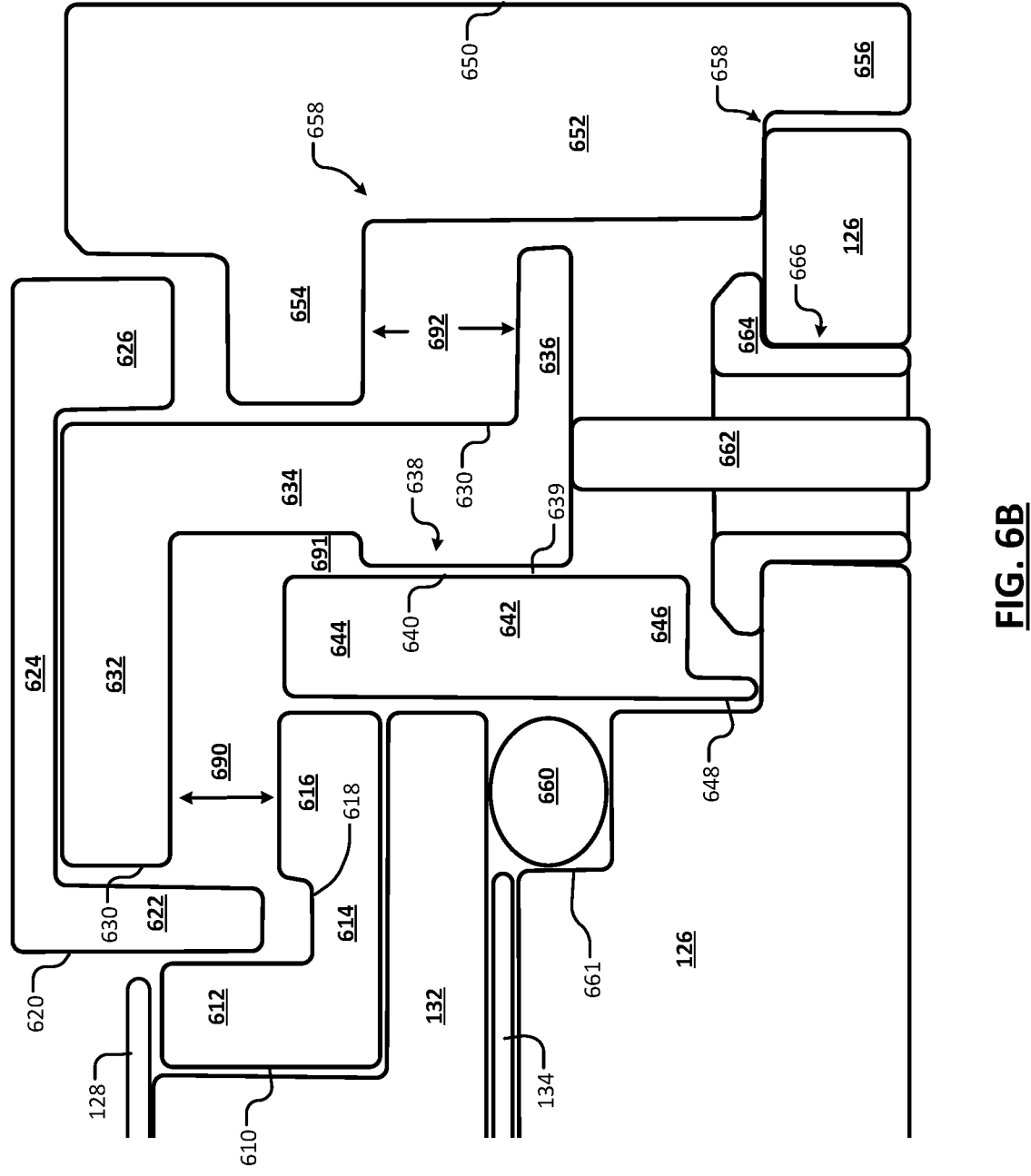

Referring now to FIGS. 6A and 6B, an edge ring 610 has a "U"-shape and includes an inner leg 612 connected by an annular body 614 to an outer leg 616. A recessed portion 618 is located between the inner leg 612 and the outer leg 616. A top edge ring 620 has an inverted "U"-shape and includes an inner leg 622 that is connected by an annular body 624 to an outer leg 626.

An edge ring 630 includes a radially inwardly projecting upper portion 632 connected by a middle portion 634 to a radially outwardly projecting portion 636. In some examples, the edge ring 630 has a "Z"-shaped cross-section. A projecting surface 638 extends radially inwardly from a middle region of the middle portion 634 down (towards a facing surface 639 of an edge ring 640) to a lower edge of the edge ring 630.

An edge ring 640 is located radially inwardly from the edge ring 630 and below the upper portion 632 of the edge ring 630. The edge ring 640 includes a body 642 having a generally rectangular cross-section, an upper portion 644, a lower portion 646 and a projecting portion 648 that projects downwardly from a lower, radially-inner surface of the edge ring 640. An outer edge ring 650 includes a body 652, a radially inwardly projecting portion 654 that projects radially inwardly adjacent to an upper surface of the body 652 and a downwardly projecting portion 656 that projects downwardly from a radially outer surface of the outer edge ring 650. Annular recesses 658 and 659 provide clearance for the radially outwardly projecting portion 636 and the baseplate 130, respectively.

An annular seal 660 is arranged in an annular slot 661 defined between the baseplate 130, the heating layer 132 and the edge ring 640 to protect the bonding and/or a thermal resistance layer 134 arranged between the heating layer 132 and the baseplate 130. A lift pin 662 passes through a guide sleeve 664 that is arranged in a vertical bore 666 in the baseplate 130.

The top edge ring 620 rests on the edge ring 630. The inner leg 622 of the top edge ring 620 is located between the inner leg 612 of the edge ring 610 and the radially inwardly projecting upper portion 632 of the edge ring 630. The edge ring 610 rests on a stepped surface of the heating layer 132. The edge ring 640 lies radially outside of the heating layer 132 and the edge ring 610. The body 652 of the outer edge ring 650 lies radially outside of the edge ring 630. The inwardly projecting portion 654 of the outer edge ring 650 is arranged between the outer leg 626 of the top edge ring 620 and the radially outwardly projecting portion 636 of the edge ring 630. A vertical gap 690 is defined between the edge ring 630 and the edge ring 610. A horizontal gap 691 is defined between upper portions of the edge rings 630 and 640. A vertical gap is defined between the edge ring 630 and the outer edge ring 650.

In FIG. 6B, as the top edge ring 620 is worn, the lift pin 662 moves upwardly to bias the edge ring 630 upwardly to compensate the top edge ring 620 for wear due to exposure to plasma and/or other process gas mixtures. As can be seen, the projecting portion 638 is arranged within the gap $D_A$ of the edge ring 640. Likewise, a top surface of the edge ring 630 is arranged within the gap $D_A$ of a bottom surface of the annular body. The minimum gap between lower portions of the edge rings 630 and 640 is maintained for consistent capacitive coupling. Other gaps that increase start with a larger gap two times the minimum gap) and then increase to reduce the impact on the capacitive coupling. Gaps that decrease start and remain larger than two times the minimum gap to reduce the impact on the capacitive coupling.

Figure 6C:
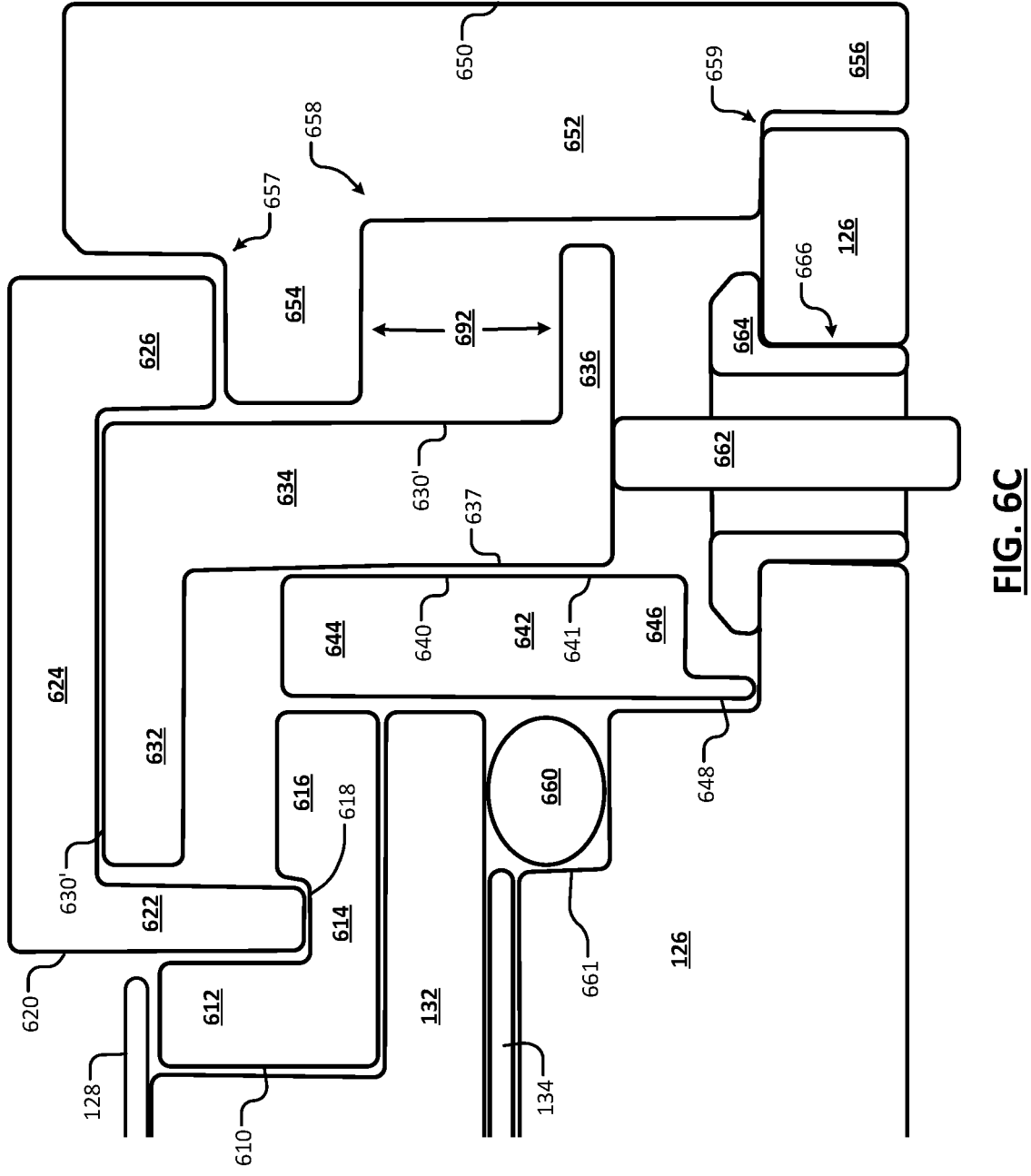

Referring now to FIG. 6C, example variations of the edge ring 630 are shown. The upper portion 632 of the edge ring 630' extends downwardly adjacent to an upper surface of the outer leg 616 of the edge ring 610 and adjacent to an upper surface of the upper portion 644 of the edge ring 640. An inner surface 637 of the edge ring 630 extends parallel to (and within a predetermined fixed distance of) a radially outer surface 641 of the edge ring 630. In some examples, the base height (e.g. a top surface of the top edge ring to a top surface of the heating layer 132) is in a range from 1 mm to 6 mm. In some examples, the base height is 4 mm. In some examples, a gap between a bottom surface of the upper portion 632 of the edge ring 630' is in a range from 0.1 mm to 1 mm. In some examples, a gap between a bottom surface of the upper portion 632 of the edge ring 630' is in a range from 0.1 mm or 0.5 mm. Increasing gaps reduces coupling therebetween and vice versa.

In some examples, the top edge ring 620 is made of quartz, the edge ring 630' is made of silicon or silicon carbide the edge ring 610 is made of quartz and the edge ring 640 is made of silicon or silicon carbide, although other materials can be used.

Figure 6D:
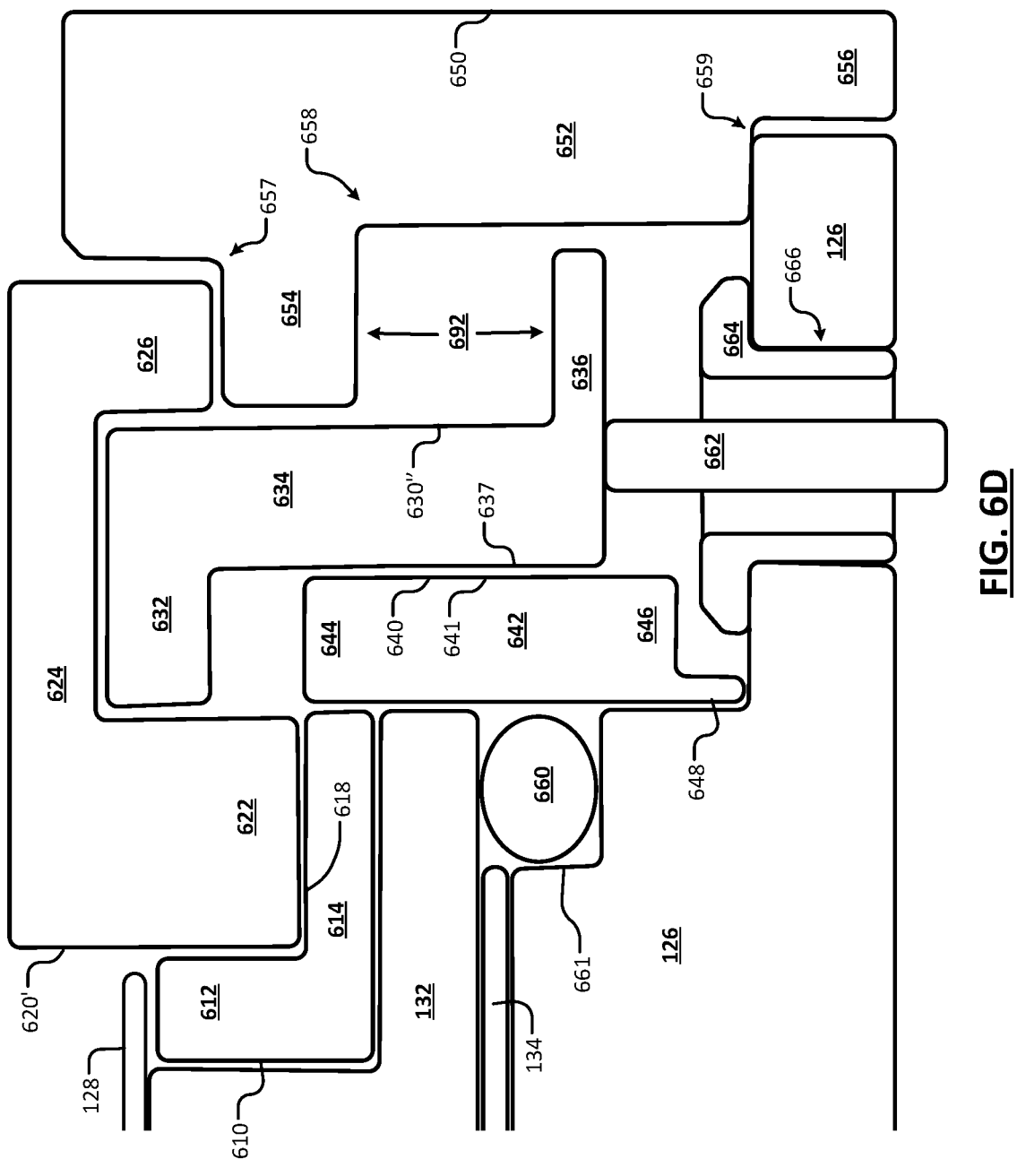

Referring now to FIG. 6D, other variations of an edge ring 630" and a top edge ring 620' are shown. The upper portion 632 of the edge ring 630' extends less radially inward relative to the edge rings 630 and 630' shown above. The inner leg 622 of the top edge ring 620' is wider in a radial direction (and extends further radially outwardly).

In some examples, the top edge ring 620 is made of quartz, the edge ring 630" is made of silicon or silicon carbide, the edge ring 610 is made of quartz and the edge ring 640 is made of silicon or silicon carbide, although other materials can be used.

Figures 7A, 7B:
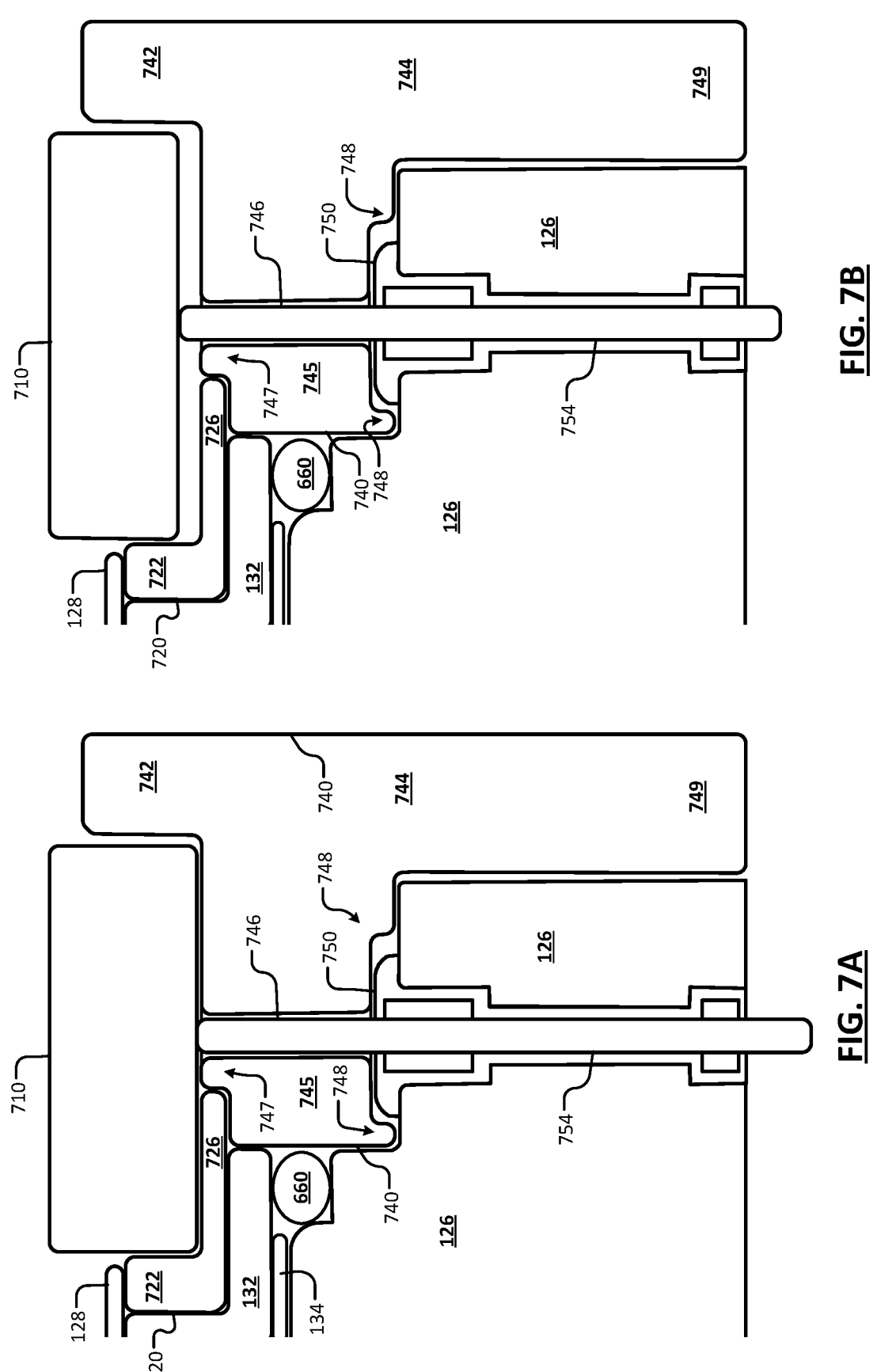
FIGS. 7A to 7B are cross-sectional side views of another example of a moveable edge ring according to the present disclosure.

Referring now to FIGS. 7A and 7B, a top edge ring 710 has a rectangular cross-section. A middle edge ring 720 is "L"-shaped and includes a vertical leg 722 connected to a radially outwardly projecting leg 726. A bottom edge ring 740 includes an annular body 744, an upwardly projecting portion 742, a downwardly projecting portion 749, and an inwardly projecting portion 745.

A vertical bore 746 passes through the inwardly projecting portion 745 to allow a lift pin 754 to pass reciprocally and move the top edge ring 710. The inwardly projecting portion 745 includes an upwardly projecting portion 747 located adjacent to the pin 754 to define an annular recess to receive the outwardly projecting leg 726. The inwardly projecting portion 745 also includes a downwardly projecting portion 748 located near the radially inner surface of the bottom edge ring 740. A guide sleeve 750 is located in an annular recess defined by the downwardly projecting portion 748.

In some examples, the top edge ring 710 and the lift pin 754 are made of conductive material. The middle edge ring 720 and the bottom edge ring 740 are non-conductive and made of dielectric material. Capacitive coupling is maintained through the lift pin 754, which is conductive and in contact with the top edge ring 710, as the top edge ring 710 is raised in FIG. 7B.

Figure 8A:
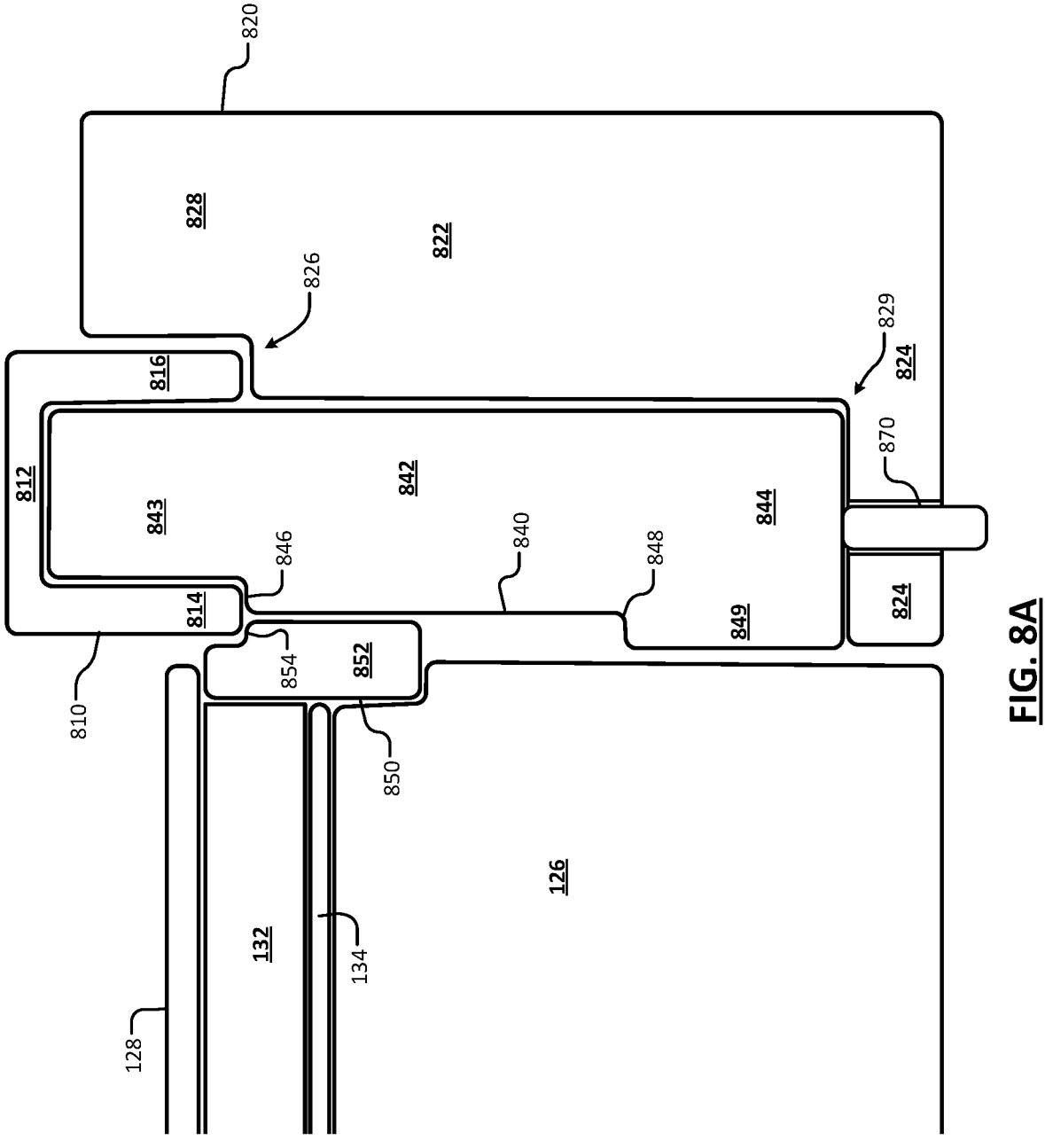
FIGS. 8A to 8C are cross-sectional side views of another example of a moveable edge ring according to the present disclosure.
Figure 8B:
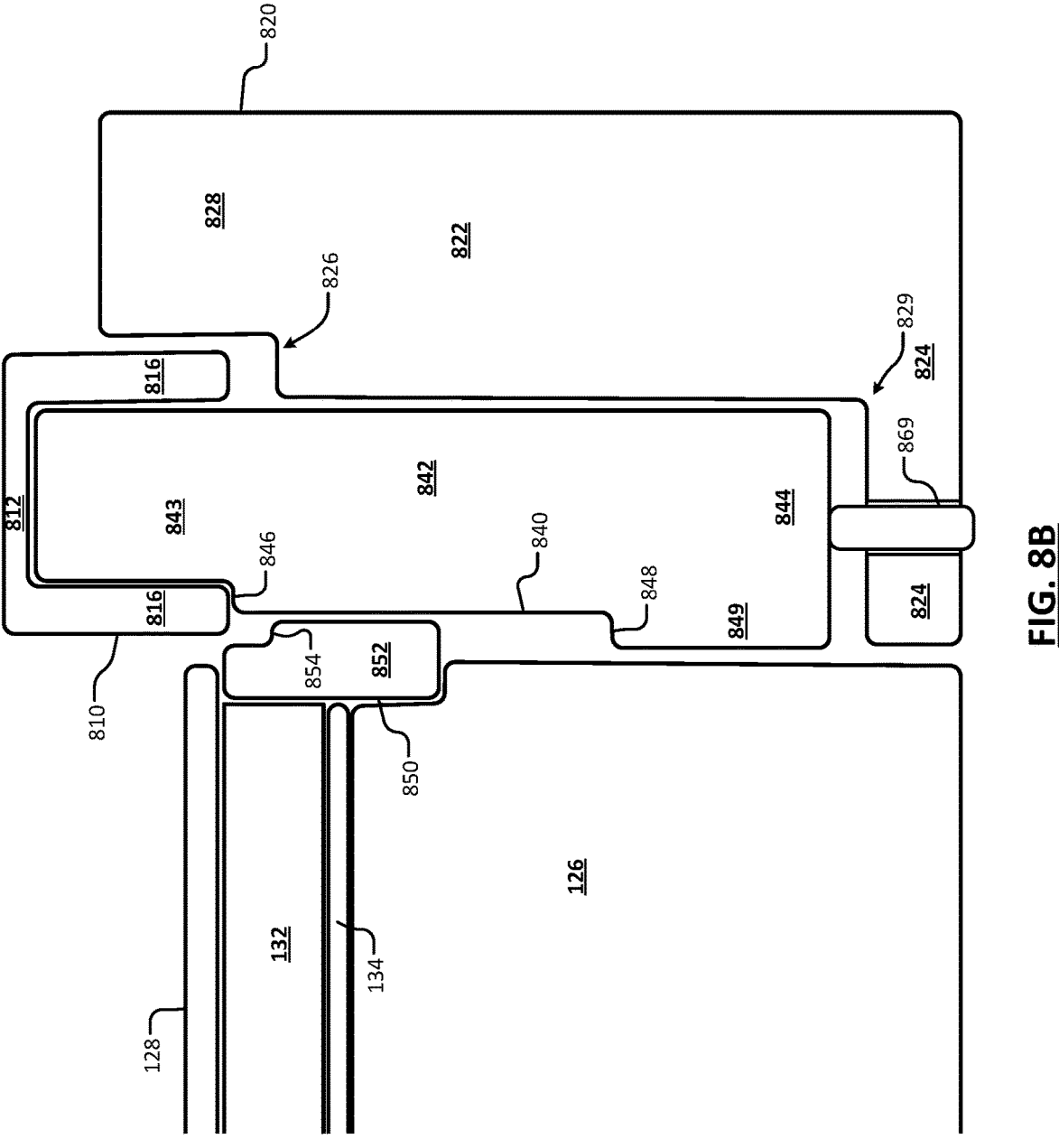

Referring now to FIGS. 8A and 8B, a top edge ring 810 has an inverted "U"-shape and includes an annular body 812 connected to an inner leg 814 and an outer leg 816. An outer edge ring 820 includes a middle portion 822, a lower portion 824 and an upper portion 828. The middle portion 822 projects radially inwardly below the upper portion 828 to form an annular recess 826 or step to receive the outer leg 816 of the top edge ring 810 when the top edge ring 810 is lowered. The lower portion 824 projects radially inwardly towards the baseplate 130 to form a step 829.

An edge ring 840 is located below the top edge ring 810 between the outer edge ring 820 and the baseplate 130. The edge ring 840 includes a middle portion 842, an upper portion 843 and a lower portion 844. The edge ring 840 extends radially inwardly to form an annular recess 846 or step between the middle portion 842 and the upper portion 843. The edge ring 840 extends radially inwardly to form an annular recess 848 or step between the middle portion 842 and the lower portion 844. The edge ring 840 includes a lower surface 849 that is located within the gap $D_A$ of a facing surface of the baseplate 130. Other surfaces of the edge ring 840 that face the baseplate 130 and vary with movement (as shown in FIG. 8B) are located with the gap $D_B$ of the facing surface of the baseplate 130.

An edge ring 850 includes a body portion 852 having a generally rectangular cross-section. An annular recess or step 854 is located at an upper and radially outer portion of the body portion 852. The inner leg of the top edge ring 810 is located in the annular recesses 846 and 854.

In some examples, the top edge ring 810 is made of conductive or dielectric material, the edge ring 850 and the outer edge ring 820 are made of dielectric material, and the edge ring 840 is made of conductive material. While the lift pin 870 is shown passing through a vertical bore in the edge ring 820, the baseplate 130 can extend radially outwardly further and the lift pin can pass through the baseplate 130 instead of the edge ring 820. In some examples, radially inwardly facing surfaces of the lower portion 844 and the middle portion 842 are parallel to radially outwardly facing surface of the baseplate 130.

A first surface area of the lower portion 844 of the edge ring 840 that is in close proximity to (and facing) the baseplate 130 remains the same as the top edge ring 810 and the edge ring 840 are raised and lowered. A second surface area of the middle portion 842 of the edge ring 840 that is located further away from the baseplate 130 decreases as the edge ring is raised (since the edge ring 850 is located therebetween).

Figure 8C:
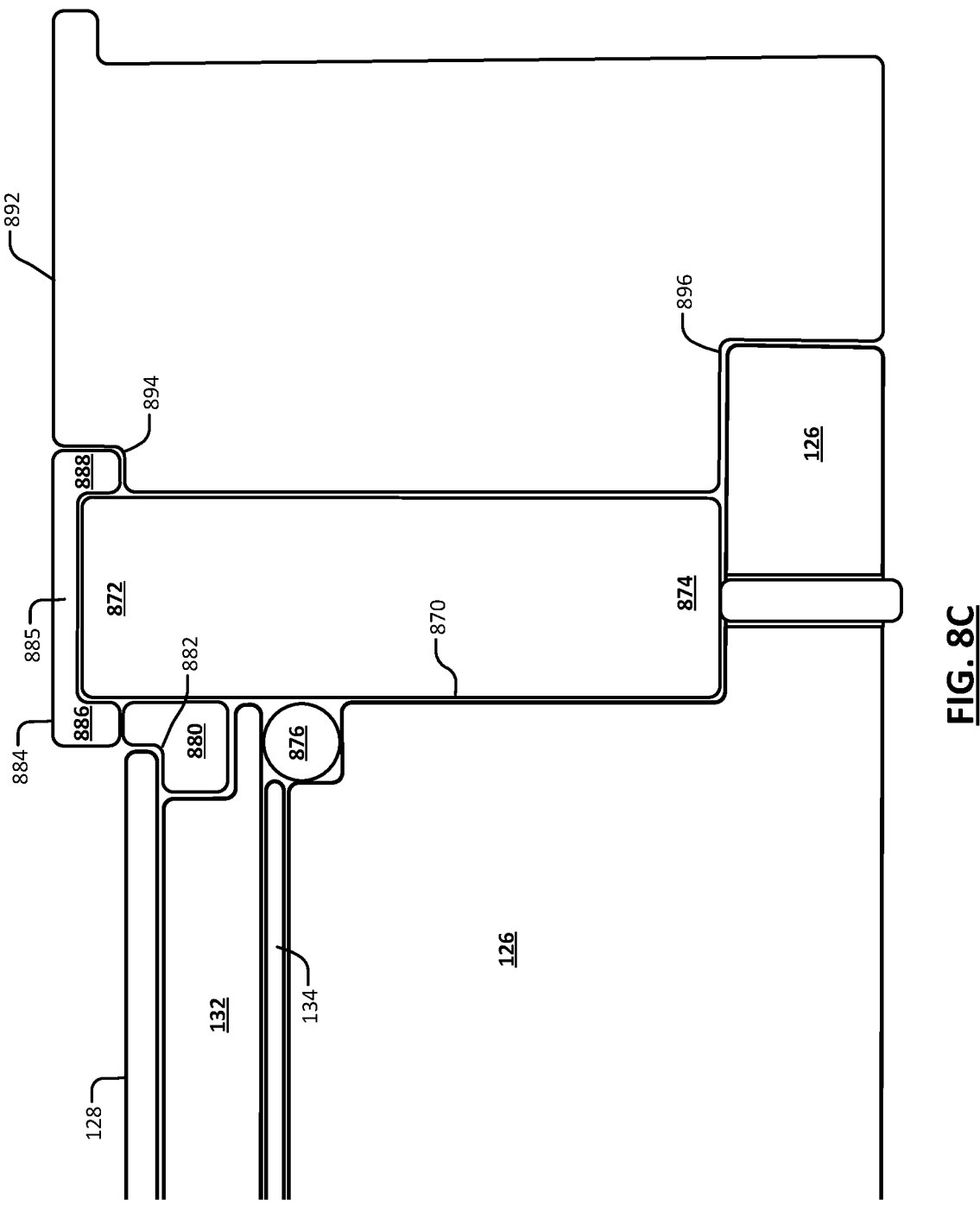

Referring now to FIG. 8C, an edge ring 870 has a generally rectangular cross-section, an upper portion 872 and a lower portion 874. An annular seal 876 is arranged around an upper surface of the baseplate 130 radially outside of the bonding and/or thermal resistance layer 134 below the heating plate 132. An edge ring 880 has an "L"-shaped cross-section and is located between the edge ring 870 and the heating plate 132. An annular recess 882 or step is arranged on an upper, radially inner surface of the edge ring 880.

A top edge ring 884 has an inverted "U"-shape, an annular body 885, a radially inner leg 886 and a radially outer leg 888. An outer edge ring 892 has a generally rectangular cross-section and is arranged radially outside of the edge rings 870 and 884. The outer edge ring 892 has a generally rectangular cross-section, a radially-inner and upper annular recess 894 or step to receive the radially outer leg 888, and a radially-inner and lower annular recess 896 or step to receive a lower, radially outer portion of the baseplate 130.

Figure 9A:
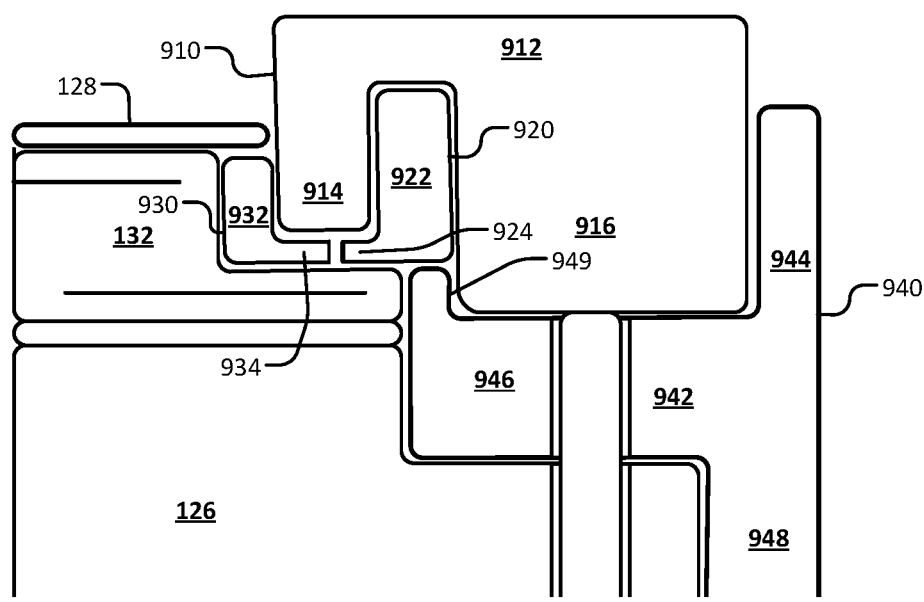
Figure 9B:
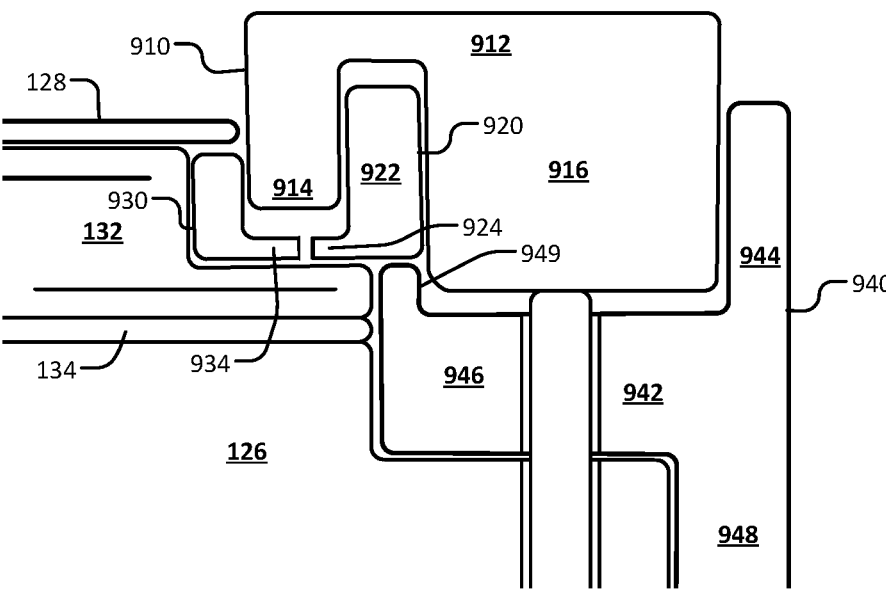

Referring now to FIGS. 9A and 9B, a top edge ring 910 has an inverted "U"-shape and includes an annular body 912, an inner leg 914 and an outer leg 916. In some examples, the outer leg 916 is P times thicker in a radial direction than the inner leg 914 where P is greater than or equal to 2 and less than or equal to 5. An edge ring 920 is generally "L"-shaped and includes an upwardly-directed leg 922 and a radially-inwardly directed leg 924. An edge ring 930 is generally "L"-shaped and includes an upwardly-directed leg 932 and a radially outwardly directed leg 934 having a radially outer portion lying adjacent to a radially inner portion of the radially-inward directed leg 924 of the edge ring 920.

A bottom edge ring 940 includes a middle portion 942. An upwardly-directed portion 944 extends from a radially-outer, upper surface of the bottom edge ring 940. A downwardly-directed portion 948 extends from a radially-outer lower surface of the bottom edge ring 940. A radially inner portion 946 of the bottom edge ring extends radially inwardly beneath the outer leg 916 of the top edge ring 910 and a portion of the edge ring 920. An upwardly-directed projection 949 extends upwardly from a radially inner surface of the radially inner portion 946 by a predetermined distance.

In some examples, the edge ring 920 and the top edge ring 910 are made of conductive material. In some examples, the edge rings 930 and 940 are made of dielectric material.

The outer leg 916 of the top edge ring 910 extends a predetermined distance lower than a lowermost surface of the edge ring 920 when the top edge ring is fully lowered. As a result, facing surfaces of the top edge rings 910 and the edge ring 920 stay relatively the same as the top edge ring 910 is lifted. In some examples, the predetermined distance is greater than or equal to the maximum increase in height of the top edge ring 910 due to wear.

Referring now to FIG. 9C, a top edge ring 950 has an inverted "U"-shape and includes an annular body 954, a radially inner leg 952 and a radially outer leg 956. In some examples, the radially outer leg 956 is P times thicker in a radial direction than the radially inner leg 952. The top edge ring 950 includes a radial recess 957 located on a downwardly facing surface of the radially outer leg 956. Additional radial recesses 957 are provided for each of the lift pins. In some examples, three lift pins are arranged around the edge ring and spaced at 120° interval. The radial recess 957 includes an angled lower surface 958 that slopes at an acute angle downwardly and radially outwardly. The radial recess 957 and the angled lower surface 958 are biased by the lift pin and help to center the top edge ring 950 relative to the baseplate 130 and the substrate 128.

In FIGS. 9C1 and 9C2, additional views of the radial recess are shown. In FIG. 9C1, a bottom view of a portion of the edge ring is shown. In FIG. 9C2, a cross-sectional view taken along 9C2-9C2 in FIG. 9C1 is shown. In some examples, surfaces 990 and 992 have a radius. In some examples, the angle Θ is in a range from 75° to 105° (e.g.) 90°).

An edge ring 960 is generally "U"-shaped and includes an annular body 966, a radially inner leg 962 and a radially outer leg 964. The radially inner leg 952 of the top edge ring 950 is located between the radially inner leg 962 and the radially outer leg 964 of the edge ring 960.

An edge ring 970 includes an annular recess 974 located on a radially inner and upper surface thereof. A radially inner portion 972 of the edge ring 970 is arranged adjacent to the baseplate 130 and the heating plate 132. The lift pin passes through a vertical bore in the radially inner portion 972 of the edge ring 970. The radially inner portion 972 of the edge ring 970 includes an annular recess 973 on a radially inner and upper surface thereof to provide clearance and/or support for a lower portion of the radially outer leg 964 of the edge ring 960. The radially inner portion 972 of the edge ring 970 further includes a projection 975 that extends downwardly from a lower and radially inner surface thereof.

In some examples, the baseplate 130 includes a conforming seal 971 that follows a stepped, or lower, radially outer surface of the baseplate 130. In some examples, the conforming seal 971 is made of a material such as ceramic and reduces arcing. A lower surface of the edge ring 970 includes a first annular recess 976 or step to accommodate the lift pin and a second annular recess 978 to accommodate the baseplate 130.

In some examples, the base height is 3.5 mm. In some examples, the edge rings 950 and 980 are made of conductive material such as silicon or silicon carbide, although other materials can be used. In other examples, the edge rings 970 and 986 are made of quartz although other materials can be used.

Figure 9D:
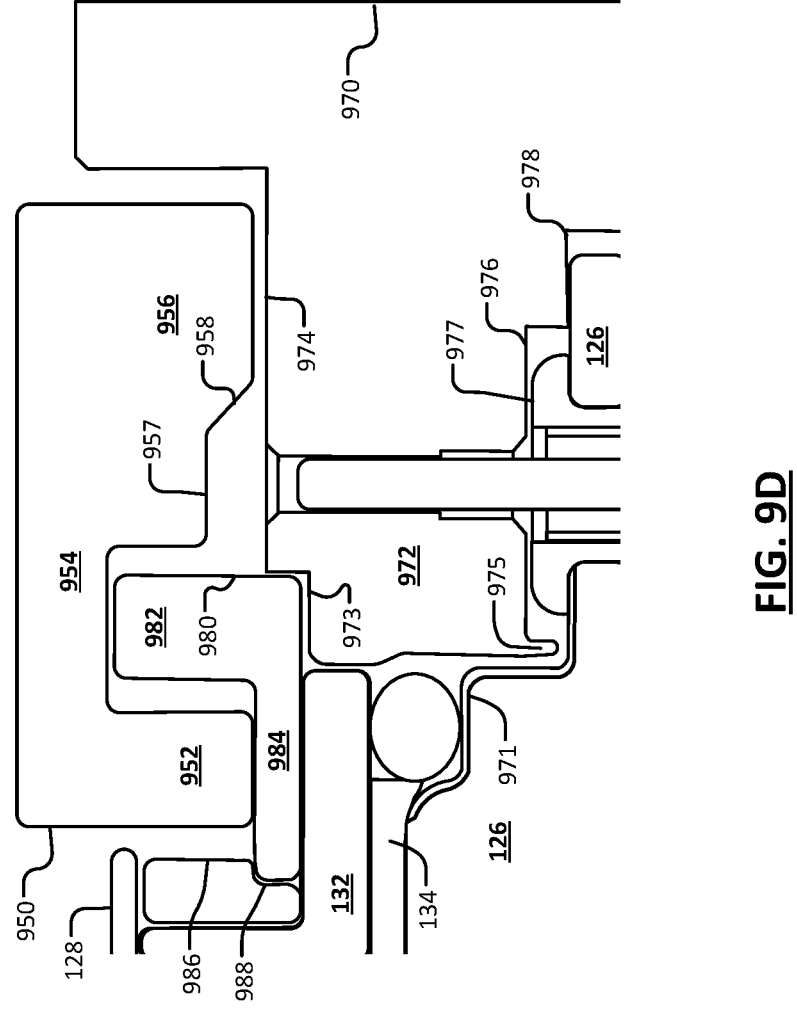
FIGS. 9D to 9G are cross-sectional side views of another example of a moveable edge ring according to the present disclosure.

Referring now to FIG. 9D, an example of a variation of the edge ring system in FIG. 9C is shown. An edge ring 980 is located below the top edge ring 950. The edge ring 980 is generally "L"-shaped and includes a radially-inwardly projecting leg 984 and a vertical leg 982. The vertical leg 982 is located between the radially inner leg 952 and the radially outer leg 956 of the top edge ring 950. An edge ring 986 is located below the substrate 128 and radially outside of the heating plate 132. The edge ring 986 is generally rectangular-shaped with an annular recess 988 or step located on a lower and outer surface thereof to receive the radially-inwardly projecting leg 984.

In some examples, a base height (e.g. a top surface of the top edge ring 950 to the top surface of the baseplate 130) is 3.5 mm. In some examples, the edge rings 950, 980, 986, and 970 are made of quartz, silicon carbide, silicon (or silicon carbide) and quartz, respectively, although other materials can be used.

Figure 9E:
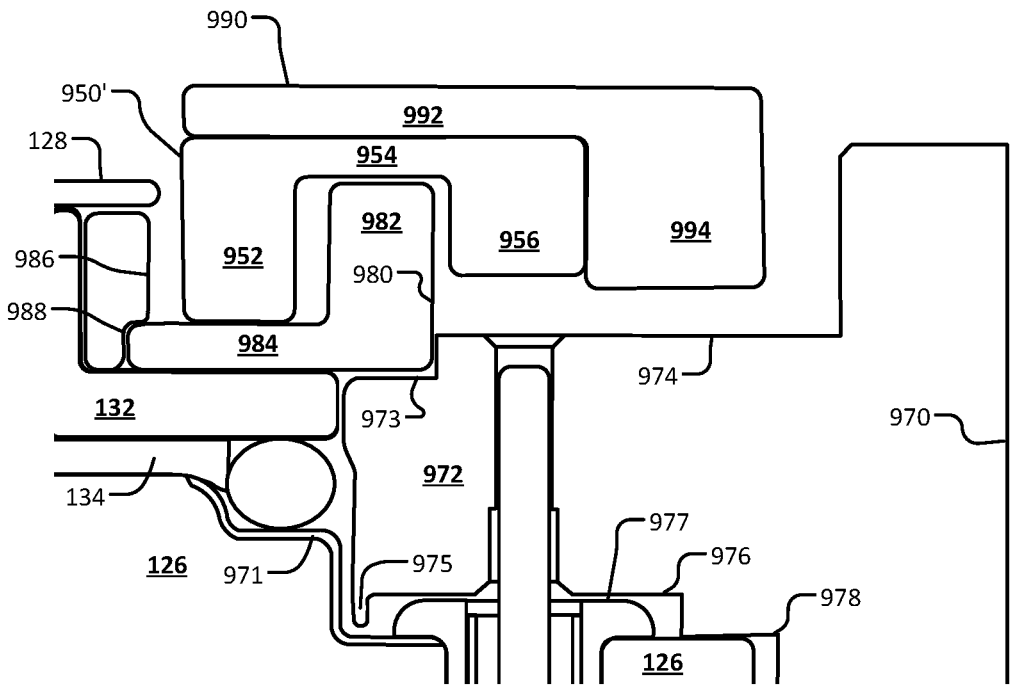

Referring now to FIGS. 9E, other example variations of the edge ring system are shown. In FIG. 9E, the radially outer leg 956 of the top edge ring 950' extends less radially outwardly and is covered by an edge ring 990. The edge ring 990 has an "L"-shaped cross-section and includes a radially-inwardly projecting leg 992 and a downwardly projecting leg 994 connected to a radially outer portion of the radially-inwardly projecting leg 992. In some examples, the top edge ring 950 of FIG. 9D may be too large to fit through the substrate port into the processing chamber. Splitting the top edge ring 950 into two parts as shown at 950' and 990 in FIG. 9E allows the edge ring 990 to be removed and replaced through the substrate port (without breaking vacuum when a vacuum transfer module is used). In some situations, the edge ring 950 in FIG. 9D may be too thick and/or too heavy to be moved by the robot arm. With using a thinner and lighter top edge ring 990 in combination with the edge ring 950", the edge ring 990 can be removed when the edge ring 990 is worn since the edge ring 990 is less thick and lighter.

In some examples, a base height (e.g. a top surface of the top edge ring 950 to the top surface of the baseplate 130) is 3.5 mm. In some examples, the edge rings 990, 950, and 980 are made of silicon carbide, the edge ring 986 is made of silicon and the edge ring 970 is made of quartz, although other materials can be used.

Figure 9F:
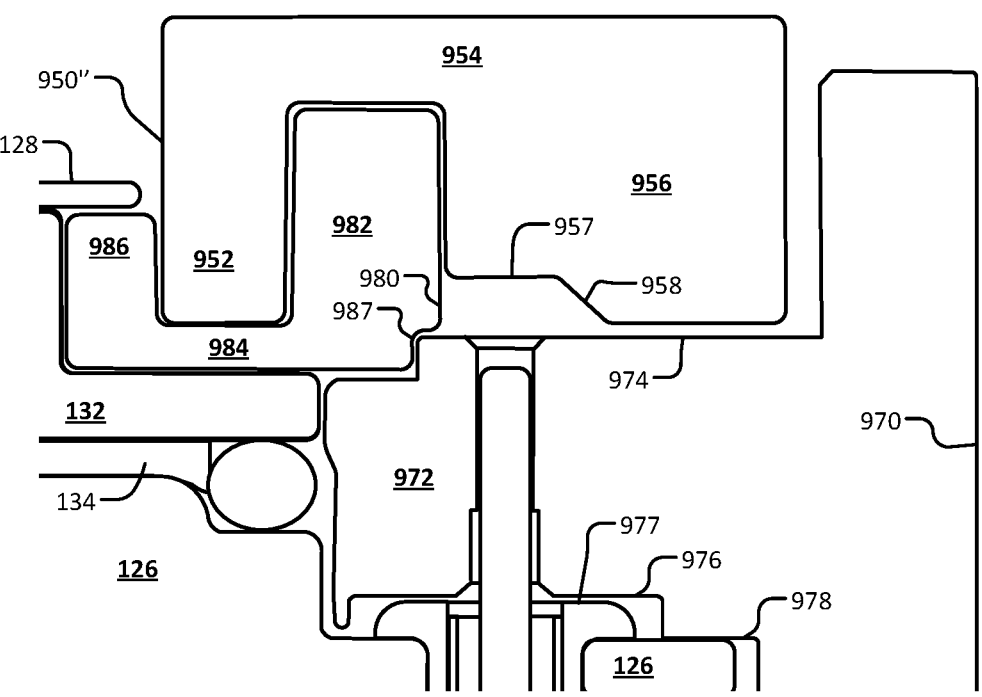

Referring now to FIG. 9F, an edge ring 950" that is similar to the top edge ring 950 of FIG. 9C with tighter tolerances is shown. In some examples, gaps between the edge rings are greater than 0.01 mm and less than or equal to 0.5 mm, 0.25 mm, 0.2 mm, or 0.1 mm. In other examples, a gap between the top edge ring and the substrate is greater than 100 μm and less than 500 μm, 400 μm, or 350 μm. In some examples, a base height (e.g. a top surface of the top edge ring 950' to the top surface of the baseplate 130) is 5.5 mm. In some examples, the edge rings 950', 980, and 970 are made of quartz, although other materials can be used.

Figure 9G:
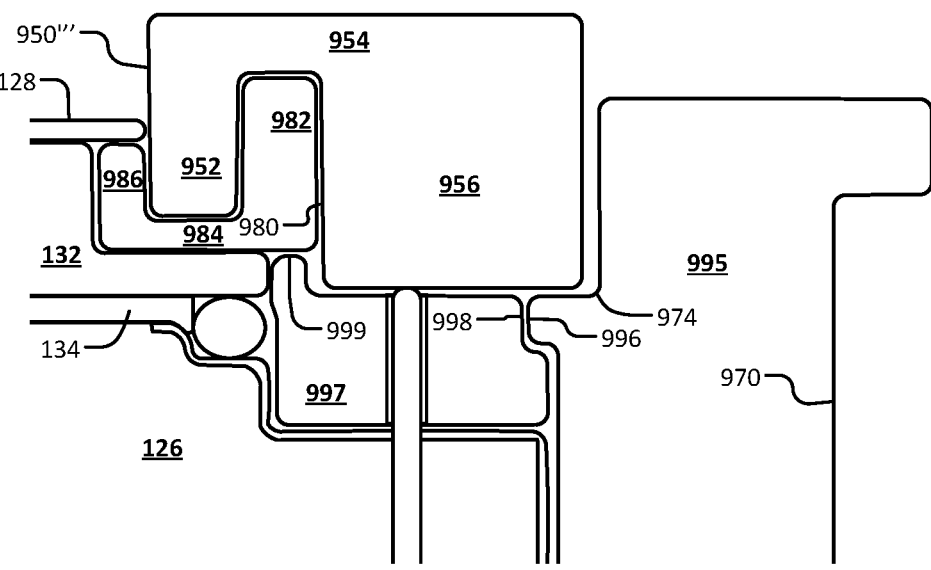

Referring now to FIG. 9G, an outer edge ring 995 defines an annular recess 974 or step on a top surface thereof and a projection 996 that extends radially inwardly from the outer edge ring 995 adjacent to the annular recess 974. An edge ring 997 has a generally rectangular cross-section and includes an annular recess 998 or step located on a radially outer and upper surface to receive the projection 996. The edge ring 997 includes a projection 999 extending upwardly from an upper, radially inner surface of the edge ring 997 adjacent to a radially outer surface of the heating plate 132. In some examples, the edge rings 950" is made of silicon (or quartz, or silicon carbide), the edge ring 980 is made of silicon or silicon carbide, the edge ring 997 is made of ceramic, aluminum or quartz, and the edge ring 970 is made of quartz, although other materials can be used. The projection 996 of the edge ring 970 and the annular recess 998 of the edge ring 997 define a serpentine path to reduce plasma arcing.

Figure 10A:
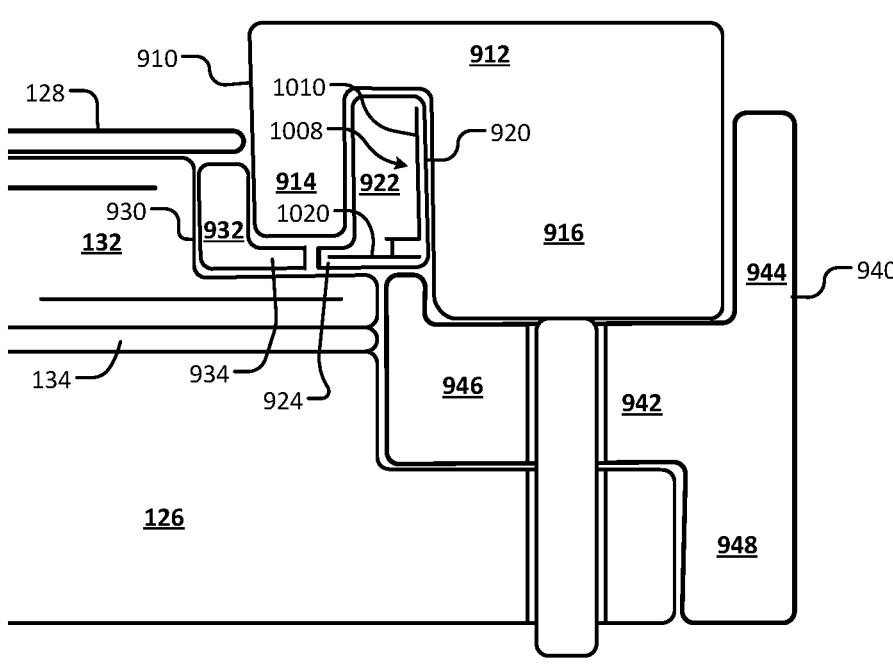
FIGS. 10A and 10B are cross-sectional side views of another example of a moveable edge ring including an embedded conductor according to the present disclosure.
Figure 10B:
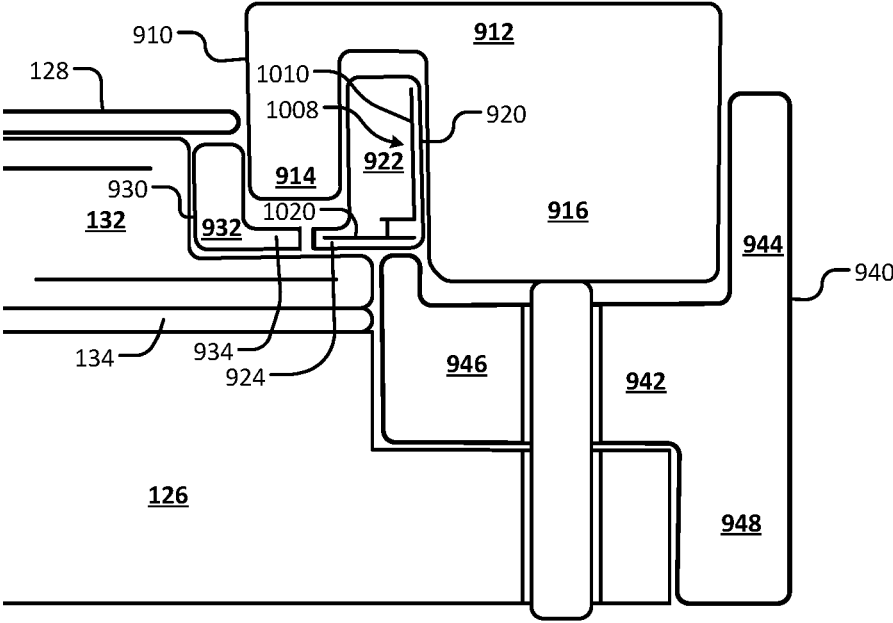

Referring now to FIGS. 10A and 10B, instead of relying upon the capacitance of conductive edge ring, the edge rings can be made of dielectric material and can include embedded conductors without external connectors thereto. For example, in FIGS. 10A and 10B, the edge ring 920 in FIGS. 9A and 9B can be made of dielectric material and can include embedded conductors 1008 that are made of metal. The top edge ring 910 is made of conductive material.

The embedded conductors 1008 include vertical conductive portions 1010 and horizontal conductive portions 1020. The embedded conductors 1008 are arranged to provide relatively constant capacitance as the top edge ring 910 is raised due to wear as shown in FIG. 10B. In the example in FIGS. 10A and 10B, the horizontal conductive portion 1020 provides coupling to the heating plate 132. As the top edge ring 910 is moved upwardly due to wear, the horizontal conductive portion 1020 maintains coupling to the heating plate 132. As a result, the capacitance of the delivery components remains approximately the same.

Figure 11A:
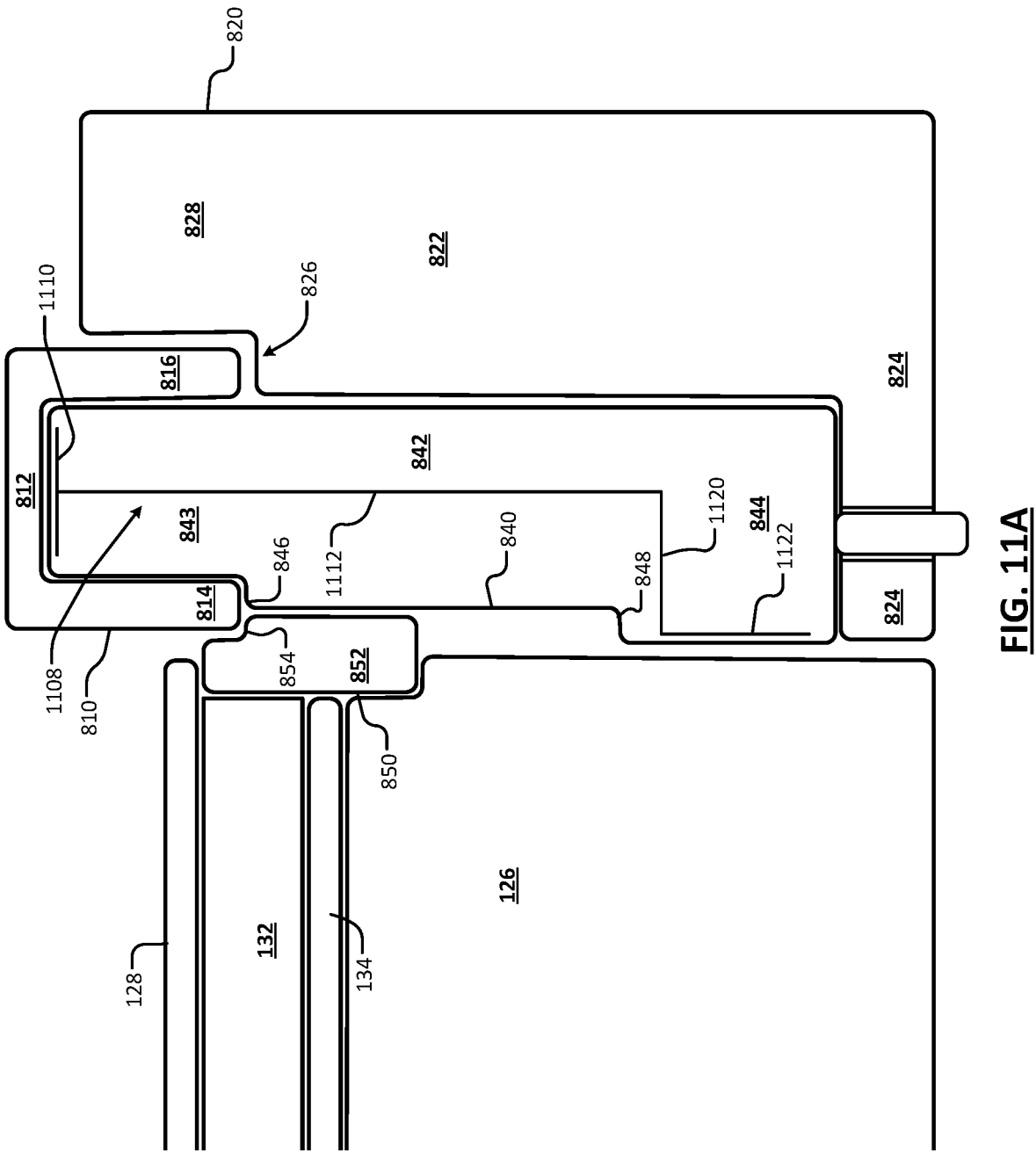
FIGS. 11A and 11B are cross-sectional side views of another example of a moveable edge ring including an embedded conductor according to the present disclosure.
Figure 11B:
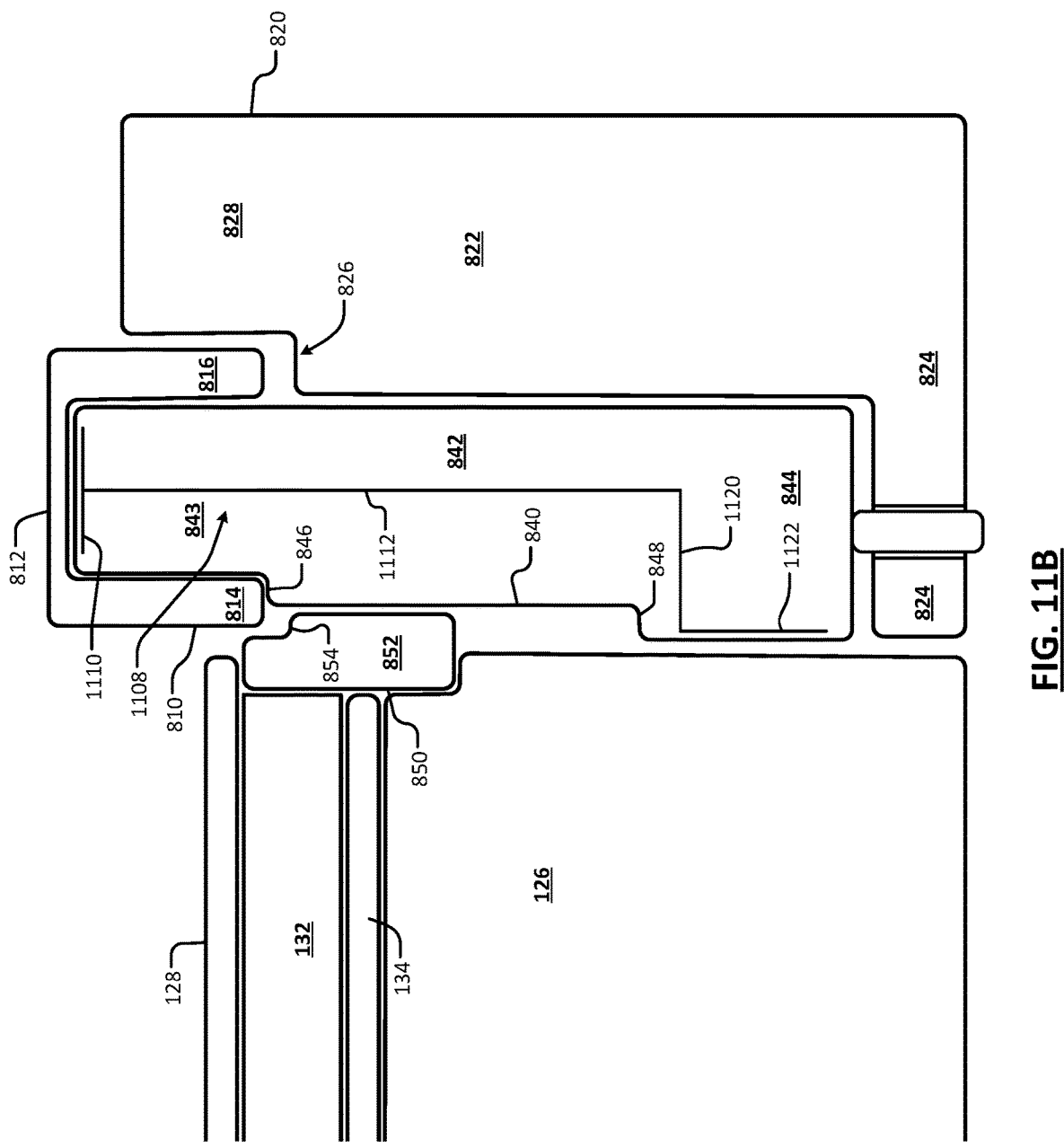

Referring now to FIGS. 11A and 11B, the edge ring 840 is made of dielectric material (instead of conductive material as in FIGS. 8A and 8B above) and includes an embedded conductor 1108 without external connection thereto. The top edge ring 810 is made of conducting material or dielectric material. The embedded conductor 1108 includes an upper horizontal conductor 1110 arranged near and parallel to a lower surface of the top edge ring 810. The upper horizontal conductor 1110 is connected to a vertical conductor 1112 that extends near a middle of the middle edge ring 840. The vertical conductor 1112 connects to a horizontal conductor 1120 that extends radially inwardly and connects to a vertical conductor 1122. The vertical conductor 1122 is arranged near and extends along a radially inner surface of the edge ring 840 near the lower portion.

In FIG. 11B, as the edge ring 840 is raised to compensate for wear of the top edge ring 810, coupling between the vertical conductor 1110 and the top edge ring 810 remains relatively constant (and less than or equal to $D_A$). Likewise, coupling between the vertical conductor 1122 and a conductive facing surface of the baseplate 130 remains relatively constant (and less than or equal to $D_A$). In other locations, the embedded conductor has a gap distance that is greater than or equal to $D_B$.

Figure 11C:
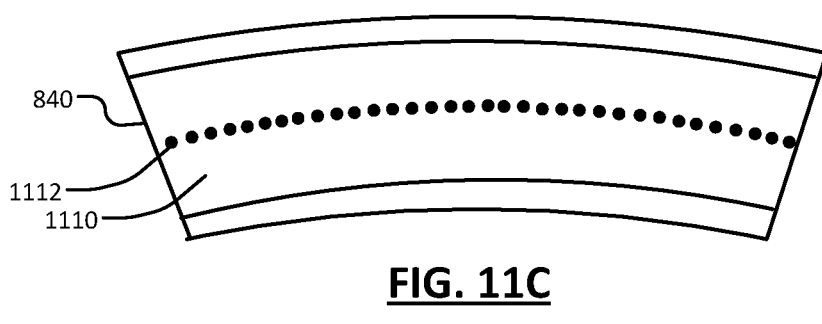
FIGS. 11C to 11E are cross-sectional views of examples of the moveable edge ring and the embedded conductor according to the present disclosure.
Figure 11D:
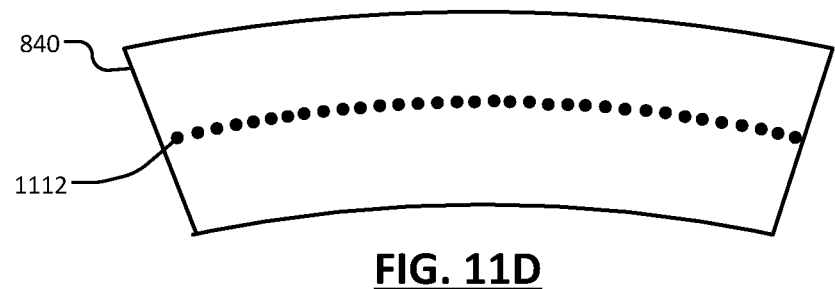
Figure 11E:
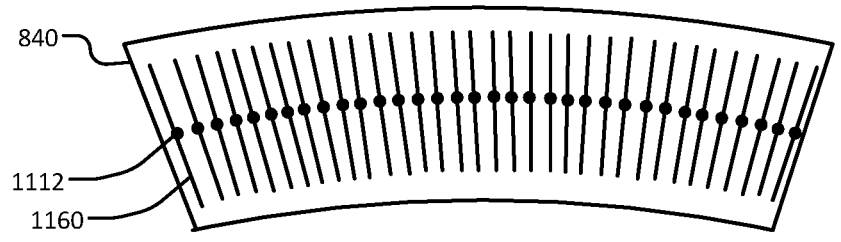

Referring now to FIGS. 11C to 11E, an arcuate portion of the edge ring 840 is shown. The edge ring 840 can be made of a plurality of ceramic green sheets that are stacked and sintered. Prior to sintering, vertical conductors or vias are created by cutting holes in adjacent ceramic green sheets and filling the holes with a conductive material such as a conductive paste. In some examples, tungsten paste is used. Horizontal conductors are formed by printing traces or conductive planes on the ceramic green sheets using conductive material. In some examples, the horizontal conductors are printed to overlap and contact the vertical conductors to provide connections therebetween.

In FIG. 11C, the vertical conductors 1112 or vias are shown connected to a conductive plane 1150 that defines the horizontal conductor 1110. In FIG. 11D, in locations where there are no horizontal conductors, the vertical conductors pass through the ceramic green sheets. In FIG. 11E, instead of using the conductive plane shown in FIG. 11D, a plurality of traces 1160 can be used to implement the horizontal conductors 1110 instead of the conductive plane 1150.

Figures 12A, 12B:
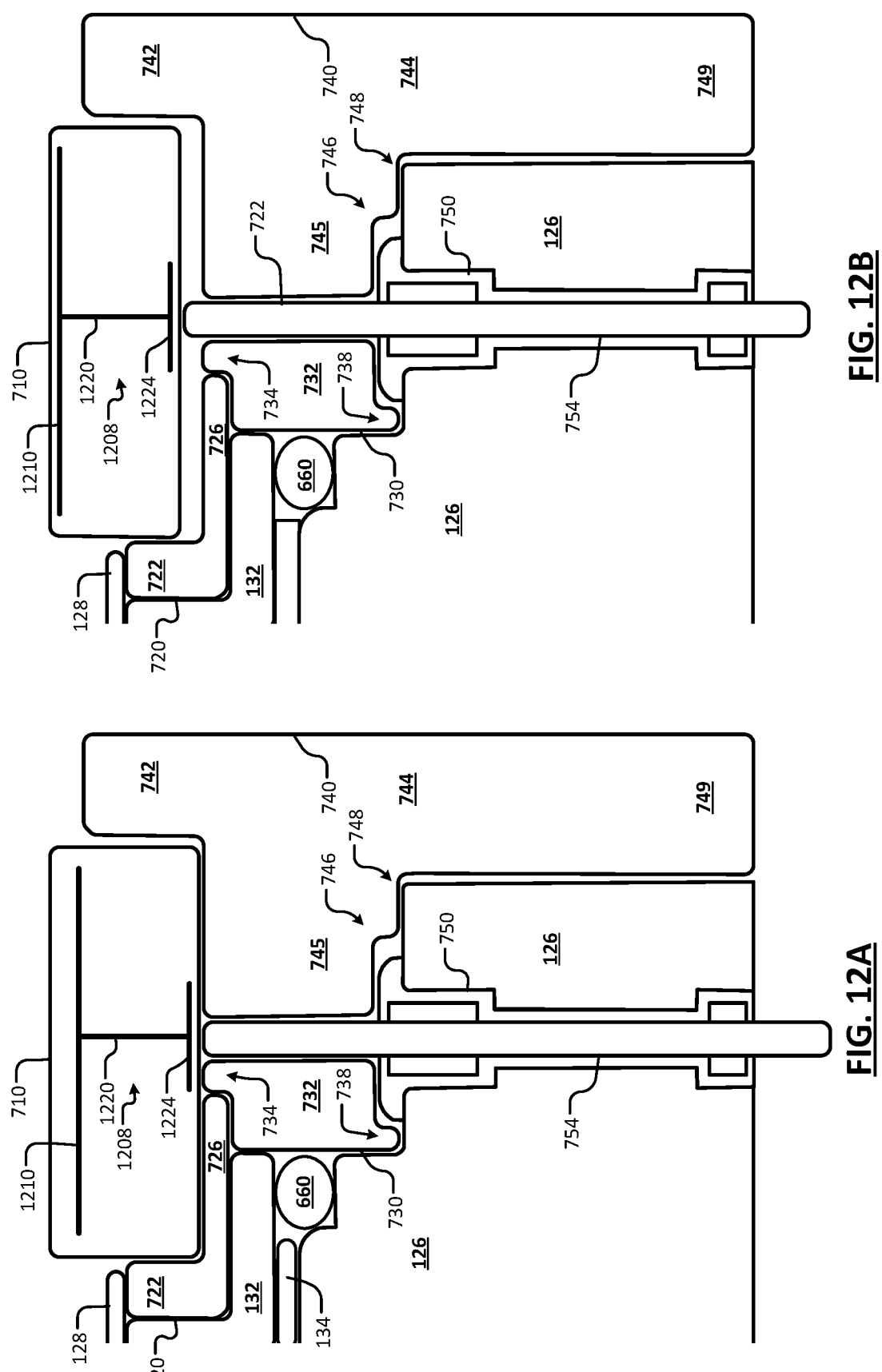
FIGS. 12A and 12B are cross-sectional side views of another example of a moveable edge ring including an embedded conductor according to the present disclosure.

Referring now to FIGS. 12A and 12B, the top edge ring 710 of FIG. 7 can be made of dielectric instead of conductive material. The top edge ring 710 includes an embedded conductor 1208 without external connections thereto. The embedded conductor 1208 includes a horizontal conductor 1210 arranged parallel to a top surface of the top edge ring 710. The horizontal conductor 1210 is spaced a predetermined distance from the top surface to allow wear of the dielectric material without exposing the horizontal conductor 1210. A vertical conductor 1220 extends vertically near a middle portion of the top edge ring 710. The vertical conductor 1220 connects to the horizontal conductor 1210 and to a horizontal conductor 1224 arranged parallel to a bottom surface of the top edge ring 710. The horizontal conductor 1224 allows capacitive coupling to the lift pin 754. The lift pin 754 is made of conductive material. As can be seen in FIG. 11B, coupling between the lift pin 754 and the horizontal conductor 1224 remains constant as the top edge ring 710 is lifted.

Figure 13A:
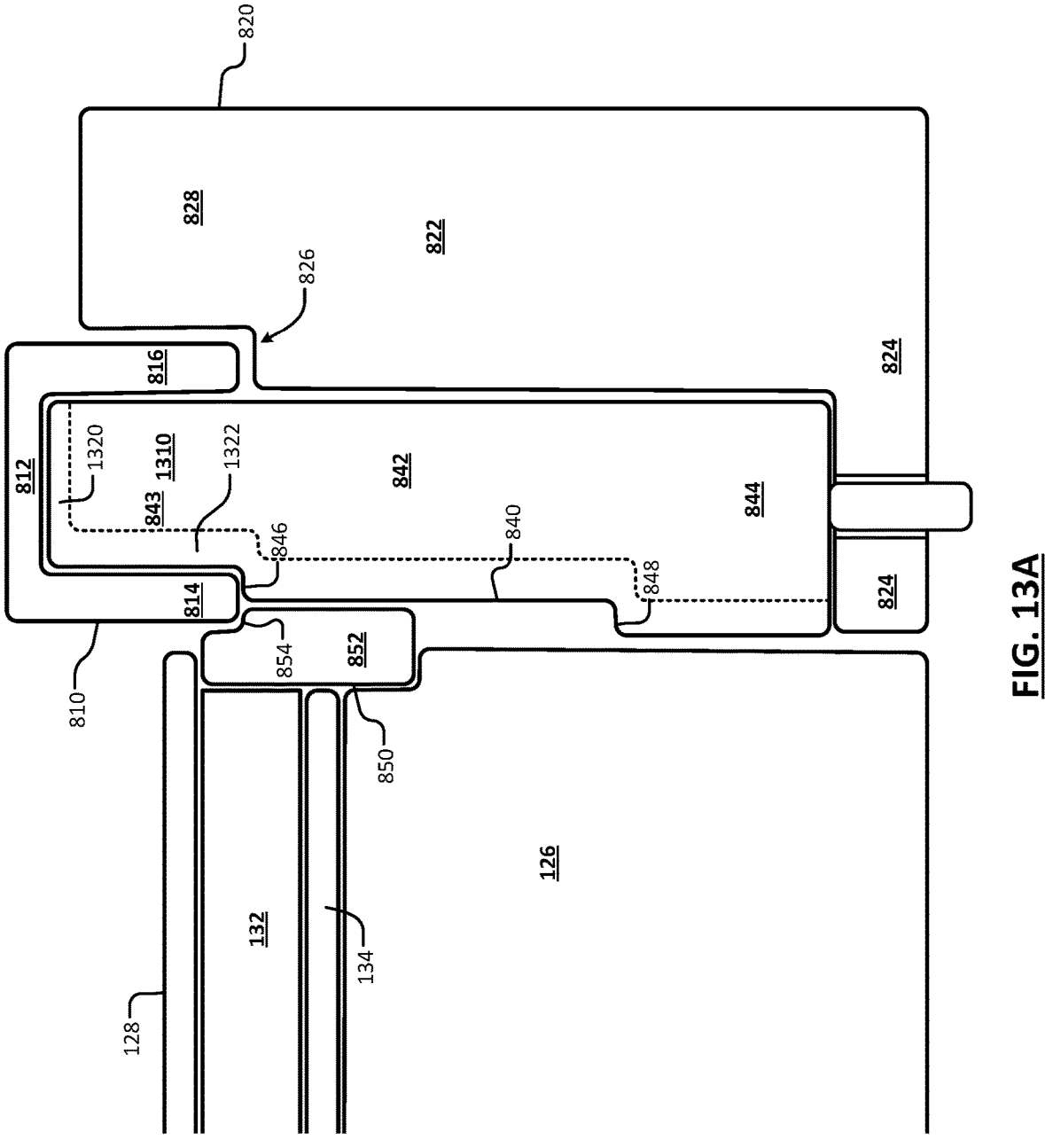
FIGS. 13A and 13B are cross-sectional side views of another example of a moveable edge ring including doped conductive portions according to the present disclosure.
Figure 13B:
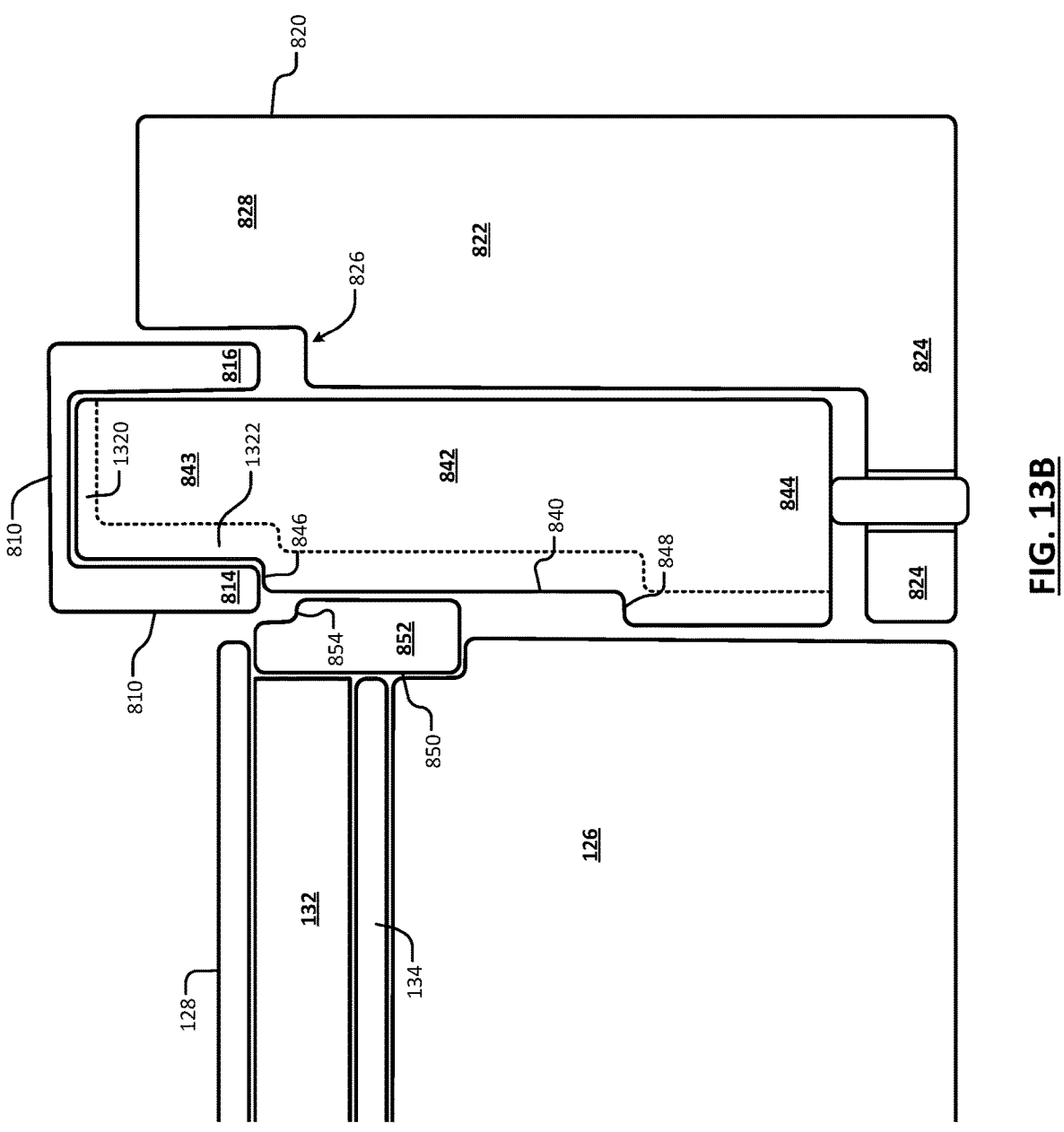

Referring now to FIGS. 13A and 13B, the edge ring 840 is made of a dielectric material or conductive material (as defined herein) and includes one or more doped regions that are more conductive than the remaining regions that are undoped. The top edge ring 810 is made of conductive material or dielectric material.

In this example, a top surface 1320 of the edge ring 840 lying below the top edge ring 810 is doped to a predetermined depth to render the material more conductive than undoped material. Likewise, a radially inner surface 1322 of the edge ring 840 is also doped to a predetermined depth to render the dielectric material more conductive from the top surface 1320 to a bottom edge of the lower surface 849. The top surface 1320 and the radially inner surface 1322 are electrically connected. While a single continuous doped region is shown, two or more doped regions may be used.

For example, the edge ring 840 may be made of silicon carbide that is doped with boron, aluminum or nitrogen to make selected portions thereof more conductive than undoped areas. In FIG. 13B, the conductive portions of the edge ring 840 provide uniform coupling to adjacent surfaces as the middle edge ring is raised due to wear of the top edge ring 810.

Figures 14A, 14B:
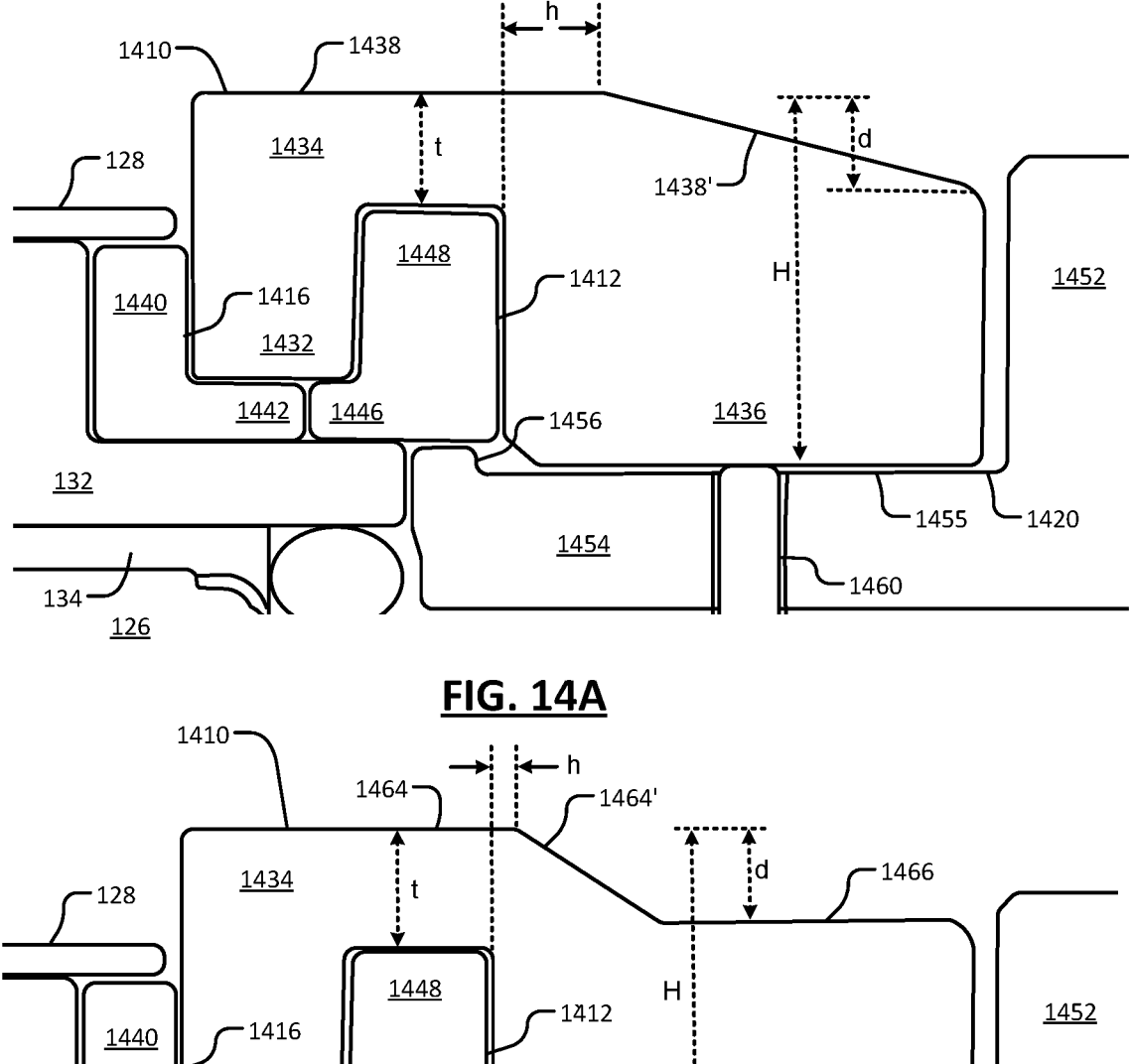
FIGS. 14A, 14B, and 14C are cross-sectional side views of another example of a moveable edge ring according to the present disclosure.

Referring now to FIG. 14A, a top edge ring 1410 is arranged above edge rings 1412, 1416, and 1420. The top edge ring 1410 has an inverted "U"-shape and includes an annular body 1434, a radially inner leg 1432 and a radially outer leg 1436. The annular body 1434 has a thickness t to allow enough material for stability of the edge ring during handling and sufficient material to allow a sufficient number of cycles prior to replacement due to erosion. In some examples, the thickness t is in a range from 0.5 mm to 10 mm, although other thicknesses can be used. In some examples, the thickness t is in a range from 0.5 mm to 5 mm, although other thicknesses can be used.

A top surface 1438 of the radially outer leg 1436 slopes linearly downwardly at 1438' (to create an inclined surface) near a mid-portion of the top edge ring 1410 to a radially outer edge of the top edge ring 1410. The sloped portion 1438' slopes linearly downwardly by a vertical distance d from the top surface 1438'. A horizontal distance h is provided from the radially outer edge of the "U" shape to a location where the top surface 1438 begins to slope downwardly. In some examples, depending on the thickness t, the horizontal distance h is in a range from 0 mm to 10 mm, although other horizontal distances can be used. In some examples, d is greater than or equal to t. In some examples, d is in a range from t to 3 t. In some examples, d is less than or equal to t. In some examples, d is in a range from 0.25*t to t. The edge rings 1412 and 1416 have "L"-shaped cross-sections.

In some examples, the top surface 1438 has an overall thickness H. In some examples, the overall thickness H of the edge ring is in a range from 5 mm to 20 mm. In some examples, the distance d is greater than or equal to 5%, 10%, 20%, 30%, 40% or 50% of the height H. In some examples, the sloped portion 1438' slopes linearly at an acute angle. In some examples, the sloped portion 1438' slopes at an acute angle in a range from 20° to 70°.

Edge ring 1410 is generally taller than prior edge rings to allow for longer wear, and to accommodate the "U" shape. Due to wear, the edge ring may crack if there is not enough material between the "U" shape and the top surfaces 1438 and 1438'. As can be appreciated, removal of material in the radially outer sloped portion reduces the weight of the edge ring 1410, which reduces the load on the actuators. This allows the actuators to provide finer adjustments. A linear slope of the sloped portion 1438' increases the amount of material that can be removed without removing too much material between the "U" shape groove and the top surfaces 1438 and 1438' as compared to stepped designs. In some examples, the distance d is greater than thickness t of the annular body 1434 to increase the amount of material that is removed. In some examples, the horizontal distance h is less than the thickness t of the annular body 1434 to increase the amount of material removed.

The edge ring 1412 is located radially outside of the edge ring 1416 and below the top edge ring 1410. The edge ring 1412 includes an upwardly projecting leg 1448 and a leg 1446 extending radially inwardly from the upwardly projecting leg 1448. The edge ring 1416 is located adjacent to the heating plate 132, radially inside of the edge ring 1412 and below the substrate 128. The edge ring 1416 includes an upwardly projecting leg 1440 and a leg 1442 extending radially outwardly from the upwardly projecting leg 1440.

The edge ring 1420 includes a radially outer portion 1452 and a radially inner portion 1454 that extends radially inwardly from a lower portion of the radially outer portion 1452. A step surface 1455 supports the radially outer leg 1436 of the top edge ring 1410 when lowered. An upward projection 1456 extends upwardly from an inner, upper surface of the radially inner portion 1454. A lift pin 1460 move reciprocally in a vertical bore in the radially inner portion 1454 of the edge ring 1420 to raise and lower the edge ring 1410.

Referring now to FIG. 14B, the top edge ring 1410 includes an alternate upper surface profile. A sloped portion 1464' of a top surface of the edge ring 1410 slopes downwardly in a radially outer direction. The sloped portion 1464' transitions to a surface 1466, which is generally parallel to a plane including the substrate 128. Removal of material of the edge ring in the sloped portion 1464' reduces the weight of the top edge ring 1410. Weight reduction can be performed to allow use with lift actuators having lower lifting capacity.

Figure 14C:
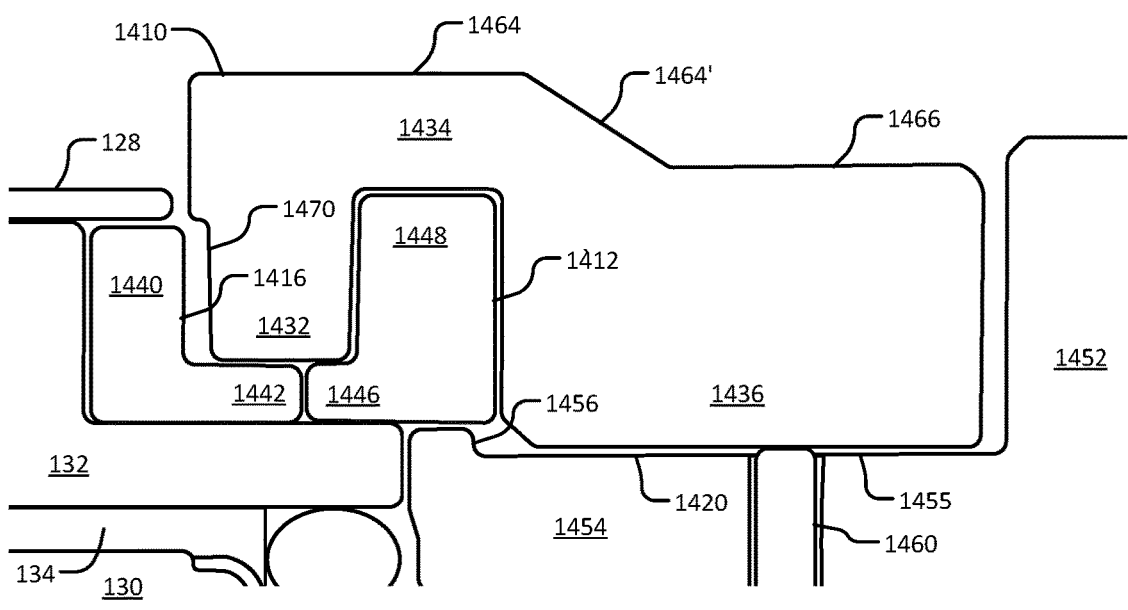

Referring now to FIG. 14C, a radially inner edge 1470 of the top edge ring 1410 defines a gap with respect to a radially outer surface of the upwardly projecting leg 1440 of the edge ring 1416. The gap is increased relative to the edge ring systems in FIGS. 14A and 14B.

Figure 15:
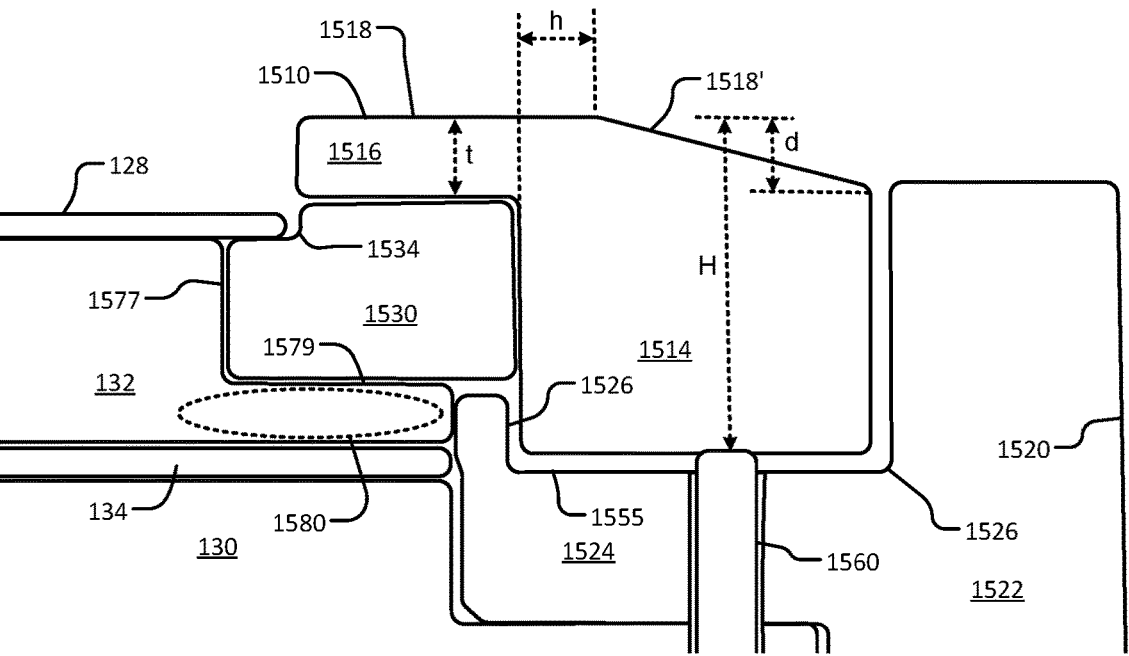
FIG. 15 is a cross-sectional side view of another example of a moveable edge ring according to the present disclosure.

Referring now to FIG. 15, an edge ring system includes a top edge ring 1510, an outer edge ring 1520 and an edge ring 1530. The edge ring 1530 is located below the top edge ring 1510 and radially inside of the outer edge ring 1520. The top edge ring 1510 includes a generally rectangular body 1514 and a radially inwardly projecting leg 1516 extending from a radially inner and upper surface of the top edge ring 1510. The edge ring 1530 is generally rectangular and includes an annular recess 1534 located on an upper and radially inner surface thereof. The substrate 128 is received in the annular recess 1534. The outer edge ring 1520 includes a radially outer portion 1522 and an inner portion 1524 that extends radially inwardly from a middle portion of the radially outer portion 1522. A lift pin 1560 moves reciprocally in a vertical bore in the inner portion 1524 of the outer edge ring 1520. A projection 1526 extends upwardly from a radially inner and upper surface of the outer edge ring 1520. The generally rectangular body 1514 of the top edge ring 1510 is received on an upper surface 1555 of the outer edge ring 1520 between the projection 1526 and the radially outer portion 1522.

In some examples, a top surface 1518 of the edge ring 1510 has a height H before a sloped portion 1518'. The sloped portion 1518' slopes downwardly by a distance d from the top surface 1518 to the radially outer edge of the top edge ring 1510. In some examples, the distance d is greater than or equal to 5%, 10%, 20%, 30%, 40% or 50% of the height H. In some examples, the sloped portion 1518' slopes downwardly at an acute angle. In some examples, the sloped portion 1518' slopes at an acute angle in a range from 20° to 70°. As can be appreciated, the material removed to create the sloped portion 1518' helps to reduce the weight of the edge ring 1510, which reduces the load on the actuators and increases reliability.

In some examples, the heating plate 132 has a cylindrical center portion 1577 and a projecting portion 1579 that extends radially outwardly from a bottom portion of the cylindrical center portion. In some examples, the heating plate 132 does not include RF electrodes. In other examples, the RF electrodes located in the heating plate 132 in a vicinity of the edge ring are removed. For example, RF electrodes are removed in an area 1580 of the heating plate located beneath the edge ring 1530.

Figure 16A:
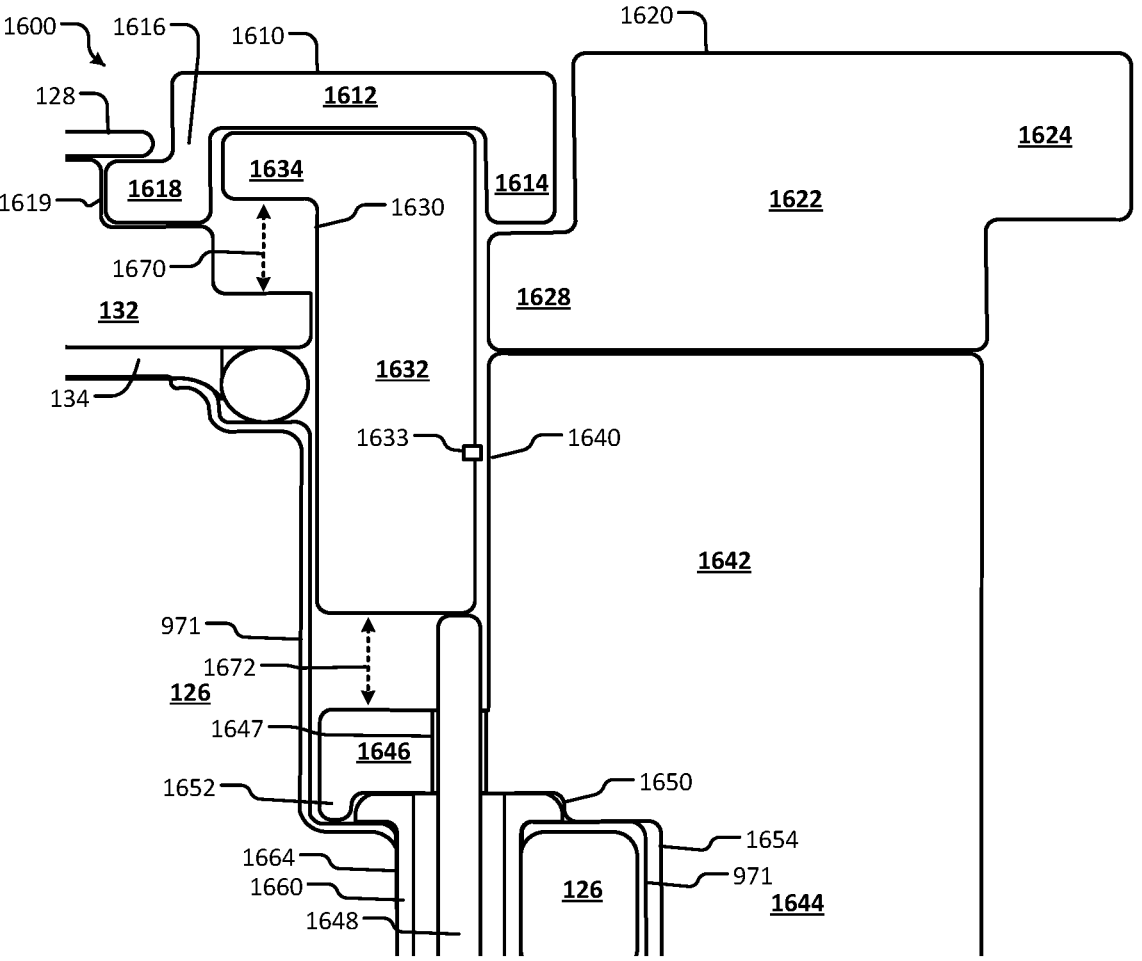
FIGS. 16A to 16D are cross-sectional side views of other examples of moveable edge rings according to the present disclosure.
Figure 16B:
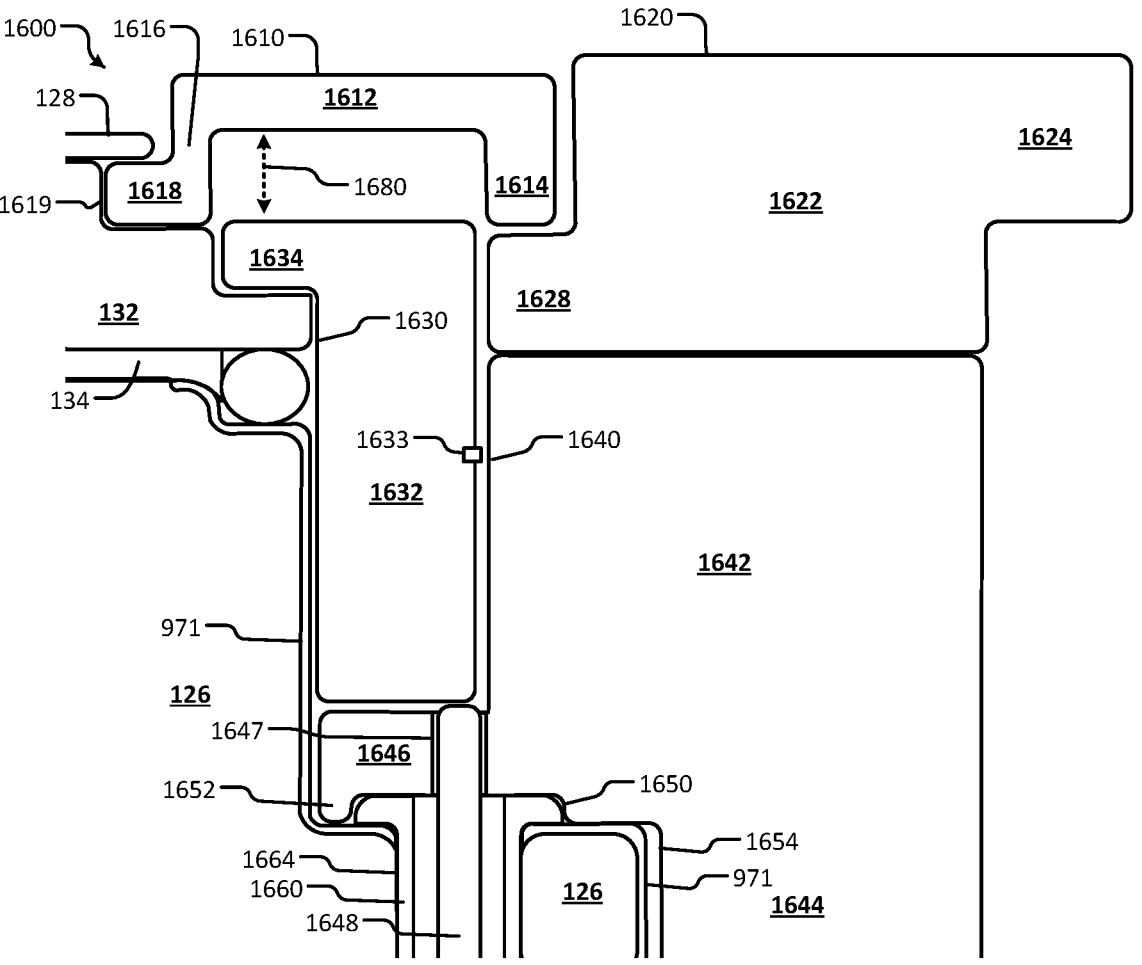
Figure 16C:
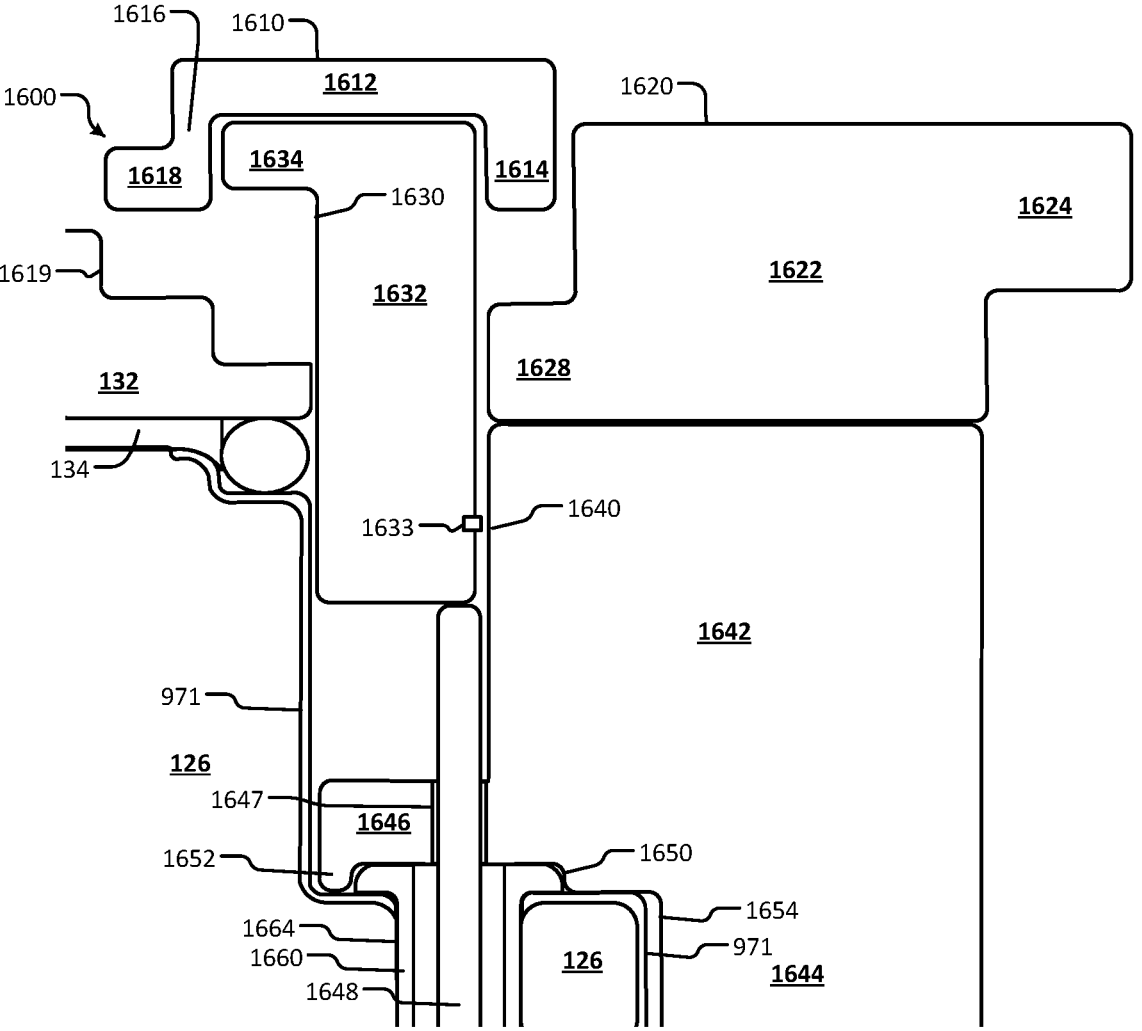

Referring now to FIG. 16A to 16C, a moveable edge ring system 1600 is shown. In FIG. 16A, the moveable edge ring system 1600 includes a top edge ring 1610 including an annular body 1612. A radially outer leg of the top edge ring 1610 projects downwardly from a radially outer surface of the annular body 1612. A radially inner leg 1616 projects downwardly from a radially inner surface of the annular body 1612. An inwardly projecting leg 1618 extends radially inwardly from a lower end of the radially inner leg 1616. The inwardly projecting leg 1618 extends below a radially outer edge of the substrate 128. In some examples, the heating layer 132 includes an annular recess 1619 and the inwardly projecting leg 1618 is received in the annular recess 1619 on an upper surface thereof between the substrate 128 and the annular recess 1619.

An edge ring 1620 includes an annular body 1622. A radially outwardly projecting leg 1624 extends from an upper and radially outer surface of the annular body 1622. A radially inwardly projecting leg 1528 extends radially inwardly from a radially inner and lower surface of the annular body 1622. The edge ring 1620 is located radially outside of the top edge ring 1610.

An edge ring 1630 is located radially inside of the edge ring 1620 and below the top edge ring 1610. The edge ring 1630 includes an annular body 1632. A radially inwardly projecting leg 1634 extends radially inwardly from an upper and radially inner surface of the annular body 1632. As will be described further below in conjunctions with FIGS. 17-22, the edge ring 1632 can include spacers 1633 such as shims, pins or projections to maintain spacing between the edge ring 1630 and the edge rings 1620 and/or 1640. As also described further below, insulating coatings may be used.

An edge ring 1640 is located below the edge ring 1620 and radially outside of a lower portion of the edge ring 1630. The edge ring 1640 includes an annular body 1642, a radially downwardly projecting leg 1644 extends from a radially outer and lower surface of the annular body 1642. An inwardly projecting leg 1646 extends radially inwardly from a middle and inner portion of the annular body 1642. The inwardly projecting leg 1646 includes a vertical bore 1647 that receives a lift pin 1648. The edge ring 1640 includes an annual recess 1650 and a projection 1652 that define a vertical bore in a lower surface of the edge ring 1640 to receive a guide sleeve 1660 arranged in a vertical bore 1664 in the baseplate 126. The edge ring 1640 includes an annular recess 1654 on a lower and radially inner surface thereof to provide clearance for a radially outer edge of the baseplate 126.

When biased by the lift pin 1648 against a lower surface of the edge ring 1610, the edge ring 1630 defines a first vertical gap 1670 between the radially inner leg 1634 and an upper surface of the heating layer 132. The edge ring 1630 also defines a second vertical gap 1672 between a lower surface of the edge ring 1630 and an upper surface of the radially inwardly projecting leg 1646.

In FIG. 16B, when the lift pin 1648 is fully lowered, the edge ring 1630 defines a third vertical gap 1680 between a lower surface of the edge ring 1610 and an upper surface of the edge ring 1630. The lower surface of the edge ring 1630 rests on the upper surface of the radially inwardly projecting leg 1646. During operation, the edge ring 1630 can be arranged in an abutting relationship with the edge ring 1610 by raising the lift pin 1648 or in a spaced relationship with the edge ring 1610 by lowering the lift pin 1648 and the edge ring 1630.

When the edge ring 1610 is worn due to exposure to the plasma, the substrate 128 is removed and the lift pin 1648 lifts the edge ring 1630 and the edge ring 1610 upwardly as shown in FIG. 16C. The edge ring 1610 is removed from the processing chamber through the substrate port using a robot arm (such as a vacuum transfer module robot arm). Another one of the edge rings 1610 is delivered (through the substrate port using the robot arm) onto the edge ring 1630 and the lift pin 1648 is lowered. In some examples, the top ring 1610 is made of either conductive or dielectric material, the ring 1630 is made of either conductive material or dielectric material with embedded electrodes, and the ring 1620 and 1640 are made of dielectric material.

Figure 16D:
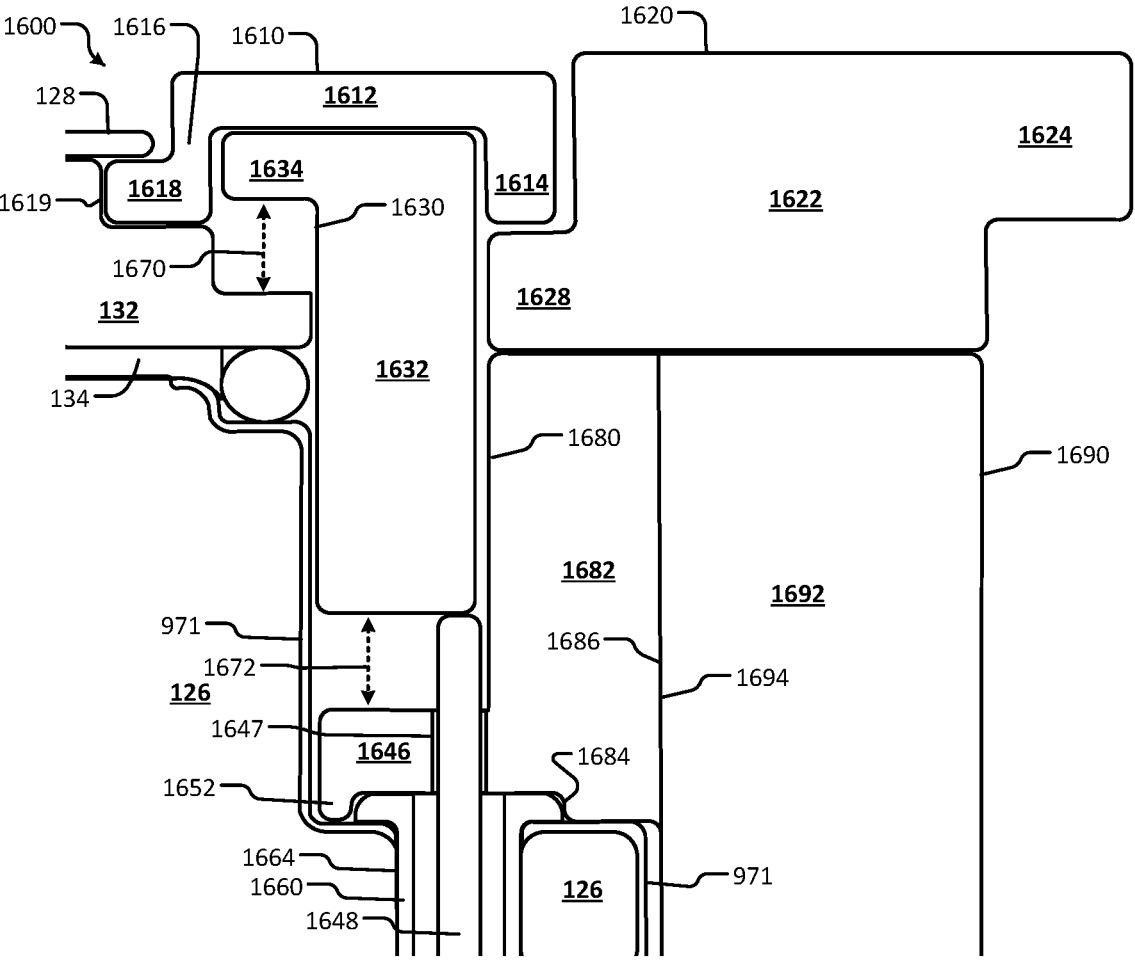

Referring ow to FIG. 16D, the edge ring 1640 of FIGS. 16A-16C can be split into two concentric rings. An inner ring 1680 includes an annular body 1682 and an annular recess 1684 located on a lower and radially inner surface (similar to the annular recess 1650 in FIGS. 16A-16C). The inner ring 1680 is made of a conductive material to enhance capacitive coupling with the edge ring 1630. This arrangement allows more RF to be transmitted between the baseplate 126 and the edge ring 1630.

An outer ring 1690 includes an annular body 1692 that is made of a dielectric material. The annular body 1692 is located radially outside of the inner ring 1680. A radially inner surface 1694 of the outer ring 1690 lies adjacent to a radially outer surface 1686 of the inner ring 1680.

Figures 17, 18:
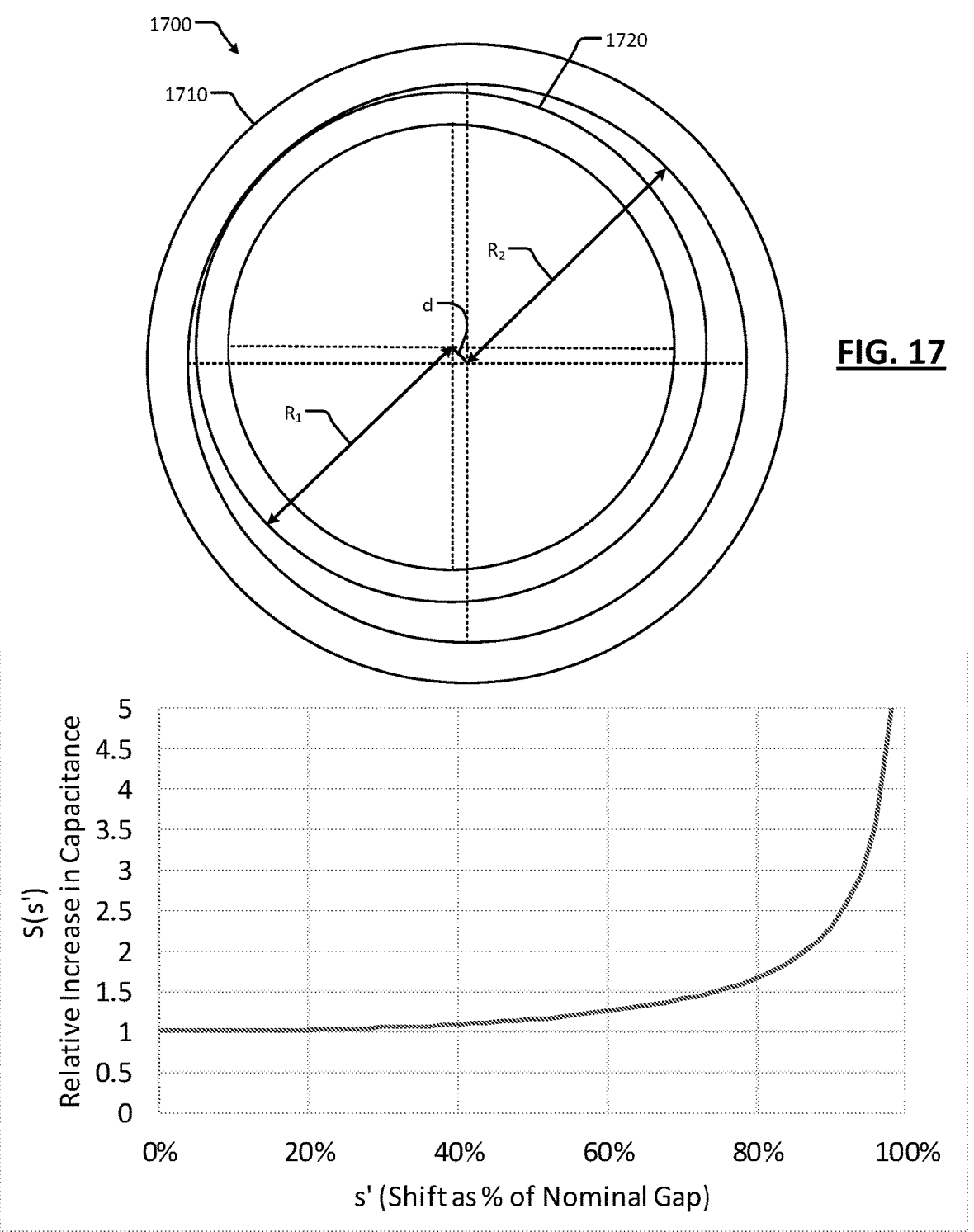
FIG. 17 is a cross-sectional view of a portion of upper and lower edge rings according to the present disclosure.
FIG. 18 is a graph illustrating increase in capacitance as a function of shift percentage from a nominal gap according to the present disclosure.

Referring now to FIGS. 17 and 18, many of the foregoing examples include an upper ring that is exposed to plasma and a lower ring located below and shielded from direct plasma by the upper ring. For example, a cross-section of a portion of an edge ring system 1700 that is designed to have capacitance coupling is shown in FIG. 17. A lower portion of an upper ring 1710 is located radially outside of a lower portion of a lower ring 1720.

To maintain control of the plasma sheath at low bias frequencies, the value of the coupling capacitance C should remain fixed and relatively constant as the upper ring 1710 is exposed to plasma, experiences erosion and has its height raised. Furthermore, there may be a significant difference in temperature between the upper ring 1710 and the lower ring 1720. For example, the temperature difference between the upper ring 1710 and the lower ring 1720 may be in a range from 0° C. to 200° C. (e.g. 100° C.) during plasma processing. In some examples, as the lower ring 1720 expands when heated and contracts when cooled, the lower ring 1720 (or the upper ring 1710) may move or walk in a direction parallel to the substrate in a direction towards one side of the upper ring 1710 effectively reducing the gap in some radial directions and increasing the gap in other radial directions.

Assuming that C is the capacitance between the upper ring 1710 and the lower ring 1720, as the lower ring 1720 moves off center (closer to the upper ring 1710 in some radial directions and further from the upper ring 1710 in other radial directions), the capacitance increases because capacitance is a non-linear function of the gap. More particularly, the capacitance $C_{shifted}=S(s')*C_{centered}$ where $s'=d/(R_2-R_1)$, where $0 \le s' \le 1$ and where $R_2$ is the inner diameter of the upper ring 1710 and $R_1$ is the outer diameter of the lower ring 1720. In FIG. 18, the relative increase in capacitance is shown as a function of shift percentage (%) of a nominal gap. As can be appreciated, the capacitance is affected when the shift percentage is greater than about 35-40% of the nominal gap.

Systems and methods according to the present disclosure use a spacer such as a shim, pin or projection on the upper ring or the lower ring to limit movement of the upper ring 1710 relative to the lower ring 1720 during heating and cooling experienced during plasma processing. In some examples, the movement is limited to less than or equal to 20%, 30% or 40% of the nominal gap to limit the effect of the relative movement on the capacitance of the edge ring system.

Figure 19:
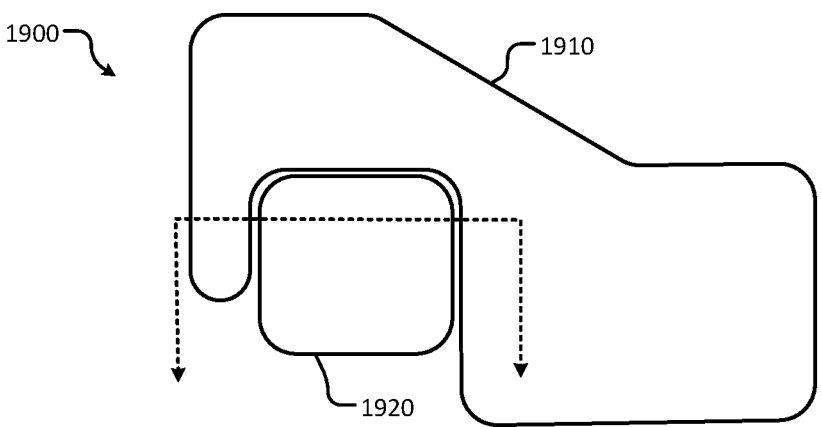
FIG. 19 is a side cross-sectional view of an edge ring system including an upper ring and a lower ring according to the present disclosure.
Figure 20:
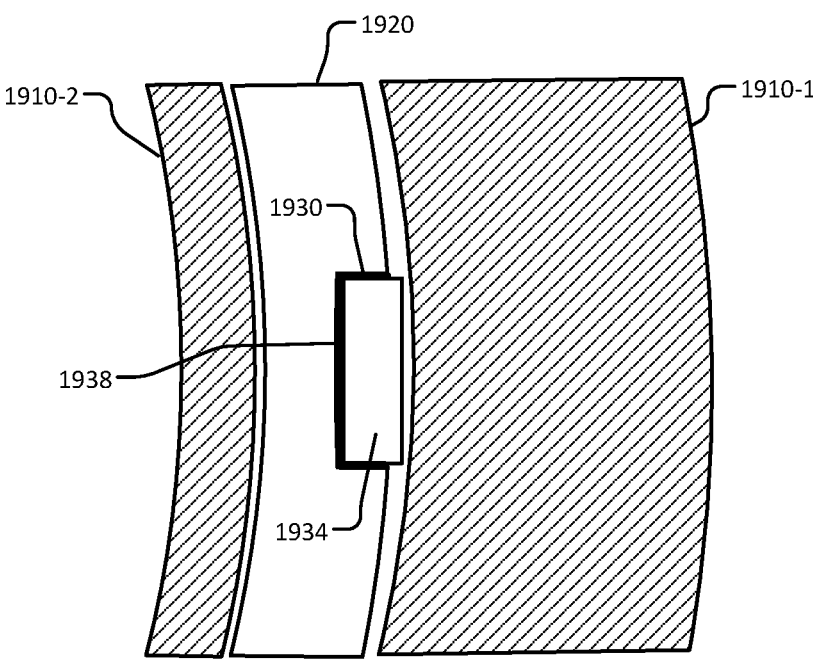
FIG. 20 is a side cross-sectional view of an edge ring system including an upper ring and a lower ring including a plurality of shims according to the present disclosure.

Referring now to FIGS. 19-22, various ways of limiting movement of the upper ring relative to the lower ring of an edge ring system are shown. In FIG. 19, an edge ring system 1900 includes an upper ring 1910 including inner and outer portions 1910-1 and 1910-2 located adjacent to radially inner and outer surfaces of a lower ring 1920, respectively. In FIGS. 20-22, various ways for limiting movement of the upper ring 1910 relative to the lower ring 1920 are shown.

In FIG. 20, the lower ring 1920 includes a slot 1938 located on a radially outer surface thereof. The slot 1938 extends radially inwardly into the radially outer surface of the lower ring 1920. A shim 1934 is arranged in the slot 1938. In some examples, adhesive 1930 is used to retain the shim 1934 in the slot 1938. In some examples, the shim 1934 has rectangular plan, radial and side cross-sections, although other shapes can be used. In some examples, the shim 1934 has a thickness in a radial direction that is greater than or equal to a depth of the slot 1938. In some examples, the shim 1934 extends radially outwardly from the lower ring 1920 to a distance sufficient to limit movement (given the number of shims that are used).

In FIG. 21, the lower ring 1920 includes a slot 1948 located on a radially outer surface thereof. The slot 1948 extends radially inwardly. A pin 1950 is arranged in the slot 1948. In some examples, adhesive 1930 is used to retain the pin 1950 in the slot 1948. In some examples, the pin 1950 has cylindrical shape, although other shapes can be used. In some examples, the pin 1950 has a height in a radial direction that is greater than or equal to a depth of the slot 1948. In some examples, the pin 1950 extends radially from the lower ring 1920 to a distance sufficient to limit movement (given the number of pins that are used).

In FIGS. 22A and 22B, the lower ring 1920 includes a projection 1960 formed on a radially outer surface thereof. In some examples, the projection 1960 extends in a vertical direction partially or fully along the vertical thickness of the radial outer surface. In FIG. 22B, the projection 1960 includes a flat surface 1964 extending from a radially outer surface 1962 of the lower edge ring 1920, which is easier to machine and to inspect dimensions as compared to arcuate profiles. In other words in some examples, the edge ring is initially formed slightly wider without the projections 1960 and then a radially outer surface is machined or removed in areas between adjacent projections to form the projections 1960. In other examples, the projections 1960 include arcuate or convex profiles in plan view to reduce surface area in contact with the radially inner facing surface of the top edge ring and reduce friction when performing height adjustment or replacing the top edge ring without breaking vacuum.

In some examples, the projections 1960 are coated with a coating material 1964. In some examples, the coating material 1964 is relatively conformal and is made of an insulating material. In some examples, the coating is selected from a group consisting of polytetrafluoroethylene (PTFE), perfluoroalkoxy polymer (PFA), or aluminum oxide, yttrium oxide, or yttrium fluoride deposited using atomic layer deposition. The coating material 1964 has an insulating function that prevents short circuits and reduces erosion. The coating material 1964 also ensures a minimum gap between the lower ring 1920 and the upper ring 1910 to prevent short circuits. In some examples, the projection 1960 extends radially outwardly from a radially outer surface of the lower ring 1920 to a distance sufficient to limit movement (given the number of projections that are used).

In some examples, the lower ring 1920 includes 3 to 8 spacers (shims, projections or projections) arranged with uniform spacing (e.g. 120° spacing for 3, 72° spacing for 5, 45° spacing for 8 (or 360°/N)) around an outer periphery of the lower ring 1920. As can be appreciated, the spacers are not generally configured to completely constrain relative movement of upper and lower rings. The gap helps reduce binding during height adjustment and/or replacement. Therefore, some relative movement is still desirable and undesirable movement (which may alter the effective coupling capacitance) may still occur with 3 shims. In some examples, the lower ring 1920 includes 5 spacers arranged around an outer periphery of the lower ring 1920 to further constrain movement. Depending upon the particular configuration, additional spacers such as 6, 7 or 8 provide diminishing returns with respect to controlling the effective capacitance and increase cost.

While the spacers (e.g. shims, projections or projections) are shown arranged on an outer surface of the lower ring 1920, the spacers can be arranged on an inner surface of the lower ring 1920 and/or one or both of the inner surfaces of the upper ring 1910. In addition, the spacers and/or insulating coating can be arranged on any of the preceding examples (e.g. in FIGS. 1 to 22) on one or both of the radially facing surfaces of edge rings that are intended to capacitively couple.

In some examples, the spacers extend in a radially outward direction in a range from 50 μm to 250 μm from a radially outer surface of the edge ring. In some examples, the spacers extend in a radially outward direction in a range from 50 μm to 250 μm from a radially outer surface of the edge ring.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A lower edge ring for a plasma processing system, the lower edge ring comprising:
a first annular body configured to surround a substrate support during plasma processing;
an upper surface,
a lower surface;
a radially inner surface;
a radially outer surface, the upper surface and the radially outer surface configured to face an annular recess of a top edge ring; and
N spacers arranged in N spaced locations on the radially outer surface of the lower edge ring to reduce variations in a predetermined gap between the radially outer surface and the top edge ring, where N is an integer greater than or equal to 3 and less than or equal to 8,
wherein at least one of the N spacers includes a projection formed on the radially outer surface of the lower edge ring, and
wherein the projection includes a flat surface extending in a vertical direction along a vertical thickness of the radially outer surface.

2. The lower edge ring of claim 1, wherein the N spacers are arranged with a spacing of 360°/N.

3. The lower edge ring of claim 1, further comprising a coating covering the projection.

4. The lower edge ring of claim 3, wherein the coating includes an insulating material.

5. The lower edge ring of claim 4, wherein the coating is selected from a group consisting of polytetrafluoroethylene (PTFE), perfluoroalkoxy polymer (PFA), aluminum oxide deposited using atomic layer deposition, yttrium oxide deposited using atomic layer deposition, and yttrium fluoride deposited using atomic layer deposition.

6. The lower edge ring of claim 1, wherein N=5.

7. An edge ring system comprising the lower edge ring of claim 1, the edge ring system further comprising:
the top edge ring, wherein the top edge ring includes an annular body configured to surround the substrate support during plasma processing.

8. The edge ring system of claim 7, further comprising a lift pin to lift the top edge ring relative to the lower edge ring to adjust a height of the upper surface of the top edge ring relative to a substrate on the substrate support.

9. The lower edge ring of claim 1, wherein the projection extends in a vertical direction fully along the vertical thickness of the radially outer surface of the lower edge ring.

10. The lower edge ring of claim 1, wherein a width of the projection is less than a distance between adjacent ones of the N spacers.

11. The lower edge ring of claim 1, wherein the flat surface of the projection extends partially along the vertical thickness of the radially outer surface.

12. The lower edge ring of claim 1, wherein the flat surface of the projection extends fully along the vertical thickness from a top edge of the radially outer surface to a bottom edge of the radially outer surface.

13. The lower edge ring of claim 1, wherein the projection is integral with the first annular body.

14. The lower edge ring of claim 1, wherein the projection extends in a range from 50 micrometers to 250 micrometers from the radially outer surface.

15. The lower edge ring of claim 1, wherein portions of the radially outer surface between adjacent ones of the N spacers are defined by machined or removed areas of the lower edge ring.

* * * * *